US009102007B2

(12) United States Patent
Hosseini

(10) Patent No.: US 9,102,007 B2
(45) Date of Patent: Aug. 11, 2015

(54) METHOD AND APPARATUS FOR PERFORMING LASER FILAMENTATION WITHIN TRANSPARENT MATERIALS

(71) Applicant: ROFIN-SINAR TECHNOLOGIES INC., Plymouth, MI (US)

(72) Inventor: S. Abbas Hosseini, Orlando, FL (US)

(73) Assignee: ROFIN-SINAR TECHNOLOGIES INC., Plymouth, MI (US)

( * ) Notice: Subject to any disclaimer, the term of this patent is extended or adjusted under 35 U.S.C. 154(b) by 0 days.

(21) Appl. No.: 14/336,819

(22) Filed: Jul. 21, 2014

(65) Prior Publication Data

US 2015/0038313 A1     Feb. 5, 2015

Related U.S. Application Data

(60) Provisional application No. 61/861,880, filed on Aug. 2, 2013.

(51) Int. Cl.
    *H01J 9/00*           (2006.01)
    *B23K 26/06*        (2014.01)
    (Continued)

(52) U.S. Cl.
    CPC ......... *B23K 26/0626* (2013.01); *B23K 26/0039* (2013.01); *B23K 26/0057* (2013.01); *B23K 26/0635* (2013.01); *B23K 26/0648* (2013.01);
    (Continued)

(58) Field of Classification Search
    CPC .............. H01J 9/38; H01J 9/385; H01J 9/244
    USPC ........................................................ 445/44
    See application file for complete search history.

(56) References Cited

U.S. PATENT DOCUMENTS 5,107,510 A    4/1992   Seguin et al.
6,084,897 A    7/2000   Wakabayashi et al.
(Continued)

FOREIGN PATENT DOCUMENTS

CA          2332154        9/2009
WO      2012006736     1/2012

OTHER PUBLICATIONS

Nicholson, David, Laser Pulse Filamentation, Submitted Coursework for PH240, Standford University, Nov. 27, 2011, pp. 1-4.
(Continued)

*Primary Examiner* — Joseph L Williams
(74) *Attorney, Agent, or Firm* — Wooling, Krost and Rust

(57) ABSTRACT

Systems and methods are described for forming continuous laser filaments in transparent materials. A burst of ultrafast laser pulses is focused such that a beam waist is formed external to the material being processed without forming an external plasma channel, while a sufficient energy density is formed within an extended region within the material to support the formation of a continuous filament, without causing optical breakdown within the material. Filaments formed according to this method may exhibit lengths exceeding 10 mm. In some embodiments, an aberrated optical focusing element is employed to produce an external beam waist while producing distributed focusing of the incident beam within the material. Various systems are described that facilitate the formation of filament arrays within transparent substrates for cleaving/singulation and/or marking. Optical monitoring of the filaments may be employed to provide feedback to facilitate active control of the process.

43 Claims, 46 Drawing Sheets

(51) Int. Cl.

| | |
|---|---|
| *B23K 26/08* | (2014.01) |
| *B23K 26/40* | (2014.01) |
| *C03C 14/00* | (2006.01) |
| *H01L 21/78* | (2006.01) |
| *B23K 26/00* | (2014.01) |
| *B23K 26/38* | (2014.01) |
| *C03B 33/09* | (2006.01) |

(52) U.S. Cl.
CPC ............ *B23K 26/0807* (2013.01); *B23K 26/38* (2013.01); *B23K 26/409* (2013.01); *B23K 26/4075* (2013.01); *C03B 33/09* (2013.01); *C03C 14/002* (2013.01); *H01L 21/78* (2013.01); *B23K 2203/00* (2013.01); *C03C 2214/02* (2013.01)

(56) References Cited

U.S. PATENT DOCUMENTS

| | | | |
|---|---|---|---|
| 6,407,360 | B1 | 6/2002 | Choo et al. |
| 6,552,301 | B2 | 4/2003 | Herman et al. |
| 7,303,977 | B2 | 12/2007 | Voronov et al. |
| 7,626,138 | B2 | 12/2009 | Bovatsek et al. |
| 8,097,830 | B2 | 1/2012 | Woeste et al. |
| 2002/0125232 | A1 | 9/2002 | Choo et al. |
| 2003/0006221 | A1 | 1/2003 | Hong et al. |
| 2004/0017428 | A1 | 1/2004 | Cronin et al. |
| 2006/0207976 | A1 | 9/2006 | Bovatsek et al. |
| 2009/0294422 | A1 | 12/2009 | Lubatschowski et al. |
| 2010/0084384 | A1 | 4/2010 | Bovatsek et al. |
| 2011/0259631 | A1 | 10/2011 | Rumsby |
| 2013/0126573 | A1 | 5/2013 | Hosseini et al. |

OTHER PUBLICATIONS

Zlotnicki, Steve, What is Cutting Kerf, May 19, 2013, www.esab-cutting.Com, pp. 1-4.

Nguyen et al., Optical Breakdown Versus Filamentation in Fused Silica by use of Femtosecond Infrared Laser Pulses, Optics Letters, vol. 28, No. 17, Sep. 1, 2003, pp. 1591-1593, Department of Physics, Universite Laval, Quebec, Canada.

Hosseini, S. Abbas, Method of Fabricating a Glass Magnetic Hard Drive Disk Platter Using Filamentation by Burst Ultrafast Laser Pulses, U.S. Appl. No. 14/512,180, Applicant: Rofin-Sinar Technologies Inc.

Hosseini, S. Abbas, Method and Apparatus for Non-Ablative Photoacoustic Compression Machining in Transparent Materials Using Filamentation by Burst Ultrafast Lasers Pulses, U.S. Appl. No. 13/958,346, filed Aug. 2, 2013, Applicant: Rofin-Sinar Technologies Inc.

Hosseini, S. Abbas, System for Performing Laser Filamentation Within Transparent Materials, U.S. Appl. No. 14/336,912, filed Jul. 21, 2014, Applicant: Rofin-Sinar Technologies Inc.

Migliore et al., Advances in Laser Singulation of Silicon, Paper #770, pp. 1-6, Coherent, Inc., Santa Clara, CA, USA; HBL Corporation, Daejeon 305-811 Korea.

Watanabe et al., Filamentation in Ultrafast Laser Material Processing, Book for Springer Series "Progress in Ultrafast Intense Laser Science", pp. 1-6, Japan.

Yoshino et al., Micromachining With a High Repetition Rate Femtosecond Fiber Laser, JLMN-Journal of Laser Micro/Nanoengineering, 2008, pp. 157-162, vol. 3, No. 3.

Rezaei, Saeid, Burst-Train Generation for Femtosecond Laser Filamentation-Driven Micromachining, Thesis, Graduatuate Department of Electrical and Computer Engineering, Jan. 2011, pp. 1-118, University of Toronto.

Hosseini, S. Abbas, Method and Apparatus for Non-Ablative, Photoacoustic Compression Machining in Transparent Materials Using Filamentation by Burst Ultrafast Laser Pulses, U.S. Appl. No. 13/958,346, filed Aug. 2, 2013, Applicant: Rofin-Sinar Technologies Inc.

TOTAL ENERGY IN BURST PULSE ENVELOPE

NUMBER OF PULSES IN BURST

METHOD AND APPARATUS FOR PERFORMING LASER FILAMENTATION WITHIN TRANSPARENT MATERIALS

This patent application claims priority to and the benefit of U.S. provisional patent application Ser. No. 61/861,880 filed Aug. 2, 2013. U.S. provisional patent application Ser. No. 61/861,880 filed Aug. 2, 2013 is incorporated herein in its entirety by reference hereto.

FIELD OF THE INVENTION

The invention is in the field of laser filamentation within transparent materials.

BACKGROUND OF THE INVENTION

The present disclosure is related to systems and methods for the laser processing of materials. More particularly, the present disclosure is related to systems and methods for the singulation and/or cleaving of wafers, substrates, and plates containing passive or active electronic or electrical devices created upon said materials.

In current manufacturing, the singulation, dicing, scribing, cleaving, cutting, and facet treatment of wafers or glass panels is a critical processing step that typically relies on diamond or conventional, ablative or breakdown (stealth) laser scribing and cutting, with speeds of up to 30 cm/sec for LEDs, LED devices (such as lighting assemblies) and illuminated devices (such as LED displays) as some examples.

In the diamond cutting process, after diamond cutting is performed, a mechanical roller applies stress to propagate cracks that cleave the sample. This process creates poor quality edges, microcracks, wide kerf width, and substantial debris that are major disadvantages in the lifetime, efficiency, quality, and reliability of the product, while also incurring additional cleaning and polishing steps. The cost of de-ionized water to run the diamond scribers are more than the cost of ownership of the scriber and the technique is not environmentally friendly since water gets contaminated and needs refining, which further adds to the production cost.

Laser ablative machining has been developed for singulation, dicing, scribing, cleaving, cutting, and facet treatment, to overcome some of the limitations associated with diamond cutting. Unfortunately, known laser processing methods have disadvantages, particularly in transparent materials, such as slow processing speed, generation of cracks, contamination by ablation debris, and moderated sized kerf width. Furthermore, thermal transport during the laser interaction can lead to large regions of collateral thermal damage (i.e. heat affected zone).

Laser ablation processes can be improved by selecting lasers with wavelengths that are strongly absorbed by the medium (for example, deep UV excimer lasers or far-infrared $CO_2$ laser). However, the aforementioned disadvantages cannot be eliminated due to the aggressive interactions inherent in this physical ablation process. This is amply demonstrated by the failings of UV processing in certain LED applications where damage has driven the industry to focus on traditional scribe and break followed by etch to remove the damaged zones left over from the ablative scribe or the diamond scribe tool, depending upon the particular work-around technology employed.

Alternatively, laser ablation can also be improved at the surface of transparent media by reducing the duration of the laser pulse. This is especially advantageous for lasers that are transparent inside the processing medium. When focused onto or inside transparent materials, the high laser intensity induces nonlinear absorption effects to provide a dynamic opacity that can be controlled to accurately deposit appropriate laser energy into a small volume of the material as defined by the focal volume. The short duration of the pulse offers several further advantages over longer duration laser pulses such as eliminating plasma creation and therefor plasma reflections thereby reducing collateral damage through the small component of thermal diffusion and other heat transport effects during the much shorter time scale of such laser pulses.

Femtosecond and picosecond laser ablation therefore offer significant benefits in machining of both opaque and transparent materials. However, in general, the machining of transparent materials with pulses even as short as tens to hundreds of femtosecond is also associated with the formation of rough surfaces, slow throughput and micro-cracks in the vicinity of laser-formed kerf, hole or trench that is especially problematic for brittle materials like alumina ($Al_2O_3$), glasses, doped dielectrics and optical crystals. Further, ablation debris will contaminate the nearby sample and surrounding devices and surfaces. Recently, multi-pass femtosecond cutting has been discussed in Japan, utilizing a fiber laser approach. This approach suffers from the need to make multiple passes and therefore results in low processing throughput.

Although laser processing has been successful in overcoming many of the limitations associated with diamond cutting, as mentioned above, new material compositions have rendered the wafers and panels incapable of being laser scribed. Furthermore, the size of the devices and dice on the wafers are getting smaller and closer to each other that limit the utility of both diamond and conventional laser-based scribing. For example, 30 µm is a feasible scribing width, while 15 µm is challenging for these conventional methods. Moreover, as diamond scribing uses mechanical force to scribe the substrate, thin samples are very difficult to scribe. Due to the use of increasingly exotic and complex material stacks in the fabrication of wafer-based devices, the laser scribing techniques previously applied will simply no longer work due to the opacity of the stack.

SUMMARY OF THE INVENTION

Systems and methods are described for forming continuous laser filaments in transparent materials. A burst of ultrafast laser pulses is focused such that a beam waist is formed external to the material being processed, such that a primary focus does not form within the material, while a sufficient energy density is formed within an extended region within the material to support the formation of a continuous filament, without causing optical breakdown within the material. Filaments formed according to this method may exhibit lengths exceeding up to 10 mm with a 1:1 correspondence in the length of the modified zone (in that the filament is the agent of modification, so the modified zone tracks 1:1 with the extent of the filament) and a taper-free profile when viewed with the long axis in cross-section. In some embodiments, an uncorrected or abberrated optical focusing element is employed to produce an external beam waist while producing distributed focusing of the incident beam within the material. Various systems are described that facilitate the formation of filament arrays within transparent substrates for cleaving/singulation and/or marking. Optical monitoring of the filaments may be employed to provide feedback to facilitate active control of the process.

Accordingly, in a first aspect, there is provided a method of laser processing a transparent material, the method comprising:

providing a laser beam comprising a burst of laser pulses;

externally focusing the laser beam relative to the transparent material to form a beam waist at a location that is external to the transparent material while avoiding the formation of an external plasma channel;

wherein the laser pulses are focused such that a sufficient energy density is maintained within the transparent material to form a continuous laser filament therein without causing optical breakdown.

In another aspect, there is provided a method of processing a transparent material, comprising the steps of:

providing a laser beam, said laser beam having a plurality of bursts and each of said bursts include a plurality of pulses;

generating an initial waist of said laser beam outside said transparent material;

generating a weakly focused laser beam distributed within said transparent material; and, producing a spatially extended and spatially homogenous filament in said transparent material.

In another aspect, there is provided a method of processing a transparent material, said transparent material has a metal layer formed within or on a surface thereof, said laser beam is a filament-forming laser beam, comprising the steps of:

prior to forming said continuous laser filament within said transparent material:

providing a low-power laser beam comprising a burst of laser pulses by reducing the power of said filament-forming laser beam below the threshold for the formation of a filament within said transparent material, while maintaining sufficient power to ablate said metal layer; and irradiating said metal layer with the low-power laser beam at one or more locations such that said metal layer is locally ablated by said laser beam thereby producing one or more ablative markings within the metal layer.

In another aspect, there is provided a transparent material having a continuous laser filament formed therein, the continuous laser filament having a length exceeding approximately 1 mm.

In another aspect, there is provided a transparent substrate exhibiting a post-cleave or post-singulation break strength that exceeds approximately 50 MPa.

In another aspect, there is provided a system for laser processing a transparent material, the system comprising:

a laser source configured to provide a laser beam comprising bursts of laser pulses;

one or more focusing elements configured to externally focus the laser beam relative to the transparent material to form a beam waist at a location that is external to the transparent material while avoiding the formation of an external plasma channel and internal plasma centers, wherein the laser beam and the one or more focusing elements are configured to produce a sufficient energy density within the transparent material to form of a continuous laser filament therein without causing optical breakdown;

means for varying a relative position between the laser beam and the transparent material; and a control and processing unit operatively coupled to the means for varying the relative position between the laser beam and the transparent material, wherein the control and processing unit is configured to control the relative position between the laser beam and the transparent material for the formation of an array of continuous laser filaments within the transparent material.

A further understanding of the functional and advantageous aspects of the disclosure can be realized by reference to the following detailed description and drawings.

BRIEF DESCRIPTION OF THE DRAWINGS

Embodiments of the disclosure will now be described, by way of example only, with reference to the drawings, in which:

FIGS. 1(a) and (b) illustrate the formation of filaments using previously known methods involving the formation of a beam waist within the material. FIGS. 1(c)-1(e) illustrate various embodiments in which long homogeneous filaments are formed by focusing the beam energy such that it is "dumped" into a focus above and/or below the target material (forming an "optical reservoir") in order to modulate the amount of energy passed into the desired filament zone.

FIG. 1(g) is a microscope image of a glass sample illustrating the difference between the stealth dicing and filamentation processing methods.

FIGS. 14(a) and (b) show two example break strength measurement configurations, while FIG. 14(c) shows an example Weibull plot for determining the characteristic strength.

FIG. 15(d) provides an example implementation of such an embodiment, showing a glass part processed via filament formation to exhibit a rounded edge.

DETAILED DESCRIPTION OF THE INVENTION

Figure 1A:
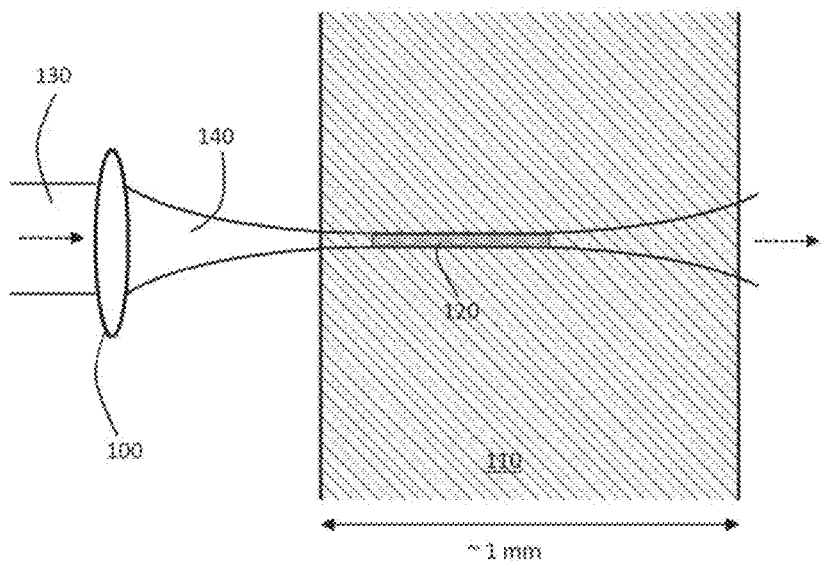
FIGS. 1(a)-(e) illustrate various optical configurations for the formation of filaments.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

Unless defined otherwise, all technical and scientific terms used herein are intended to have the same meaning as commonly understood to one of ordinary skill in the art. Unless otherwise indicated, such as through context, as used herein, the following terms are intended to have the following meanings.

As used herein, the term "filament modified zone" refers to a filament region within a substrate characterized by a region of compression defined by the optical beam path.

As used herein, the phrases "burst", "burst mode", or "burst pulses" refer to a collection of laser pulses having a relative temporal spacing that is substantially smaller than the repetition period of the laser. It is to be understood that the temporal spacing between pulses within a burst may be constant or variable and that the amplitude of pulses within a burst may be variable, for example, for the purpose of creating optimized or pre-determined filament modified zones within the target material. In some embodiments, a burst of pulses may be formed with variations in the intensities or energies of the pulses making up the burst.

As used herein, the term "transparent" refers to a material having an absorption spectrum and thickness such that at least a portion of the incident beam is transmitted in the linear absorption regime. For example, a transparent material may have a linear absorption spectrum, within a bandwidth of the incident beam, and a thickness, such that the percentage of light transmitted through the material is greater than 10%, greater than 25%, greater than 50%, greater than 75%, greater than 80%, greater than 85%, greater than 90%, greater than 95%, greater than 98%, or greater than 99%.

As used herein, the phrase "geometric focus" refers to the calculated or estimated focus produced by an optical focusing lens or assembly, where the calculation is made without incorporating or considering nonlinear effects within the material being processed (e.g. with a beam waist position determined according to the simple lens equation). This phrase is used to distinguish between the expected location of the optical focus based on the position of the lenses, and the optical constriction events created within the material being processed that are caused by non-linear beam refocusing, which provides, in effect, a quasi-Rayleigh length on the order of up to approximately 10 mm.

Embodiments of the present disclosure provide devices, systems and methods for the processing of materials by laser filamentation. Unlike previously known methods of laser filamentation, some embodiments of the present disclosure utilize an optical configuration that focuses the incident beam in a distributed manner along the longitudinal beam axis. This distributed focusing method enables the formation of filaments over distances well beyond those achieved to date using previously known methods, while maintaining a sufficient laser intensity to accomplish actual, uniform modification and compression of material over the entire length of the filament zone. Such filaments (and filamentation processes) involve the self-propagating beam of light within the material being processed such that a balance between thermal processes is responsible for compression, while avoiding the optical breakdown that is employed in other known ablative and other known processing methods. For example, as further described below, the distributed focusing methods disclosed herein support the formation of filaments with lengths well beyond one millimeter (even as long as 10 mm) and yet maintain an energy density beneath the optical breakdown threshold of the material.

Laser Filamentation

It is known that laser filaments can be formed in transparent materials using ultrafast laser pulses that are focused within the material. For example, as taught in Patent Cooperation Treaty Application No. PCT/CA2011/050427, titled "Method of Material Processing by Laser Filamentation", filaments can be formed by focusing, with an objective lens, a burst-train of short duration laser pulses inside a transparent substrate. The burst of laser pulses produces internal microstructural modification with a shape defined by the laser filament volume. By moving the sample relative to the laser beam during pulsed laser exposure, a continuous trace of filament tracks is permanently inscribed into the glass volume as defined by the curvilinear or straight path followed by the laser in the sample.

As noted in PCT Application No. PCT/CA2011/050427, it is believed that filaments (also referred to as "plasma channels") are produced by the weak focusing of laser pulses having a high intensity and short duration, such that the pulses can self-focus by the nonlinear Kerr effect due to the formation of a plasma. This high spatio-temporal localization of the light field can deposit laser energy in a long and narrow channel, while also being associated with other complex nonlinear propagation effects such as white light generation and formation of dynamic ring radiation structures surrounding this localized radiation. PCT Application No. PCT/CA2011/050427 teaches that laser filaments may be formed over length scales on the order of hundreds of microns by focusing the laser beam such that the focal point (e.g. initial beam waist) lies within the material.

In contrast to known filament forming methods, the present disclosure provides methods for forming spatially extended and spatially homogeneous filaments in transparent materials. According to one embodiment, a burst of ultrafast laser pulses is focused such that an external beam waist is formed outside the target material, without forming a plasma channel outside of the material, and weak distributed focusing of the incident beam occurs within the target material, thereby forming a high density electric field within the material and creating a zone of compression along the incident path of the laser. This zone of compression results in a phase change (confirmed by etch rate experiments) in a narrow curtain of material extending uniformly and radially from the center of the propagation axis.

As described further below, the length and position of the filament is readily controlled, for example, by the positioning of the focusing apparatus, the numerical aperture of one or more focusing elements, the laser pulse energy, wavelength, duration and repetition rate, the number of laser pulses and bursts applied to form each filament track, and the optical and thermo-physical properties of the transparent medium. Collectively, these exposure conditions (power, repetition rate, translation speed and the degree to which the wavefronts has been distributed/aberrated to extend the interaction zone) can be manipulated to create sufficiently long and intense filaments to extend or nearly extend over the full thickness of the processed material.

Accordingly, embodiments disclosed herein harness short duration bursts of laser pulses (preferably with a pulse duration less than about 100 ps) to generate a filament inside a transparent medium. The method avoids plasma generation such as through optical breakdown that can be easily produced in tight optical focusing conditions as typically applied and used in femtosecond laser machining (for example, as disclosed by Yoshino et al., "Micromachining with a High repetition Rate Femtosecond Fiber Laser" (2008), Journal of Laser Micro/Nanoengineering Vol. 3, No. 3 pgs. 157-162).

In the weak and distributed focusing embodiments disclosed herein, the nonlinear Kerr effect is believed to create an extended laser interaction focal volume that exceeds the conventional depth of field, overcoming the optical diffraction that normally diverges the beam from the small self-focused beam waist. It is in this so-called filament zone, formed via distributed or extended focusing, that the material undergoes a phase transition induced by photo-acoustic compression, in a substantially symmetrical, substantially cylindrical region centered about the axis of beam propagation in the material.

This modification requires energy densities above a certain characteristic threshold for each material, ideally chosen by the highest threshold of the materials present in a non-homogeneous complex stack. This modification can occur at normal and non-normal angles of incidence relative to the top of the substrate and persist for distances only limited by the power available in the incident beam.

Furthermore, it is believed that optical breakdown does not occur in the material during processing, as this would create discrete damage centers instead of the long continuous and homogenous filament modified zones of the present disclosure. While laser energy deposited along the filaments leads to internal material modification that can be in the form of defects, color centers, stress, microchannels, microvoids, and/or micro cracks—experimental results have shown that the modification is substantially uniform and symmetric in its appearance, with an interior surface that is substantially homogenous in its physical characteristics. This is believed to be achieved by presenting a very high intensity electric field that possesses a very uniform energy distribution along the length of the filament.

Formation of Extended Filaments Via Distributed Focusing of Laser Beam

In contrast to the methods and apparatus disclosed in PCT Application No. PCT/CA2011/050427, the present disclosure provides methods, apparatus and systems for the controlled formation of filaments in transparent materials using an optical focusing configuration in which the incident beam is directed onto the material such that an external waist is formed without forming a plasma channel outside of the material, and such that the beam energy is focused in a distributed manner throughout a region within the material. It is believed that the distributed focusing configuration without the formation of an internal beam waist provides conditions that sustain the formation of the laser filament over longer distances, with more controllable geometries and mechanical properties, as further described below.

Figure 1B:
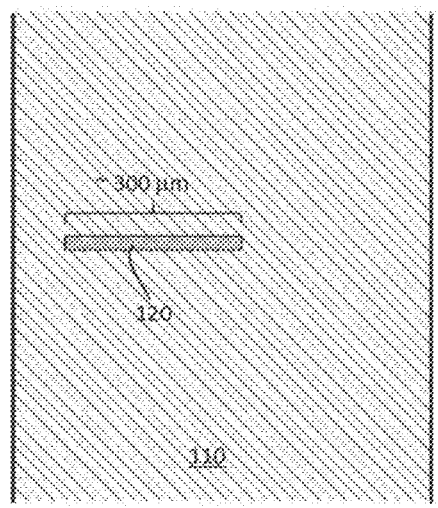

Referring now to FIG. 1(a), a focusing arrangement disclosed in PCT/CA2011/050427 is illustrated, in which focusing lens 100 is employed to focus a burst of ultrafast laser pulses within a material 110 for the formation of a filament 120. Focusing lens 100 is positioned relative to material 110 such that the focus of lens 100 is located within material 110. Incident beam 130 is focused by focusing lens 100 to form converging beam 140, which is focused within material 110 and maintains a focused configuration, forming filament 120 prior to expanding and defocusing. As described above, the confinement of the optical power within material 110, while forming filament 120, is achieved through self-focusing via self-phase modulation. Beam 140 expands beyond the filament forming region due to loss of optical beam power, such that self-phase modulation is no longer sufficient to support self-focusing and to counter the defocusing caused by the presence of the heating and subsequent index change in the target material. As shown in FIG. 1b, this method can result in the formation of a filament 120 within material 110 having a length on the scale of hundreds of microns.

Figure 1C:
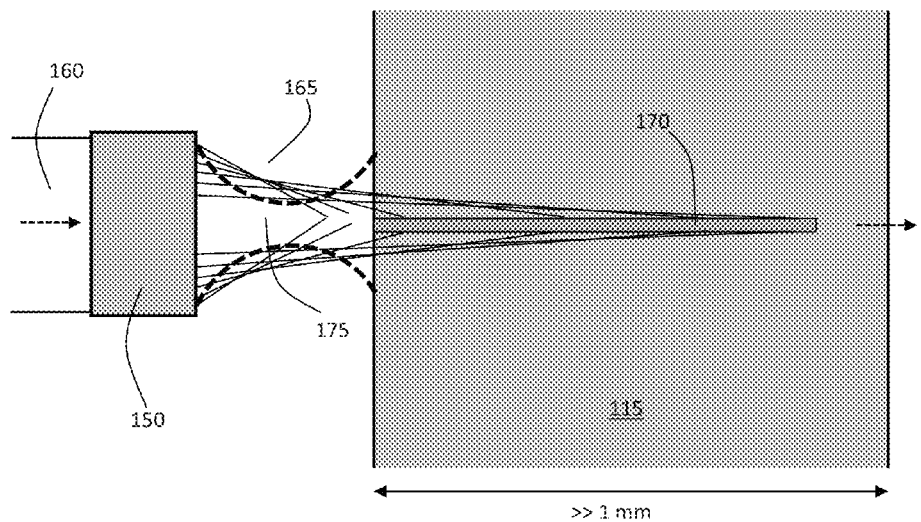

FIG. 1(c) illustrates an example embodiment of spatially extended filament generation in a transparent material through the distributed focusing of a burst of ultrafast laser pulses. Unlike the configuration shown in FIG. 1(a), in which incident beam 130 is focused by focusing lens 100 to form a well-defined initial waist within material 110, the configuration shown in FIG. 1(c) employs distributed focusing element 150 to focus incident beam 160 such that the resulting converging beam 165 is focused to an initial external waist 175, and is also weakly focused in a distributed manner within material 115. The external formation of the initial waist prevents excessive focusing and optical breakdown within the material, avoiding deleterious effects such as optical breakdown. The distributed focusing configuration causes the focused beam to be directed onto material 115 such that the optical power is extended over a range of locations, unlike known methods in which external focusing produces a narrow external plasma channel, thereby distributing the incident laser within material 115, as opposed to forming a waist within the material with a tight and well-defined location. Such a distributed focusing configuration is capable of producing a filament 170 having controlled geometrical properties and a length on the millimeter scale. Distributed focusing element 150 may include one or more lenses that are formed (e.g. ground or molded) to produce what appears to be a distributed focus (not necessarily an evenly distributed focus), with a waist residing above or in front of the surface of the material, adjacent to a surface of the material, providing a very weakly focused spot at the material surface in the absence of an external plasma channel. In one embodiment, the waist is located at an offset of at least approximately 10 µm from an external surface of the material. In another embodiment, the waist is located at an offset of at least approximately 20 µm from an external surface of the material. In another embodiment, the waist is located at an offset of at least 50 µm from an external surface of the material. Accordingly, the present embodiment avoids the need to form a primary beam waist within the material by altering the focal properties of the lenses, offering a wide range of processing options, such that an external waist is formed above, below or, for example, in between layers of target materials in an interstitial space.

Without intending to be limited by theory, it is believed the distributed focusing configuration of the present disclosure produces longer filaments due to the spatially replenishment of the optical beam power from the additional focal regions. As optical power within the narrow filament forming region is initially depleted during beam propagation, through interaction with the complex (non-linear) index changes formed via the nonlinear processes, additional optical power is provided by the distributed focusing of the beam along its length, such that the beam can propagate further in a self-focused manner while forming the filament, prior to defocusing. As noted above, in some embodiments this approach produces the desired self-focusing and compression without actually forming a plasma.

Referring again to FIG. 1(c), the illustrated example embodiment is shown with focusing element 150 positioned such that a least a portion of the converging beam 165 is focused in front of material 115, for example at location 175 in the Figure. In particular, in the example implementation shown, the high numerical aperture rays encountering distributed focusing element 150 are focused in front of material 115. By focusing a portion of the incident optical power in front of material 115, the intensity profile formed immediately within the material is not too high or too low, which therefore allows the formation of a filament having a substantially uniform cross section over its length.

As noted above, the advantage of creating a beam waist above or in front of the material, instead of below, lies in the desire to avoid exceeding the optical breakdown threshold of the material. It also enables a larger process window by giving the user more options relative to process set-up and sample configuration.

Figure 1D:
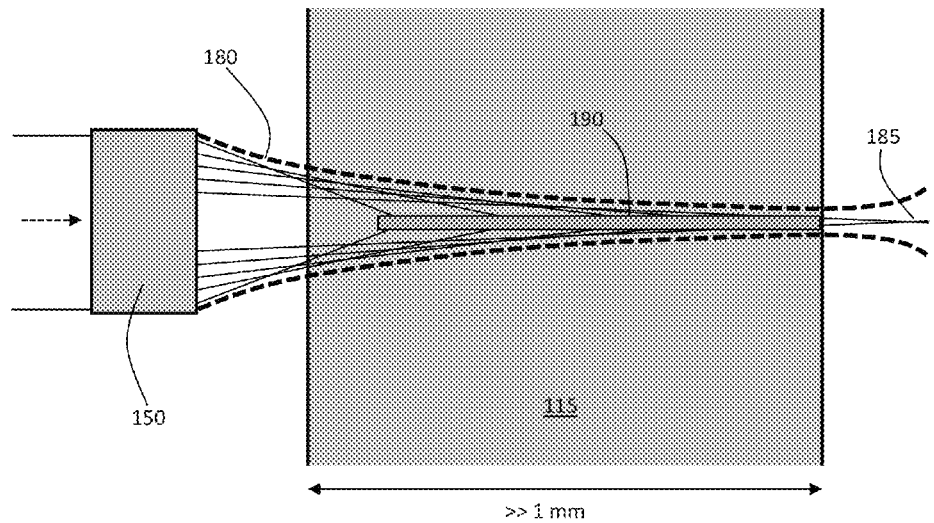

FIG. 1(d) illustrates an alternative example embodiment in which distributed focusing element 150 is positioned such that a portion of converging beam 180 is focused behind material 115 at location 185 for forming filament 190.

Figure 1E:
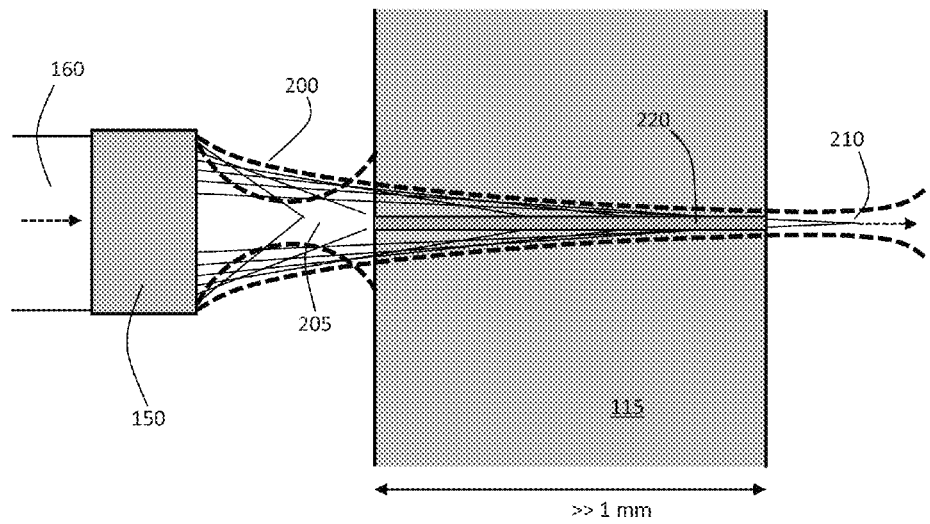
Figure 1F:
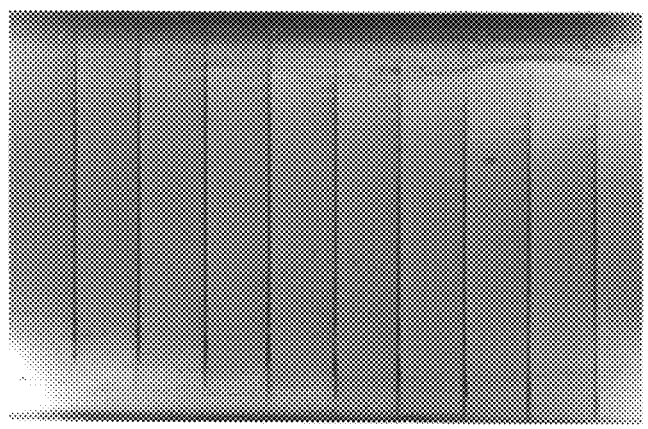
FIG. 1(f) is an example image of filaments formed according to the methods disclosed herein, demonstrating the formation of a spatially extended filament with a homogeneous and continuous profile, where the depth and location of the filament within the material is determined by the relative positioning of the beam focus (each filament corresponds to a vertical offset of 25 microns).
Figure 1A:
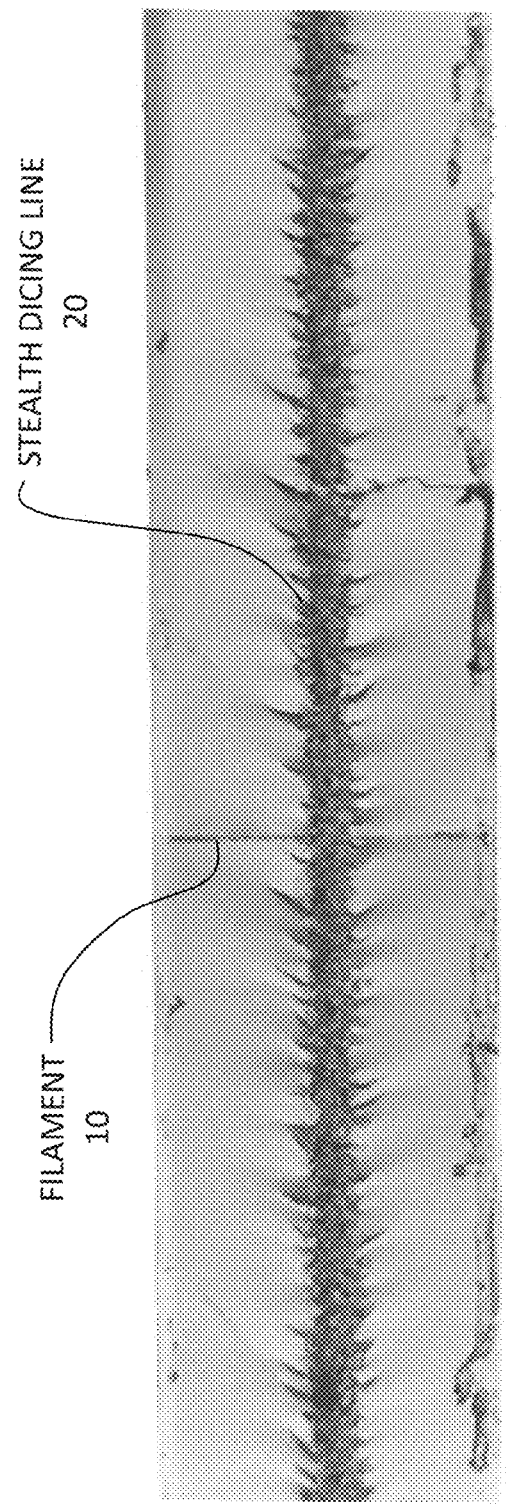

Referring now to FIG. 1(e), another example embodiment is illustrated in which distributed focusing element 150 is positioned such that a portion of converging beam 200 is focused in front of material 115 (e.g. at location 205), and another portion of converging beam 200 is focused behind material 115 (e.g. at location 210), for forming filament 220. In this configuration, the beam energy can be distributed along a greater length and still maintain enough energy along the path through the target to create acoustic compression from the electric field induced heating effects formed by the laser. This embodiment may be employed to enable a higher degree of control and depth in forming filaments. As shown in the Figure, such an embodiment may be useful in forming filaments throughout the material, through transparent substrates with thicknesses of millimeters to tens of millimeters.

The benefit of the distributed focusing configuration employed in methods disclosed herein can be understood as follows. If the incident beam is focused to a waist within the material, the filament progression stops after a short distance, as in the previously known methods. However, if the incident power is focused outside of the material, forming an optical reservoir, and the material is allowed to act as the final lens as it undergoes thermally induced changes in the index (complex index in particular), then the filament can be formed with a substantially homogeneous cross sectional profile, and spatially extended over millimeters in length, as illustrated in FIG. 1(*f*), which demonstrates the formation of homogeneous filaments with lengths exceeding 1 mm in soda lime glass. FIG. 1(*f*) further illustrates the control of relative vertical positioning of the filaments by varying the axial position of the beam focus (each filament corresponds to an offset of 25 microns). Such processing can produce high quality edges substantially absent of chipping >10 μm.

FIG. 1(*g*) is a microscope image of a glass substrate processed and cleaved according to the stealth dicing method. A filament array had also been formed in a direction perpendicular to the stealth dicing line (the sample shown had not yet been cleaved according to the filament array line). As shown in the Figure, stealth dicing line 20 shows the telltale signs of optical breakdown, which produces a very smooth top edge, but a very rough face overall. The roughness of the faced edge obtained by cleaving along the stealth dicing line was found to be 53 microns in the vertical direction and 85 microns in the horizontal direction. In contrast, filament 10 illustrates a continuous material modification extending through the substrate, facilitating cleavage that results in a smoother facet. As described below, the cleavage of the sample along the filament array line can produce surface roughness values on the order of 1 to 10 microns for glass materials.

As described in further detail below, the filaments formed according to the methods disclosed herein can be formed with a length that is much longer than previously reported filaments. Furthermore, the present methods can be employed to produce filaments that are continuous, radially symmetric and uniform in dimension. A key consideration for the formation of extended filaments within the transparent material is the supply of the requisite fluence, treated below, while at the same time avoiding the optical breakdown threshold of the material. It has been found that the filament length is tied into the total energy supplied to the material and the material's linear absorption.

For example, experimental studies have shown that filaments that are 6 mm long can be formed in borosilicate glass using the following conditions: an average power of approximately 50 W; a wavelength of 1064 nm; a pulse width of less than approximately 50 picoseconds; a burst profile of approximately 15 pulses, a pulse profile decreasing in amplitude, increasing in amplitude, and/or level in amplitude; and a spot size of approximately 10 μm.

The position of the stop and start of the filament can be controlled by selecting the position of the geometric focus, or beam waist, as predicted by the geometrics of the lens group or focusing assembly. The balance between power and size, also explained below, provides the ability to avoid the formation of a beam waist within the material.

Figure 2A:
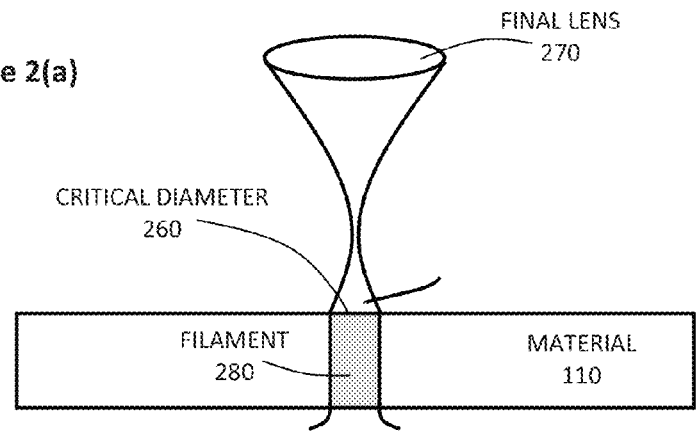
FIGS. 2(a) and (b) depict (a) a long filament zone on the scales of millimeters to tens of millimeters; while (b) illustrates the ability for the beam to pass through intermediate layers without damaging them.
Figure 2B:
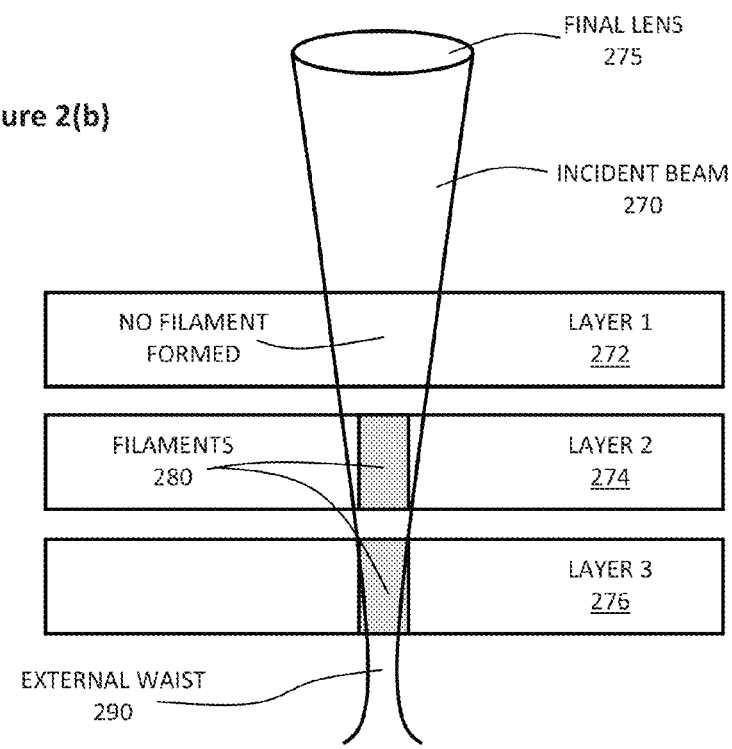

FIGS. 2(*a*) and 2(*b*) show the flexibility can be achieved by controlling the location of the beam waist locus. FIG. 2(*a*) depicts a long filament zone 250 on the scales of millimeters to tens of millimeters (not to scale; filaments of up to 10 mm have been produced by the inventor). The ability for the beam to pass through layers without damaging them is illustrated. The critical diameter range 260 (which may vary, for example, accordingly for each material, focusing conditions, and laser power) is also indicated, which is defined as the range of laser spot diameters above which filaments do not form and below which optical damage occurs. In one example implementation, the critical diameter range for soda lime glass has been found to lie near 8 μm. The critical ratio is also noted, which equals the ratio of the diameter of the incident laser spot on the material to the diameter of the filament. For example, in one example range, the critical ratio may vary between approximately 0.01 and 1000; in another example range, the critical ratio may vary between approximately 0.01 and 10, in another example range, the critical ratio may vary between approximately 10 and 50, in another example range, the critical ratio may vary between approximately 50 and 500, and in another example range, the critical ratio may vary between approximately 1 and 1000.

As shown in FIG. 2(*b*), the incident beam 270, focused by final lens 275, can be made to pass through one or more substantially transparent layers 272 above the desired target location of the filament zone, without forming either a focus or any filaments, with an external waist 290 that is formed beyond the final layer 276. Filament(s) 280 then forms within the desired layer or layers (274, 276) as a result of the critical fluence not being achieved until that position along the incident path through the target stack.

In order to control the fluence in the incident beam, the power contained within the beam diameter at the surface of the material can be altered, programmed in fact, by varying the size of the beam diameter. In particular, the inventor has discovered a correlation between the material, the critical fluence and filament formation efficacy.

In one example implementation, the properties of the filaments can be controlled by varying the first incident fluence (the fluence on the first incident surface) and the energy contained within each sub pulse. It will be understood that in embodiments involving multiple surfaces upon which the laser is incident (described further below), each surface will have its own fluence, and each fluence will depend upon the first incident fluence due to absorption and scattering.

It has been found that an incident spot size of approximately 100 μm leads to filaments with a diameter of 2.5 μm and a length of several mm. Some characteristics of the filament can be controlled by changing the pulse energy and spot size ratio. Different materials have different propensities toward extended filament formation.

In order for the filament to create a continuous and substantially uniform channel, the energy intensity must also be such that once deposited, the burst pulse induced intensity, refreshed at the burst pulse frequency rate, is capable of forming a shock wave of the requisite intensity to radially compress the material. Once this phase change occurs (or in certain materials, simply a density change), the filament zone functions as a cleavage plane, either immediately, after some programmable delay or via the application of a subsequent cleavage step. A suitable energy can be empirically determined for a given material by producing filaments at various beam energies, observing or measuring the filament depth, and selecting a beam energy that produces filaments of a suitable length. In one non-limiting example implementation, the energy in the incident beam (the energy of all pulses in a burst) may be between approximately 10 µJ and approximately 2000 µJ.

It will be understood that a wide range of laser beam parameters may be varied to obtain filaments with different characteristics and properties. Furthermore, the beam parameters suitable for forming a filament with a given set of properties will vary among different materials. The present disclosure provides some example ranges of beam parameters that may be employed to form filaments in some selected materials. Such example ranges are not intended to be limiting, and it will be understood that other ranges may be suitable for forming filaments with other properties in the example materials, or in other materials.

It is to be understood that the burst repetition rate, together with the translation speed of the material relative to the incident beam, defines the spacing between neighboring filaments. In one non-limiting example, this range may be from approximately 1 kHz to approximately 2 MHz.

As shown in FIGS. 1(c) to 1(e), the incident beam is focused such that the focal volume is distributed over an extended region within the sample. The distributed focal volume may be sufficiently longer than the Rayleigh range obtained from a non-distributed focusing element having a similar or equivalent numerical aperture. For example, the focal region under distributed focusing may be 20%, 30%, 50%, 100%, 200%, 500%, 1000% or greater than the corresponding Rayleigh range obtained without distributed focusing.

The distributed focal volume may be sufficiently long that the filament formed by the beam under distributed focusing conditions is significantly longer than the filament that would be formed from a non-distributed focusing element having a similar or equivalent numerical aperture. For example, the filament formed under distributed focusing may be 20%, 30%, 50%, 100%, 200%, 500%, 1000% or greater than the corresponding filament formed without distributed focusing.

It is to be understood that the distributed focal assembly may include one or more optical components/elements, such as an optical train including two or more optical components. In one embodiment, the distributed focal assembly is configured to focus the optical beam in a non-distributed manner in one lateral dimension, and to focus the beam in a distributed manner in the other lateral dimension.

With appropriate beam focusing, manipulating the focal length or beam expansion ratio, for instance, laser filaments can terminate and cause the laser beam to exit the glass bottom surface at high divergence angle such that laser machining or damage is avoided at the bottom surface of the transparent plate. It is also possible to create filaments in the middle of a multi-sheet stack, without inducing damage in the sheets located above and below the target sheet, but while damaging the top and bottom surface of the target sheet, as described further below.

In some embodiments, the long filament length may be created by a combination of negative and positive lenses that optimize the filling of the apertures on each optical element, maintaining high power efficiency within the optical train and maintains laser intensity to radially compress the target material as has been previously described.

Example Distributed Focusing Element: Aberrated Element

In some embodiments, the distributed focal assembly may include one or more optical components configured to induce aberrations in the focused optical beam, such that the focused optical beam is focused in a distributed manner over a longitudinal focal volume without forming a waist within the material.

One or more optical components may include spherical aberration. In some embodiments, the distributed focal assembly may include one or more aberrated optical components, and one or more substantially non-aberrated optical components. In some embodiments, aberrations are induced by the distributed focal assembly in one dimension. In other embodiments, aberrations are induced by the distributed focal assembly in two dimensions.

Long filaments can be created by the use of aberrated optical assembly (one or more aberrated optical elements) such that a long series of quasi-focal points can be achieved, even though no beam-waist forms within the material due to the distortion wrought by the target itself and the electric field heating created along the incident axis. Creating a large spot with >1 µm diameter and creating at least one external beam waist (a "reservoir region"), in front of the target material and/or behind it (as illustrated in FIGS. 1(c)-(e)), enables "dumping" energy into focal spots outside the target material or layer, where a beam waist is formed in the air without forming a plasma channel in the air, and no ablative work is accomplished.

The present embodiment provides a beam path with non-uniform distribution of energy outside of the material, while also forming a uniform beam path contained within the target material that produces a filament containing no beam waist along its length.

Using one or more aberrated elements, one can choose to distribute the energy in such a fashion as to avoid the beam waist event within the material and yet create a uniform filament and "dump" the extra energy into one, two or more external waist regions, without forming an external plasma channel, in order to maintaining the required fluence to promote filament formation, long uniform modification and avoid optical breakdown. In other words, the strong focus of the one or more aberrated elements may be employed to act as an external beam dump, and the remaining rays may be employed to create a strong burst pulse filament within the material.

The aberration of an optical focusing component, assembly, or system may be measured in waves (or fractions thereof, related to the wavelength of light being used). For example, the aberration may be specified according to the ratio of waves not arriving at the same spatial point (or volume) as defined by the ideal lens to the ratio of waves arriving at the same point. In some non-limiting example implementations, the aberration in the optical focusing assembly may be greater than approximately 0.1% aberration and less than approximately 80% aberration.

The nature of the aberration can be variable provided the energy density at the first incident surface stays above that required to form filaments and below the optical breakdown threshold for the target material. In one particular example, the optical elements can be formed such that two primary foci form, separated by at least a distance corresponding to the thickness of the target material(s) or layer(s) (see, for example, FIG. 1(e)).

Figure 3:
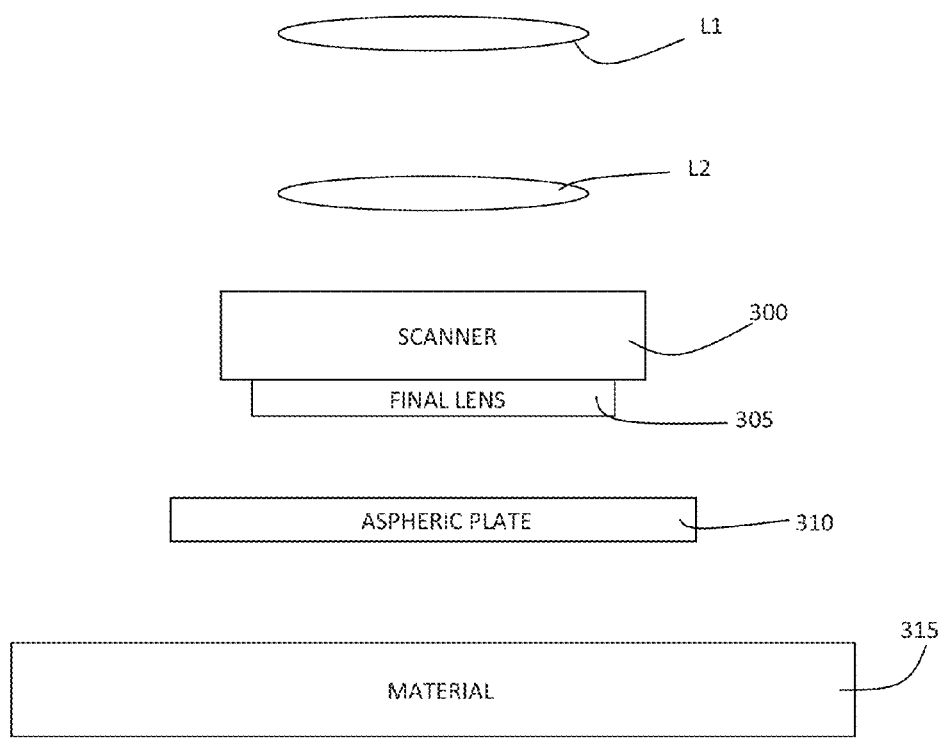
FIG. 3 illustrates an example lens arrangement employing a scanner. A conventional scan lens (e.g. telecentric or otherwise) is employed with the inclusion of an aspheric plate placed either before or after the scanner. This embodiment enables coordinated motion and constant velocity processing over curved pathways.

One example method for providing an aberrated optical configuration is to employ an optical arrangement of at least two elements, where one optical component is a normal field-corrected scan lens, and where a second optical component is a corrective window designed to deliver light focused as described above. FIG. 3 illustrates such an example lens arrangement employing first and second lenses L1 and L2 for beam relaying and collimation, a scanning mechanism 300 and a final focusing lens 305. Final focusing lens 305 may be a telecentric lens. An aspheric plate 310 is provided below final lens 305 (although it may alternatively be located before scanning mechanism 300) in order to generate an aberrated focused beam, such that a portion of the beam forms an initial waist in front of material 315. The separation between the components may be determined based on the thickness of the target substrate and the desired length of the filament zone. In some example embodiments, the filament properties can be controlled or prescribed by controlling the ratio of the lens focal lengths of focusing lenses employed. For example, in some example implementations, ratio of the focal lengths of L1/L2 can be −300 to +300.

Figure 4:
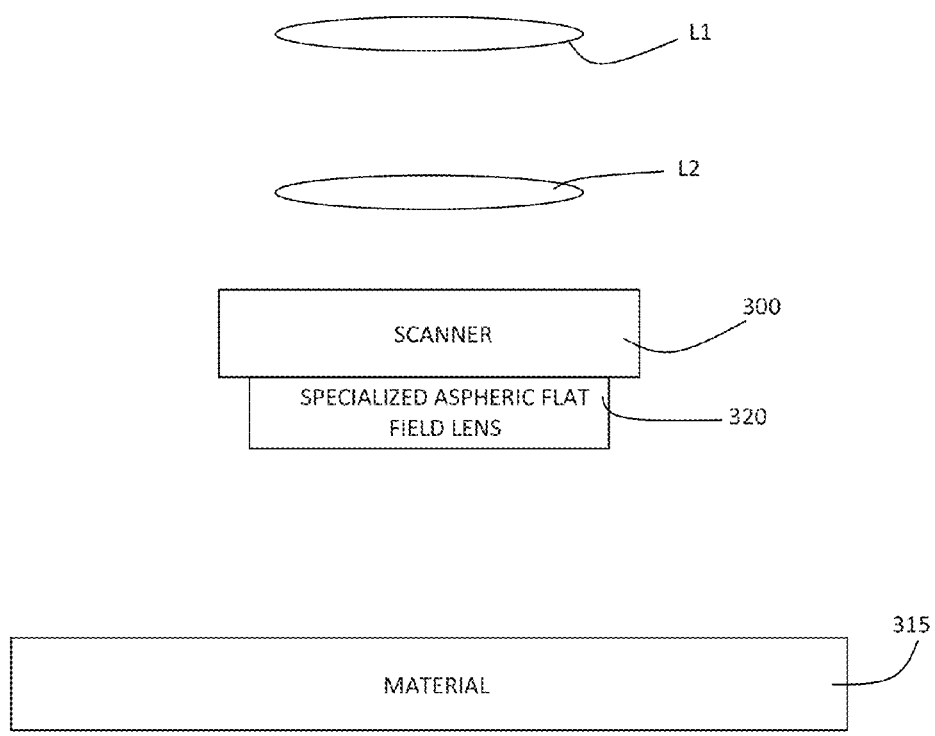
FIG. 4 illustrates an example embodiment similar to that shown in FIG. 3, employing a specialized scan lens (telecentric or non-telecentric) without an aspheric plate.

FIG. 4 illustrates an alternative example embodiment, employing a specialized scan lens 320 (telecentric or non-telecentric) without an aspheric plate. Specialized scan lens 320 is configured to induce an aberrated focused beam as described above.

Burst Pulse Characteristics

It has been found by the present inventor that the use of burst pulses in a distributed focusing configuration supports the formation of long filaments (such as, but not limited to, filaments having a length >15% of the total target material thickness, for example, in glass applications, a length >100 µm and up to >10 mm), with homogenous properties (for example, filaments having substantially the same diameter over a substantial length thereof, and substantially the same diameter at the entrance and exit faces of the material for filaments that traverse the material thickness). The distributed focusing of a burst of pulses also supports the formation of smooth surfaces after cleaving along a filament array. For example, the beam and focusing conditions disclosed herein have been employed to provide segmented samples with cut face surface roughness (RMS) that is less than approximately 10 µm, and sometimes as low as 200 nm, or less. Such filaments can be formed in brittle materials.

Figure 5A:
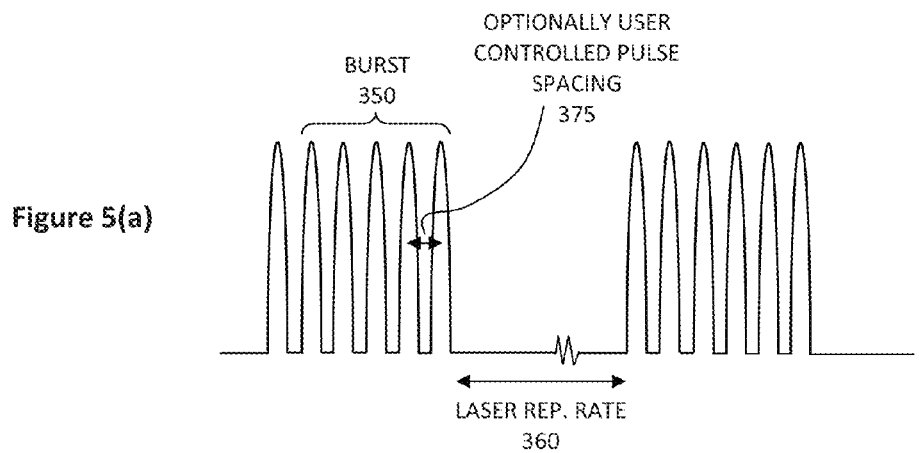
FIGS. 5(a)-(e) illustrate the characteristics of an example burst pulse train. In some embodiments, the spacing between the sub-pulses and the burst packets can be controlled, and the number of pulses in the burst pulse train can be controlled.
Figure 5B:
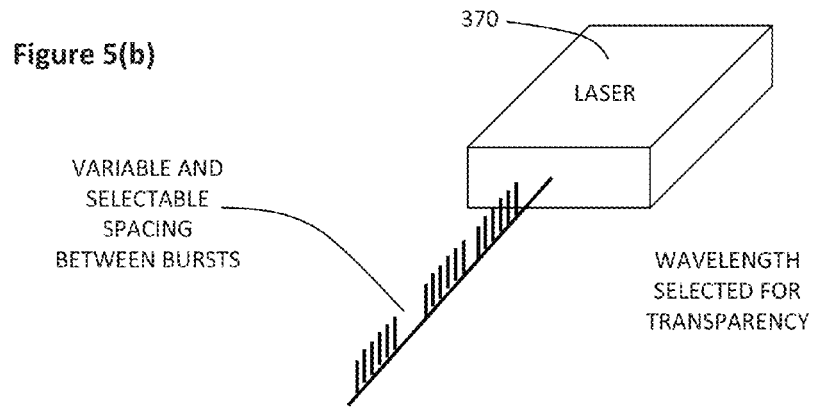

FIGS. 5(a)-(e) illustrates multiple embodiments showing the temporal nature of the burst pulses 350 and the degree of control the laser source can provide on the timing and sequencing of the pulse. FIGS. 5(a) and 5(b) illustrates the optional control over burst repetition rate 360 and inter-pulse temporal spacing 375. For example, the timing between the pulses can be controlled by manipulating the EO switch timing, to create various multiples of the main oscillator signal, generating the variable pulse timing. FIG. 5(b) is an example illustration showing the degree of variability over which the pulses can be delivered and a schematic of the pulses being generated within the laser head 370. It is to be understood that in some embodiments, the pulses could be modulated along the optical train, for example, by inclusion of an optical switch or electro-optical switch to develop user selectable pulse (and or pulse envelopes) profiles (rising or falling or equal), changing the amplitude of the energy in the pulse (and or pulse envelopes) and deciding to what degree it is divided among smaller burst pulses where the total number of pulses is user selectable.

Figure 5C:
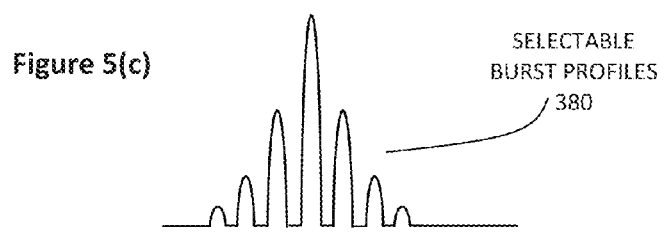

As shown in FIG. 5(c), the user/operator may manipulate the pulse profile 380 to control the process based on the desired material properties of the parts generated in a system equipped with such a laser and associated optics.

Figure 5D:
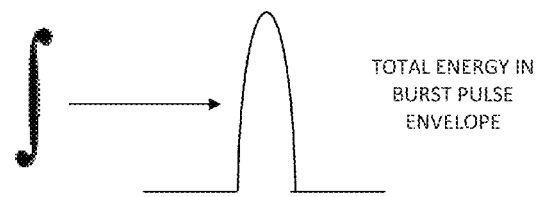
Figure 5E:
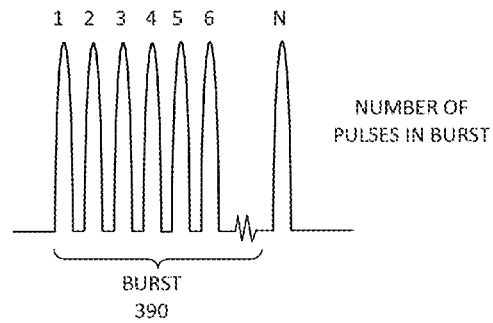

FIG. 5(d) illustrates the ability to control the net energy delivered to the material, based on the integrated power in the burst. FIG. 5(e) illustrates the ability to control the number of pulses in a given burst 390. In one example implementation, the burst of laser pulse is delivered to the material surface with a pulse train containing between 2 and 20 sub pulses into which the laser pulse is divided. This division may be created within the laser head according to one of several known approaches.

It is to be understood that any one or more of the pulse parameters shown in FIGS. 5(a)-5(e) may be employed to control the formation of filaments within the processed material.

Materials

The filamentation methods disclosed herein may be employed for the processing of a wide range of materials that are transparent to the incident laser beam, including glasses, crystals, selected ceramics, polymers, liquid-encapsulated devices, multi-layer materials or devices, and assemblies of composite materials. Substrates processed according to the methods disclosed herein may include glasses, semiconductors, transparent ceramics, polymers, transparent conductors, wide bandgap glasses, crystals, crystalline quartz, diamond, and sapphire, rare earth formulations, metal oxides for displays and amorphous oxides in polished or unpolished condition with or without coatings.

It is further to be understood that the spectral range of the incident laser beam is not limited to the visible spectrum, but may also lie in the vacuum ultraviolet, ultraviolet, visible, near-infrared, or infrared spectra. For example, silicon is transparent to 1500 nm light but opaque to visible light. Thus, laser filaments may be formed, for example, in silicon with short pulse laser light generated at this 1500 nm wavelength either directly (e.g. via erbium-doped glass lasers) or by non-linear mixing (e.g. via optical parametric amplification) in crystals or other nonlinear medium. Suitable performance can be expected with light ranging from 1200-3000 nm for a wide array of brittle materials, such as Si, SiC GaAs, GaN, and other compound and complex compound semiconductors (for example, II-VI and similar band gap engineered materials) as well as display-related compounds, such as ITO, IPS, IGZO, etc.

Pulse Energies and Power

In order to form filaments and to sustain self-focusing, the pulse energy is selected to be lie within the nonlinear regime, such that burst generated filament formation is possible. According to one non-limiting example, it has been found that for the processing of soda lime glasses, pulse energies between approximately 10 µJ and 2 mJ are suitable for achieving the electric field intensity needed to reach a state where it can be sustained for self-focusing to occur. In some example implementations, the average power of the laser may lie within approximately 3 W and 150 W (or more), although it will be understood that the average power required for filament formation will depend on the pulse energies, number of pulses per burst, and repetition rate, for example.

In one example embodiment, the pulse repetition rate may range between 10 kHz and 8 MHz in terms of the pulse repetition frequency as defined by the pulse picked oscillator. These may be subsequently down-selected into bursts of less energy and delivered to the material with sub-pulse spacing equal to 1 fs or greater, up to 1 millisecond. In some example embodiments, the laser possess a beam quality, $M^2$, of less than approximately 5. An $M^2$ of approximately 1 may be employed, for example, in embodiments where the optical components are configured to create more than one focal point along the axis, and while less strict $M^2$ embodiments can be tolerated to the extent that the downstream optics are compensating for the beam's native shape. In some example embodiments, in which a filament is to be formed throughout the thickness of the material, the laser beam should be transmitted through the material (including any intervening gaps of inhomogeneous and dissimilar materials) with a transmitter power exceeding a pre-selected threshold (for example, at least approximately 50%) in order to provide sufficient luminous intensity along the beam path.

Collimation, Focal Length, Clear Aperture

In some embodiments, the optical train of the system includes one or more optical components for collimating the beam prior to focusing, in order to accommodate a variable path length between the distributed focusing element and the laser source. In some example embodiments, the numerical aperture of the collimating components is between approximately 0.1 and 0.88 NA, with an effective focal length between approximately 4.5 mm and 2.0 m. In some example embodiments, the diameter of the clear aperture may be between approximately 2 and 10 mm.

Use of Regenerative Amplifier

In one embodiment, a regenerative amplifier is employed to provide a flexible apparatus, as the regenerative amplifier may be easily reconfigured to change the burst train characteristics for filament formation. For example, the regenerative amplifier may be reconfigured for a subsequent exposure step for singulation (based on another source for heat or cold to provide a thermal gradient) in the case of incompletely separated materials following the first laser exposure. Such a laser system can produce full or partial length filaments tailored to the particular application with variable or constant pulse timing, and auto focus coordinated with beam timing and speed such that the velocity of the part is invariant throughout processing—in effect keeping the spacing between adjacent filament zones constant. This in turn enables singulation with the lowest cut-face roughness presently available in a laser process, namely approximately 1-3 µm immediately following cutting, compared with 10-100 µm as obtained using conventional laser cutting processes. Auto focus can be achieved by pre-scanning the part, sensing the head height in situ (for example, optically) or determining the position using a machine vision system.

The regenerative amplifier design enables precise timing control in terms of how many round trips are taken prior to ejection of the pulse. Pulse-to-pulse or burst-to-burst timing can be manipulated with stage speed to provide very finely tuned facet edges (roughness, for instance) according to the specific application. In particular, the laser system is especially well suited for glass parts with complex shapes or mother glass sheets where a complex spline is present. In one example implementation, the Rofin MPS platform may be readily modified to include the above embodiments.

Filament Formation Mechanisms

The present methods for forming filaments therefore support new material processing applications for transparent materials that were hitherto not possible. Although there have been previous investigations into filament formation in solid materials, the present disclosure represents the first reduction to practice wherein extremely long filaments are generated, by virtue of burst mode timing and distributed focusing.

Known laser processing methods, such as those employed in the Stealth Dicing and the Accuscribe systems, are driven by modifications such as those by the Yoshino et al. ["Micromachining with a High repetition Rate Femtosecond Fiber Laser" (2008), Journal of Laser Micro/Nanoengineering Vol. 3, No. 3 pgs. 157-162], are processes governed primarily by optical breakdown, where the primary mode of material removal is ablation via small explosions creating voids of variable lateral dimensions and of limited longitudinal length. Optical breakdown is the result of a tightly focused laser beam inside a transparent medium that forms a localized and dense plasma around the geometrical focus created by the material to be singulated. The plasma generation mechanism is based on initial multi-photon excitation of electrons; followed by inverse Bremsstrahlung, impact ionization, and electron avalanche processes. The Columbic explosion is responsible for creation of the localized voids and other modifications described in the literature. Such processes and systems, underscore the refractive index and void formation processes described above [U.S. Pat. No. 6,154,593; SPIE Proceedings 6881-46], and form the basis of most short-pulse laser applications for material processing. In this optical breakdown domain, the singulation, dicing, scribing, cleaving, cutting, and facet treatment of transparent materials has disadvantages such as slow processing speed, generation of cracks, low-strength parts, contamination by ablation debris, and large kerf width—all of which require further processing to complete the part's journey to assembly into handheld electronic devices such as computers, tablets and or phones.

In contrast, laser filamentation processing and the systems disclosed herein overcome the disadvantages of the previously known methods for internal laser processing of transparent materials, and can avoid ablation or surface damage (if desired), dramatically reduce kerf width, avoid crack generation, and speed processing times for such scribing applications. Further, high repetition rate lasers equipped with regenerative amplifiers and fast electro-optic switching allow for the enhancement of the formation of laser beam filaments with minimal heat accumulation and other transient responses of the material on time scales much faster than thermal diffusion out of the focal volume (typically <10 microseconds). The focal volume produced according to the methods of the present disclosure can be manipulated by optical components in the beam path to extend many times the calculated depth of focus (DOF).

As shown in the examples below, using picosecond pulse bursts, the present inventor has demonstrated that when the pulse focuses in a distributed manner, it remains confined for an axial distance ranging from approximately 20 µm to approximately 10 mm, depending on the fluence of the laser pulses, and depending on the process conditions chosen. This enables dense, localized sonic pressure formation useful for via drilling with substantially zero taper, in materials where substantially non-ablative processes are responsible for removing or compressing most of the material.

Without intending to be limited by theory, it is believed that the filaments are produced by weak focusing, high intensity short duration laser light, which can self-focus by the nonlinear Kerr effect, thus forming a so-called filament. This high spatio-temporal localization of the light field can deposit laser energy in a long narrow channel, while also being associated with other complex nonlinear propagation effects such as white light generation and formation of dynamic ring radiation structures surrounding this localized radiation.

Heating by the rapid laser pulses temporarily lowers the refractive index in the center of the beam path causing the beam to defocus and break up the filament. The dynamic balance between Kerr effect self-focusing and index shifting modulated defocusing can lead to multiple re-focused laser interaction filaments through to formation of a stable filament Unlike known methods of filament modification, embodiments disclosed herein support the formation of continuous filaments that are extendable over a wide range of depths within a substrate. For example, in some embodiments, filaments are produced such that they are substantially continuous in nature along their longitudinal axis. This is to be contrasted with known filament processing methods that produce disconnected, discreet damage centers with insufficient radiation intensity (laser fluence or power) to affect any changes in the material. Accordingly, embodiments described below include methods for forming a continuous zone of photo acoustic compression along the path of a processing beam, such that the material properties of the substrate differ compared to regions not exposed to this phenomenon. In some embodiments, a continuous via is formed within the substrate by a radially uniform compression of material within the substrate.

On the simplest level, the filamentation process is believed to depend mainly on two competing processes. First, the spatial intensity profile of the laser pulse acts like a focusing lens due to the nonlinear optical Kerr effect. This causes the beam to self-focus, resulting in an increase of the peak intensity. This effect is limited and balanced by increasing diffraction as the diameter decreases until a stable beam diameter is reached that can propagate distances many times longer than that expected from a simple calculation of the confocal beam parameter (or depth of focus) from this spot size. The other key distinguishing feature is the extremely small filament size achieved by this technique.

This regime of filament formation is new, as experiments described herein have shown filaments with a length well in excess those obtained using prior filament forming methods. For example, according to selected embodiments of the present disclosure, radially compressive filaments—wherein the material is compressed revealing a cylindrical void extending through the entire thickness of the material—with a length of 10 mm or longer may be formed in suitably transparent media. Without intending to be limited by theory, the mechanism appears to involve a shockwave compression created by rapid heating via tightly spaced successive pulses of laser light (the burst pulse phenomenon) centered along the beam propagation axis in the material. Provided that the filament forming beam has sufficient intensity, it is capable of crossing air gaps and gaps of material with substantially lower indices of refraction (real and complex) and forming filaments when entering other transparent layers. White light generation and x-ray emission confirm the highly non-linear processes at work. Gurovich and Fel [ArXiv 1106.5980v1], writing about related phenomena, observed shock wave formation in the presence of ionic and electron collisions in a medium.

A further clue to the photoacoustic nature of the filament forming process resides in deep ablative drilling studies carried out by Paul, et al. [Proceedings SPIE vol. 6107, 610709-1 (2006)] wherein their method of measurement involved a photoacoustic signal generated by void formation using multiple laser pulses. The present approach, involving the distributed focusing of bursts, appears to generate an even more intense photoacoustic signal while avoiding the plasma formation and material ablation common to other techniques. Furthermore, although a mildly thermal entrance and exit are formed at the initial and final surfaces of the target materials, the internal surfaces of the filament have been shown to be substantially free from any disturbances associated with ablative micromachining.

It is further noted that the extreme pressures associated with solid state machining using plasma assisted laser ablation are reported upon by Kudryashov, et al. [Appl. Phys. Lett. 98, 254102 (2011)]. In their work they report plasma temperatures of 90 eV with corresponding pressures of 110 GPa. At this level, there is sufficient energy to setup a compression wave inside the material. The present approach utilizes much closer burst spacing and that has the advantage of creating even hotter beam axis center over a shorter period of time, where the thermal shockwave outpaces any latent thermal effects rendering compression modified environs faster than the formation of any heat affected zone (HAZ) or melt.

Inspection of the radiative processes that occur according to the present methods illustrates that not only is Bremsstrahlung observed, but also ultrasonic transients as well. By virtue of optical adjustment and changes in geometric focus location, the extent and the "stop-start" characteristics of this photoacoustic modification in the material can be controlled—even if multiple layers with gaps comprise the target material. The character of the edges so produced, is fundamentally distinct from those produced using slower, ablative processes that do not depend upon uniform modification of the physical and chemical properties of the materials so exposed.

Singulation

In some embodiments, the aforementioned filament forming methods and apparatus is employed for the singulation of transparent materials. The laser induced index change created during the aforementioned filamentation process may be employed to produce a filament array for singulating parts with substantially or effectively no weight loss in the material being singulated.

In one example implementation, a method of singulation may include loading, aligning, mapping and irradiating the substrate with one or more bursts of pulses of a laser beam having a distributed focus, wherein the substrate is substantially transparent to the laser beam, and wherein the one or more of pulses have an energy and pulse duration selected to produce a filament.

Figure 6:
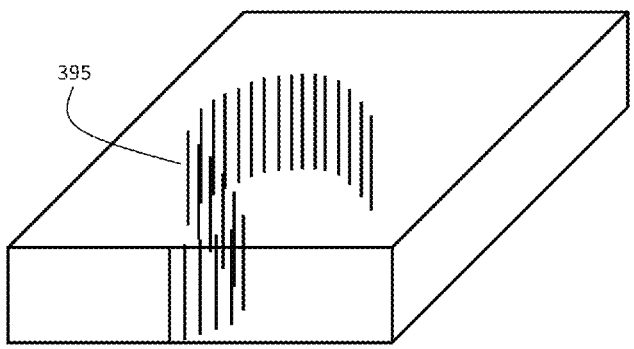
FIG. 6 illustrates the ability of the methods disclosed herein to create parts with curved edges and shapes, formed by tracing out paths on the target material to generate the desired shape. Arbitrary control of the location and orientation of the filaments can be achieved by suitable choice of system components.

An array of filaments is formed by translating the material substrate relative to the focused laser beam to irradiate the substrate and produce an additional filament at one or more additional locations. The filaments array thus defines an internally scribed path for cleaving the substrate. These arrays can exist in one or more dimensions around the line of translation, and can be formed in straight or curved profiles, where an example curved profile 395 is shown in FIG. 6. The filaments may be formed such that they extend over a substantial fraction (for example, more than approximately 15% of target material, and typically greater than 50 µm, or in some cases, greater than 1 mm or even 10 mm) of the target material.

In some embodiments, the methods disclosed herein involve lateral translation of the focused laser beam to form an array of closely positioned filament-induced modification tracks. This filament array defines a pseudo-continuous curtain of modifications inside the transparent medium without generating laser ablation damage at either of the top or bottom surfaces (unless specifically desired). This curtain renders the irradiated material highly susceptible to cleaving when only very slight pressure (force) is applied, or may spontaneously cleave under internal stress. The cleaved facets may be devoid of ablation debris, show minimal or no microcracks and microvents, and accurately follow the flexible curvilinear or straight path marked internally by the laser with only very small kerf width as defined by the self-focused beam waist.

In some embodiments, for selected materials and processing conditions, once a filamentation array is formed in the transparent substrate, only small mechanical pressure may be required to cleave the substrate into two parts on a surface shape that is precisely defined by the internal laser-filamentation curtain. In certain materials and especially in chemically strengthened glasses, the separation event may be spontaneous, requiring no further steps to affect singulation.

The user selectable process conditions may be chosen to vary the time interval between exposure and separation from 0 seconds (immediately separates upon exposure) to an infinite number of seconds (requires a follow-on step of some kind to complete the singulation process).

In some embodiments, multiple angle cuts may be employed to create, for example, using 3 sequential cuts, a chamfered or faceted edge of the material being singulated, greatly reducing production time and costs. In one example implementation, this may be performed as an X pass process, where X represents the number of angled sides or edges.

In some embodiments, the substrate may be cleaved using one or more of the following: additional laser processing steps, physical heating, cooling, and/or mechanical means. It has been found that when a filament array is formed according to the aforementioned filament generation methods, the cleavage step requires far less applied force and produced superior edge quality relative to known approaches. Depending upon the nature of the material, the process of scribing and separation (singulation) may take place in a single step requiring no further exposure to any forces or thermo-mechanical tension.

In some embodiments, the filament array may be formed such that the filaments touch (e.g. are tangential to one another; e.g. for filaments circular in the distribution about the beam center or axis of incidence) or are separated by a user-selectable distance, which can be variable. In some embodiments, the distance between filaments forming the array is constant. In other examples, the properties of the material may be such that improved singulation is obtained for filament arrays that are formed with variable spacing along the perimeter of the shape to be removed or cut. The suitable filament spacing for efficient cleaving will thus generally be determined by the characteristics of the material and the requirements of the application, including the physical/electrical properties of the singulated part. In addition to the varying beam parameters such as pulse width, pulse-to-pulse separation within a burst, burst repetition rate, wavelength, and pulse energy, the polarization state may be varied by utilizing a polarization rotation element (such as a waveplate) and varying the degree of rotation from about 1 degree to about 80 degrees and from random to linear to circular or to some mixture of the two during processing as required by the desired end result. It is observed that edge quality and therefore post-singulation edge strength can be modulated by using this technique, as well as others.

As noted above, the laser source may include a burst pulse laser, for example, a pulsed laser with a regenerative amplifier, but other burst pulse systems may be employed. For example, in one embodiment, a multi-pass amplifier equipped with a fast electro-optic switch, either internally or externally mounted, may be employed to deliver the beam to the substrate via computer controlled steering (and optional focus mechanisms and polarization control), and the substrate may be translated relative to the focused laser beam with a constant velocity along the path of exposure. In some embodiments, the tangential velocity may be constant when forming curved portions of a filament array, such as when forming filament arrays at corners, such that the array of filaments so created is constant in its spatial irradiance, dose and temporal characteristics. In other embodiments, computer control may be employed to translate the beam relative to a fixed substrate. In other embodiments, the computer control may be employed to control the motion of both the beam and the substrate.

For example, the translation rate employed to form the filament array may be determined according to the velocity of a simple linear stage supporting the substrate, or may be determined according to the combination of the stage velocity and the beam velocity, in the case of a scanning system based on telecentric or non-telecentric final objectives, depending upon the desired process.

The translation rate may be selected to produce user-selectable filament spacing on a micron scale, depending, for example, upon the desired characteristics (physical, optical, electrical, chemical, thermal, etc.) of the materials thus singulated. Accordingly, by varying one or more of the processing parameters in real-time, filament arrays with locally controlled or tailored properties may be formed—i.e. arrays of filaments where the properties of the filaments vary spatially among different regions of the material, thereby spatially modifying properties of the material itself. This aspect of laser processing has not been achievable using previously known laser singulation approaches and systems. Indeed, the present method of forming arrays with locally-controlled properties may be employed for a wide range of applications. A non-limiting list of example properties that may be locally controlled according to the present filamentation process include electrical performance, light output and post-singulation break strength.

Properties of the beam of laser pulses employed to form the filament array may varied according to pre-selected, and computer controlled, process parameters, in order to provide sufficient beam intensity within the substrate to cause self-focusing of the laser beam. For example, the laser beam may be controlled such that the filament is formed at all points along the beam axis within the material to be processed. In other words, the beam properties may be controlled as to exceed a particular characteristic energy level to create acoustic compression within the substrate(s), thus rendering it (them) singulated or ready to be so, depending upon the nature of the target materials.

In some embodiments, the filament arrays are formed by filaments that are substantially symmetric about their longitudinal axis (usually the incident axis of the laser beam). The length of the filament may be controllable (for example, from approximately 10 μm to over 10 mm) by changing the process parameters, such as power, focusing characteristics and beam shape, which are controlled machine parameters. Varying such parameters may result in a change in the characteristics associated with the photoacoustic modification created in the material.

An important distinction exists between chirped pulses and the burst pulses employed in the methods of the present disclosure, both in terms of how they are generated, but also in terms of the energy characteristics of each, with the burst machining method exhibiting much greater flexibility in processing, particularly when coupled with a scanner and the appropriate focusing optics to render telecentric behavior over a defined field size.

In one embodiment, a system is provided for auto-focusing of the filament forming beam in real-time. For example, in some implementations, the beam can be moved at high rates of speed using galvanometers and/or acoustic optical deflectors to steer the beam in a coordinated manner fully under computer control.

Figure 7A:
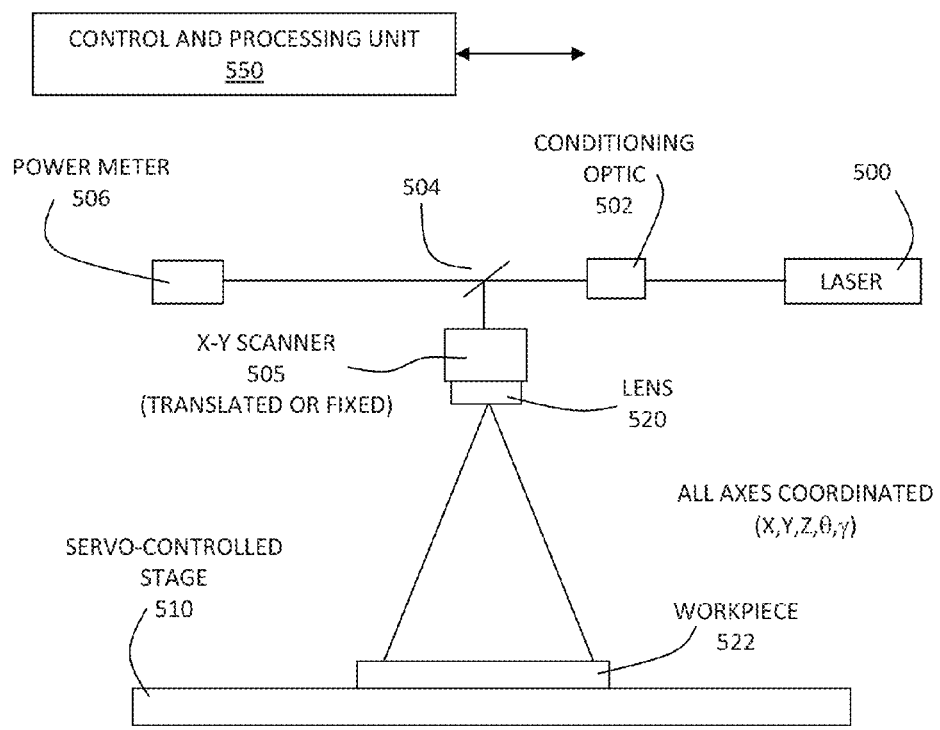
FIG. 7(a) is a schematic layout of an example apparatus for performing the methods disclosed herein, and where the system includes, a stage, scanner, lens array, and servo controlled XYZ positioner.

FIG. 7(a) presents an example configuration of a laser processing system for forming filament arrays, including an ultrafast laser 500 supplying a train of burst-mode pulses, preferably with a pulsewidth less than 100 picoseconds, equipped with a suitable collection of beam steering optics, such that the beam or beams can be delivered to a multi-axis rotation and translation stage including: a rotational stage in the XY plane (theta, θ), a 3D XYZ translational stage, and an axis for tipping the beam or the part relative to the X axis (gamma, γ) in a coordinated control architecture. In the example embodiment shown, the beam is manipulated by conditioning optic 502 (e.g. a positive or negative lens or combination of lenses capable of delivering a weakly focused spot that can be further conditioned or manipulated), beam sampling mirror 504, power meter 506, X-Y scanner 505, final focusing lens 520, and servo-controlled stage 510 for positioning workpiece 522. Control and processing unit 550, which is described in further detail below, is employed for the control of the laser filamentation and/or singulation apparatus embodiments disclosed herein. Filament position and depth may be controlled (as illustrated in FIG. 1(*f*)) using an autofocus configuration (e.g. using a position-sensing device) that maintains a constant working distance.

Figure 7B:
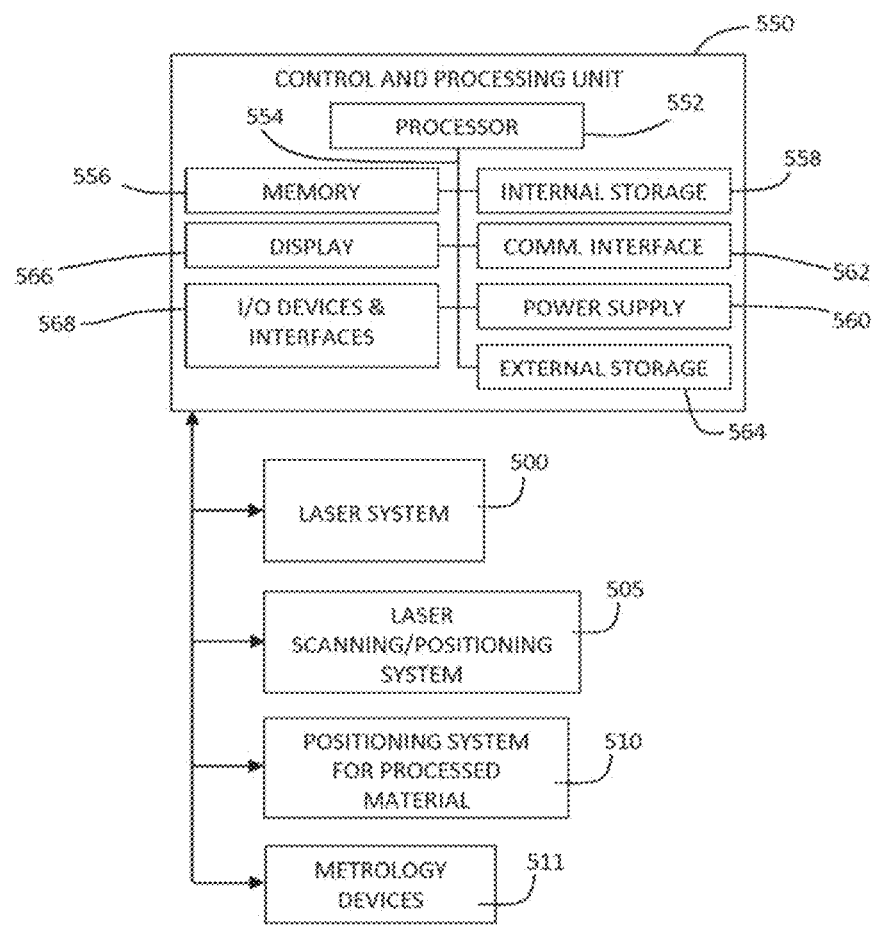
FIG. 7(b) is a block diagram of an example control and processing system.

FIG. 7(*b*) provides an example implementation of control and processing unit 550, which includes one or more processors 552 (for example, a CPU/microprocessor), bus 554, memory 556, which may include random access memory (RAM) and/or read only memory (ROM), one or more optional internal storage devices 558 (e.g. a hard disk drive, compact disk drive or internal flash memory), a power supply 560, one more optional communications interfaces 562, optional external storage 564, an optional display 566, and various optional input/output devices and/or interfaces 568 (e.g., a receiver, a transmitter, a speaker, an imaging sensor, such as those used in a digital still camera or digital video camera, an output port, a user input device, such as a keyboard, a keypad, a mouse, a position tracked stylus, a position tracked probe, a foot switch, and/or a microphone for capturing speech commands). Control and processing unit 550 is interfaced with one or more of laser system 500, laser scanning/position system 505, the positioning system for the processed material 510, and one or more metrology devices or systems 511, such as one or more metrology sensors or imaging devices.

Although only one of each component is illustrated in FIG. 7(*b*), any number of each component can be included in the control and processing unit 550. For example, a computer typically contains a number of different data storage media. Furthermore, although bus 554 is depicted as a single connection between all of the components, it will be appreciated that the bus 554 may represent one or more circuits, devices or communication channels which link two or more of the components. For example, in personal computers, bus 554 often includes or is a motherboard.

In one embodiment, control and processing unit 550 may be, or include, a general purpose computer or any other hardware equivalents. Control and processing unit 550 may also be implemented as one or more physical devices that are coupled to processor 552 through one of more communications channels or interfaces. For example, control and processing unit 550 can be implemented using application specific integrated circuits (ASICs). Alternatively, control and processing unit 550 can be implemented as a combination of hardware and software, where the software is loaded into the processor from the memory or over a network connection.

Control and processing unit 550 may be programmed with a set of instructions which when executed in the processor causes the system to perform one or more methods described in the disclosure. Control and processing unit 550 may include many more or less components than those shown.

While some embodiments have been described in the context of fully functioning computers and computer systems, those skilled in the art will appreciate that various embodiments are capable of being distributed as a program product in a variety of forms and are capable of being applied regardless of the particular type of machine or computer readable media used to actually effect the distribution.

A computer readable medium can be used to store software and data which when executed by a data processing system causes the system to perform various methods. The executable software and data can be stored in various places including for example ROM, volatile RAM, non-volatile memory and/or cache. Portions of this software and/or data can be stored in any one of these storage devices. In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like.

Some aspects of the present disclosure can be embodied, at least in part, in software. That is, the techniques can be carried out in a computer system or other data processing system in response to its processor, such as a microprocessor, executing sequences of instructions contained in a memory, such as ROM, volatile RAM, non-volatile memory, cache, magnetic and optical disks, or a remote storage device. Further, the instructions can be downloaded into a computing device over a data network in a form of compiled and linked version. Alternatively, the logic to perform the processes as discussed above could be implemented in additional computer and/or machine readable media, such as discrete hardware components as large-scale integrated circuits (LSI's), application-specific integrated circuits (ASIC's), or firmware such as electrically erasable programmable read-only memory (EEPROM's) and field-programmable gate arrays (FPGAs).

Figure 8A:
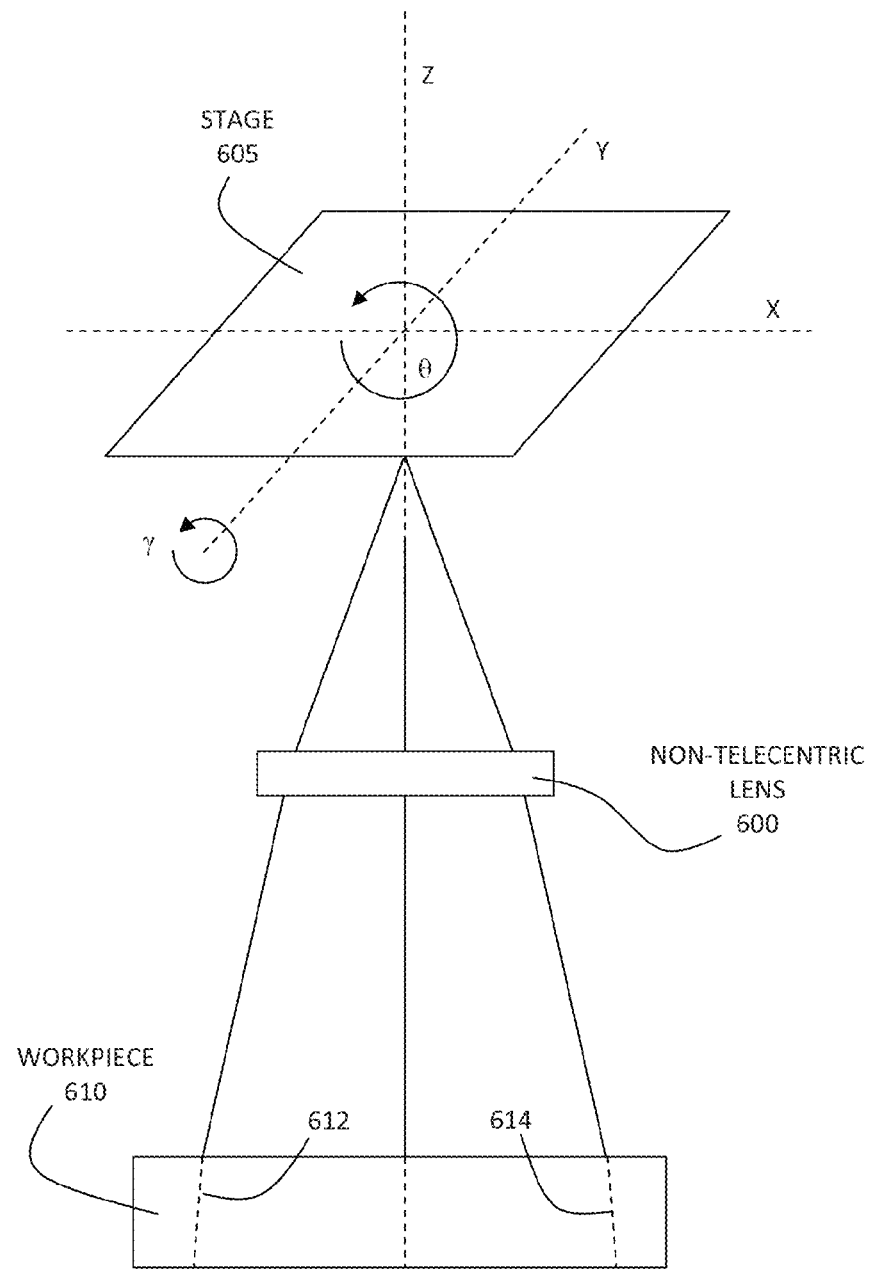
FIGS. 8(a) and 8(b) illustrate the relationships of axes relative to the processed part in an example embodiment, illustrating how the apparatus may be controlled to process a wide array of substrate shapes and orientations, using (a) non-telecentric and (b) telecentric lenses.
Figure 8B:
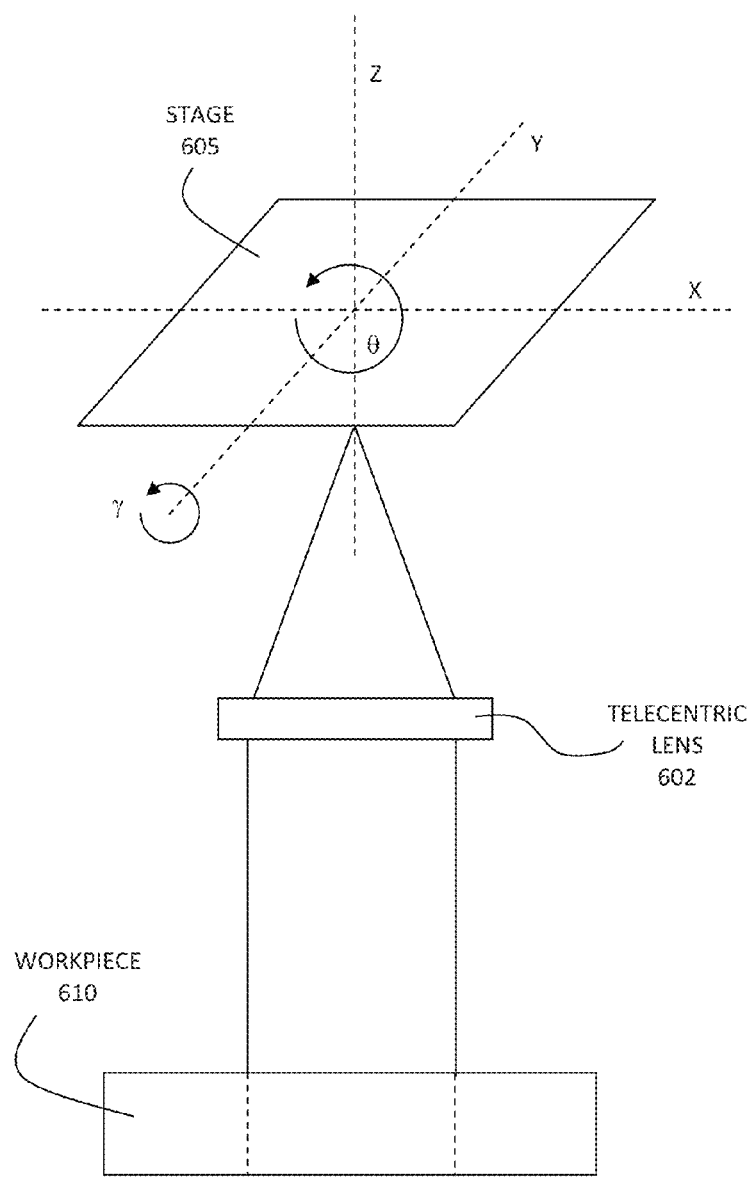
Figure 8C:
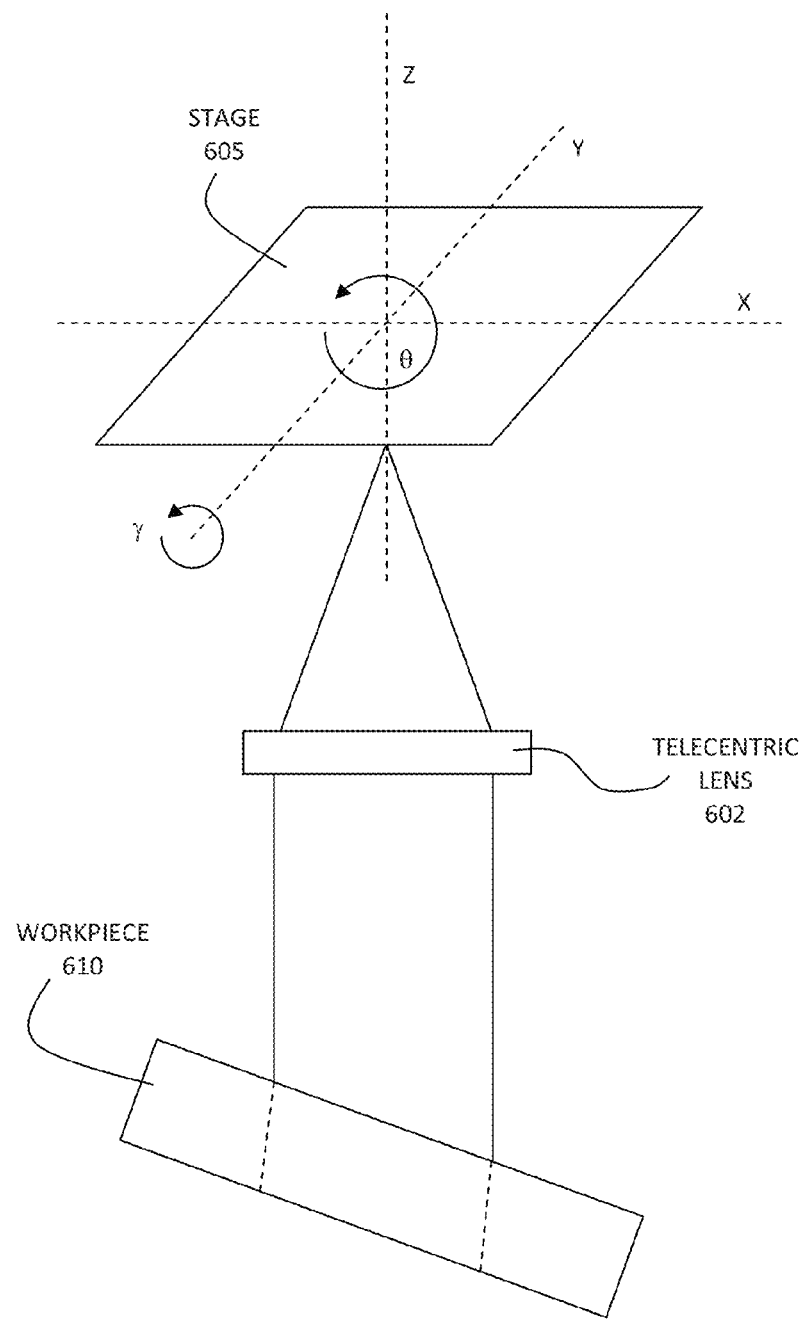
FIG. 8(c) illustrates an example embodiment in which the stage supporting the material being processed is rotated to produce angled filaments.

FIGS. 8(*a*) and 8(*b*) illustrate example embodiments showing the ability to control multiple axes via the control of stage 605, using (a) non-telecentric 600 and (b) telecentric 602 lenses. In the case of a non-telecentric lens 600, angled filament paths can be created by the natural distortion present in a non-field-corrected lens. Rotation about the X (gamma) axis may be performed to provide angled filament modified zones (612, 614) within workpiece 610 using normally incident light. It is to be understood that other optical configurations are possible.

FIG. 8(*c*) illustrates an alternative embodiment in which the stage supporting the material being processed is rotated to produce filaments that are angled relative to the material surface. This embodiment is configured to present a tilted sample with respect to the beam incidence angle for producing results similar to apparatus embodiments employing a scan lens.

Figure 9:
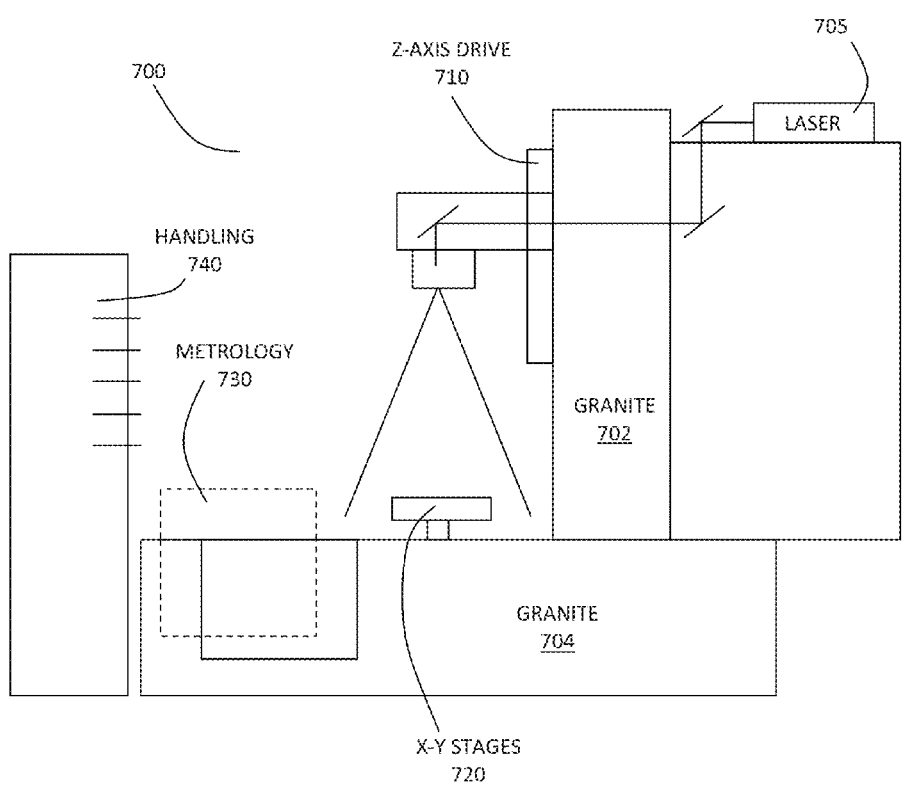
FIG. 9 depicts an example system for producing parts using the methods disclosed herein. Such an embodiment may be employed for the singulation of substantially transparent media with high edge quality and speed.
Figure 10A:
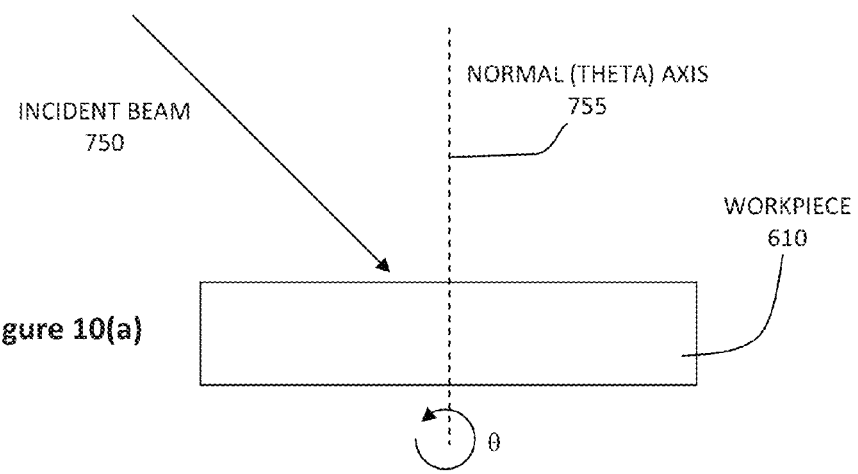
FIGS. 10(a)-(c) illustrate example embodiments using a theta stage for the positioning of the apparatus described herein, with a non-orthogonal (i.e. <90° or >90° with respect to the target surface), for the creation of angled filament cleave planes. Such an embodiment enables the production of parts with edges that are not perpendicular to the surface (e.g. a chamfered part). For example, using the theta stage, a circular path can be traced producing a part with a cut-out having an angled edge characteristic.
Figure 10B:
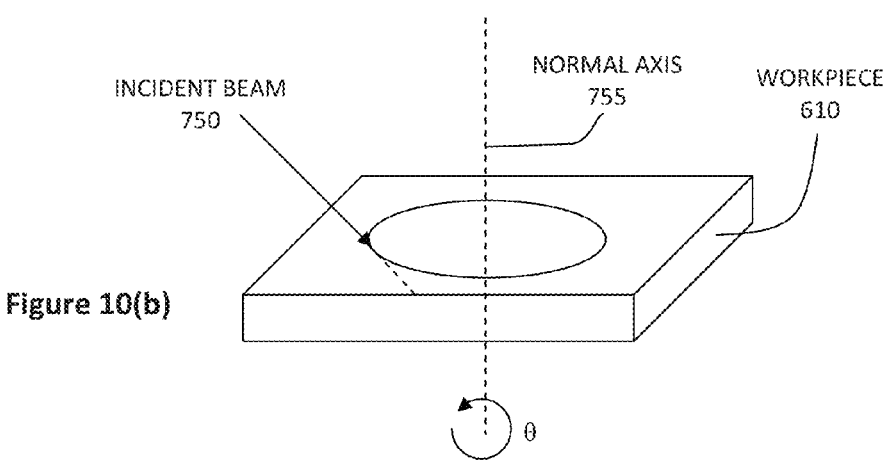
Figure 10C:
Figure 10D:
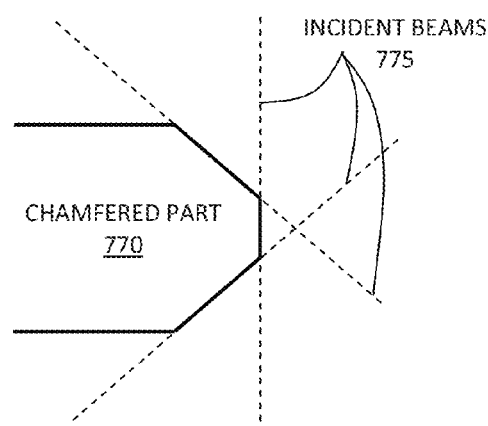
FIGS. 10(d) and (e) illustrates the formation of a chamfered edge via processing with multiple filament forming beams at different angles.
Figure 10E:
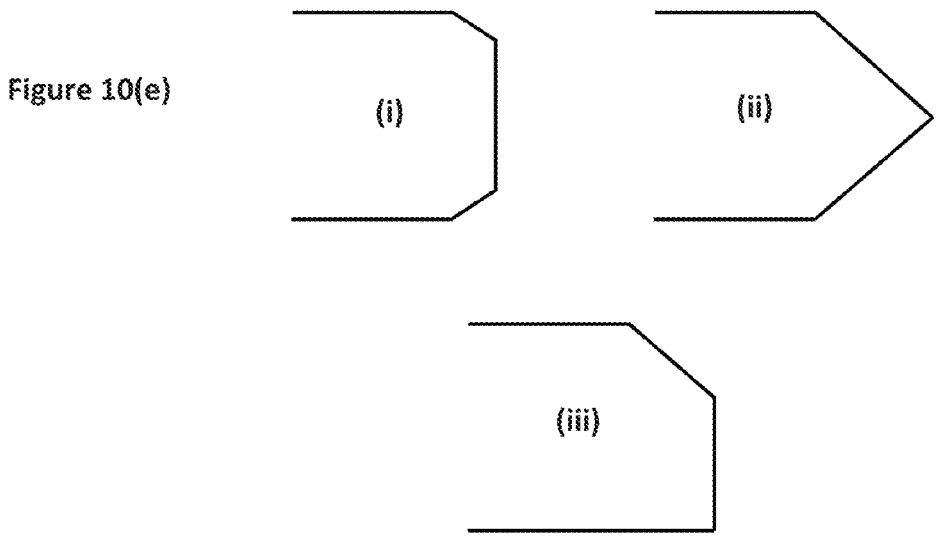
FIGS. 10(f)-(i) illustrate the processing of sodalime glass using multiple cuts to obtain chamfered edges.
FIGS. 10(j) to (l) show edge-on views of a chamfered facet at different zoom levels.
FIGS. 10(m) to (o) show the processing of a part with three cuts to obtain an edge having an intermediate vertical edge and two chamfered edges.
Figure 10F:
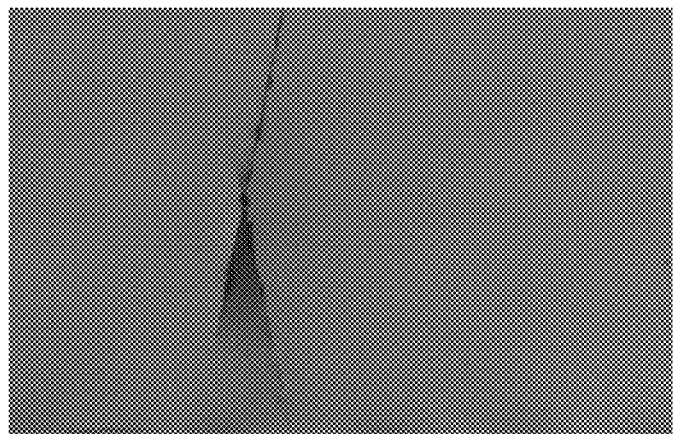
Figure 10G:
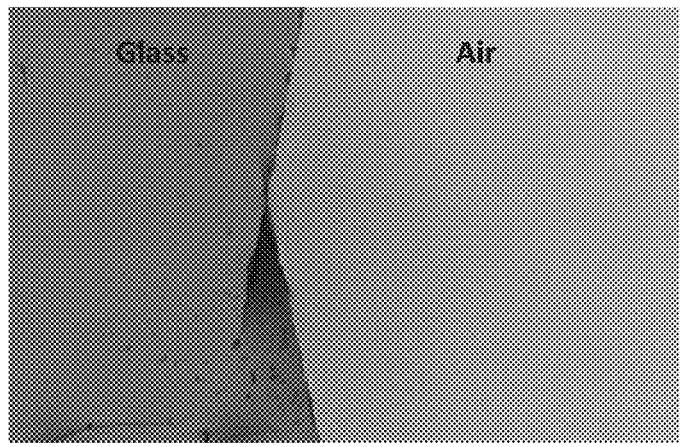
Figure 10H:
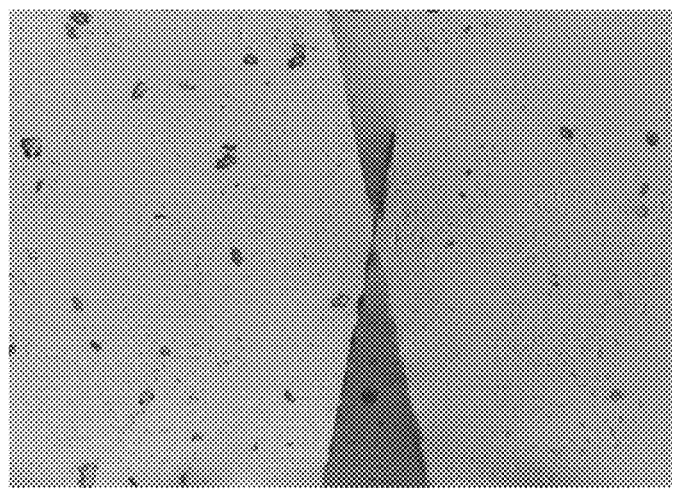
Figure 10I:
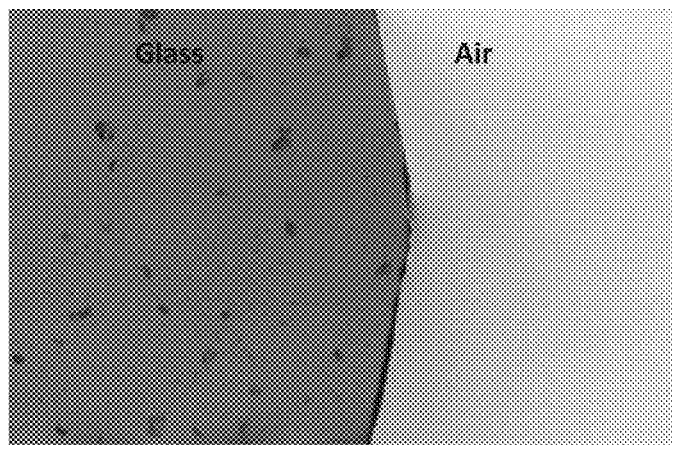
Figure 10J:
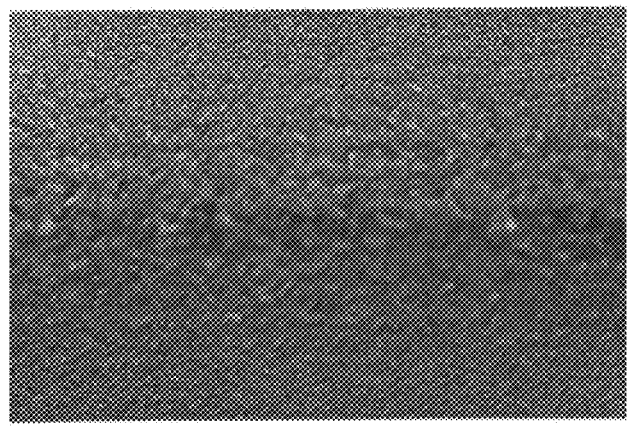
Figure 10K:
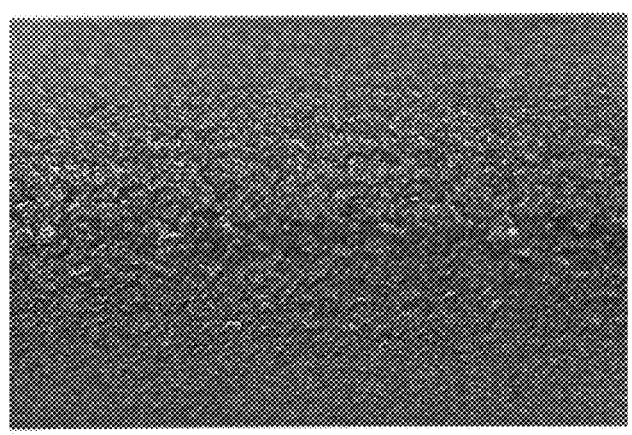
Figure 10L:
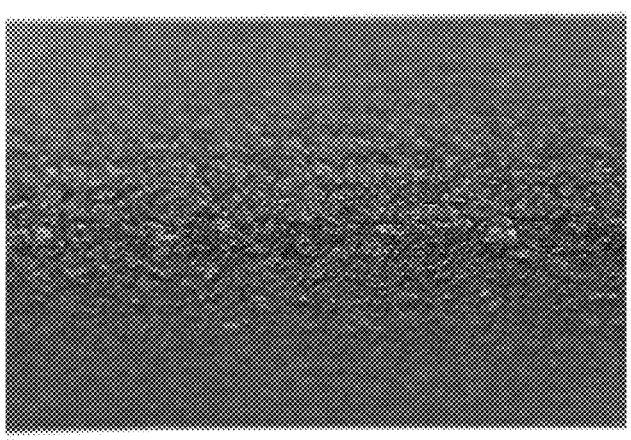
Figure 10M:
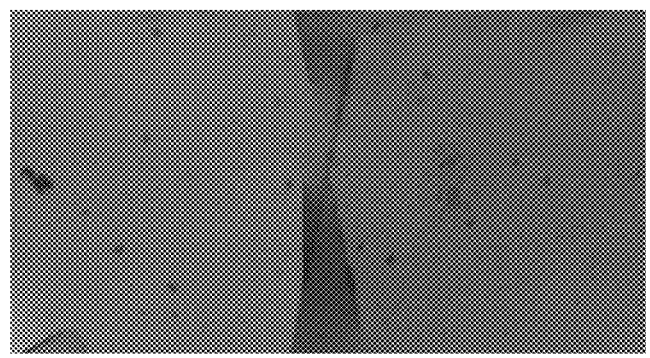
Figure 10N:
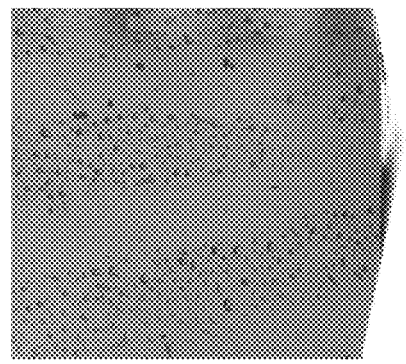
Figure 10O:
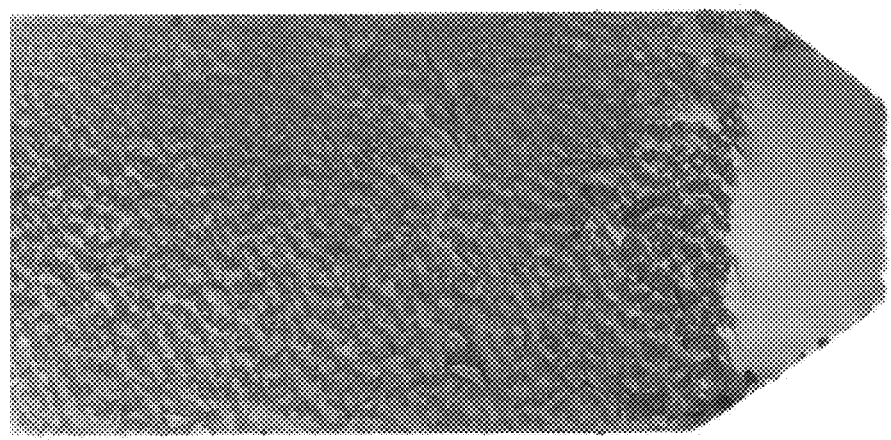

FIG. 9 illustrates the layout of an example laser system 700 suitable for part singulation. Laser 765 is a laser system capable of delivering burst pulses, for example, with energies in the range of approximately 1 uJ-50 mJ, at a repetition rate of up to approximately 2.5 MHz.

Granite riser 702 is designed to be a reactive mass for dampening mechanical vibrations, as is commonly used in industry. This could be a bridge on which the optics above the stage can translate along one axis, X or Y relative to the stage, and in coordination with it. Granite base 704 provides a reactive mass that may support any or all components of the system. In some embodiments, handling apparatus 740 is vibrationally decoupled from the system for stability reasons.

Z axis motor 710 is provided for translating the optics (conditioning and focusing and scan optics if needed) in the Z axis relative to the stage. This motion can be coordinated with the XY stage and X or Y motion in the overhead granite bridge, and the XY motion of the stage on the granite base, which holds the sample material to be processed.

Stages 720 include, for example, XY and Theta stages with a tilt axis, gamma ("yaw"). The motion of stages 720 is coordinated by a control computing system, for example, to a create part shape desired from a larger mother sheet. Metrology apparatus 730 provides post processing or preprocessing (or both) measurements, for example, for mapping, sizing, and/or checking edges quality post cut.

FIGS. 10(*a*)-(*d*) show the angled cut out approach for making internal features with angled edges requiring no post singulation processing to achieve the desired angular result. In FIGS. 10(*a*)-(*c*), the beam track is accomplished via rotation around the theta axis 755 with a fixed incidence angle from the laser beam, equal to the slope desired on the final part edge 765. This non-limiting embodiment enables angled cutting and translation of the rotary stage as an apparatus to support the creation of complex cutouts via filament arrays.

FIG. 10(*d*) illustrates an example implementation of the formation of a chamfered part 770 via processing with multiple filament forming beams 775 at different angles. It is to be understood that the beam and filament paths can be controlled to form chamfered or bevel edges of various degrees. In the case of concerted (parallel) formation, the beam can be split and directed through optics to achieve multiple beam paths arriving at the target exhibiting angles of incidence other than normal, along with a normally incident beam, such that a three-face edge or chamfer is created.

It is to be understood that chamfers can be created with two or more faces, depending, for example, on the degree of splitting tolerated by the process. Some example configurations are illustrated in FIG. 10(*e*).

FIGS. 10(*f*) to 10(*n*) illustrate the processing of sodalime glass using multiple cuts to obtain chamfered edges in a number of different configurations. In FIGS. 10(*f*) and 10(*h*), sodalime glass substrates with a thickness of 1.6 mm, a scan speed of 500 mm/sec, and angles of incidence of 12 degrees are processed with two beams, where one side is scribed, the glass substrate is flipped, and the second side is again scribed. The corresponding post-cleaved structures are shown in FIGS. 10(*g*) and 10(*i*), respectively. FIGS. 10(*j*)-10(*l*) show the edge view of the chamfered facet at multiple zoom levels.

In some embodiments, as described below, the laser processing system can be configured such that one laser (with beam splitting optics) can perform both scribing steps simultaneously.

FIGS. 10(*m*), (*n*) and (*o*) show the processing of a part with three cuts to obtain an edge having an intermediate vertical edge and two chamfered edges, using conditions similar to those described above. In this case, the substrate was processed at one side at an incident angle of 12 degrees; the substrate was flipped and processed on the other side at an incident angle of 12 degrees, and then the incident angle was changed to zero degrees for the vertical processing step. As noted above, it will be understood that these processing steps may be performed simultaneously using a single laser with appropriate beam splitting, provided that the laser has sufficient power. It has been found, for example, that a laser with an average power of approximately 75 W is sufficient to perform all processing steps simultaneously.

The aforementioned apparatus, with multi-axis rotational and translational control, may be employed for the purpose of bringing the beam on to the work piece(s) at variable focus positions, non-normal angles of incidence and at variable, recipe controlled positions to create curvilinear zones of filament arrays, for the purpose of singulating the parts into component pieces, cutting out closed-form shapes and creating products such as cover glass for mobile devices with high (e.g. greater than approximately 30 MPa) as-singulated break strength, which is presently not possible using the techniques currently employed by the device manufacturers.

Those skilled in the art will recognize that all of these axes are not required for all applications and that some applications will benefit from having simpler system constructions. Furthermore, it is understood that the apparatus shown is but one example implementation of the embodiments of the present disclosure, and that such embodiments may be varied, modified or hybridized for a wide variety of substrates, applications and part presentation schemes without departing from the scope of the present disclosure.

FIG. 11(*a*) illustrates a schematic of an example rotary processing system configuration 800 for use in high volume manufacturing according to the methods disclosed herein. The example system includes a rotary stage to transport parts to the various stations to eliminate load and unload overhead, as well as post-process metrology and pre-process mapping.

Mapping subsystem 805 is provided to determine, for example, bow in sample, size, part orientation, or curvature over which singulation is to be affected. Processing station 810 performs singulation, texturing, drilling, etc., according to the methods disclosed herein. Metrology station 815 performs measurements such as measuring a part against a stored part profile or inspection of edges. Load and unload station 820 is configured to bring parts into and out of the processing station. Linear slide station 830 provides rapid part exchange with minimal moving parts and cost. The stage rotates (as shown at 825) about the central axis of the system, transporting parts from station to station.

FIG. 11(*b*) illustrates an example implementation of processing stage 810, providing multi-substrate, multi-beam, and multi-laser head capability. This enables multiplexing of the process stage, such that multiple samples can be processed in concert. In the example embodiment shown in the Figure, beams emitted by lasers 832 and 834 are split and directed towards respective X, Y, Z, θ and λ stages before being directed onto parts that are positionable at four locations by handler shuttle 838.

FIGS. 11(*c*)-11(*f*) illustrate another example implementation involving a dual laser beam system for the processing of four wafers. As shown in FIG. 11(*c*), four wafers (1-4) are spaced in four quadrants for processing, with a controllable gap 1100 between wafers. Referring to FIG. 11(*d*), two incident and laterally spaced (in the x-direction) burst laser beams are formed from a single laser system using a movable beam delivery system including beamsplitter 1105, mirror 1110, and lenses 1115. The beams are each focused onto separate wafers, (e.g. wafers 1 and 3, or 2 and 4), where the separate wafers are supported by a common support 1120.

As shown in FIG. 11(*e*), the beam delivery system is translated relative to the wafers in the Y-direction in order to scribe the wafers via filament processing according to the present disclosure. After having completed a scribe along a given line in the Y-direction, the relative position between the wafers and the beam delivery system in the X-direction is changed, and the wafers are once again scribed in the Y-direction. This process is repeated to facilitate laser processing along all required lines in the Y-direction. It will be appreciated that the speed of wafer processing is more dependent on the speed of the Y-stage than that of the X-stage. Accordingly, in some embodiments, the Y-stage may be controlled by a motor having a higher speed than that of the motor controlling the X-stage.

Figure 11A:
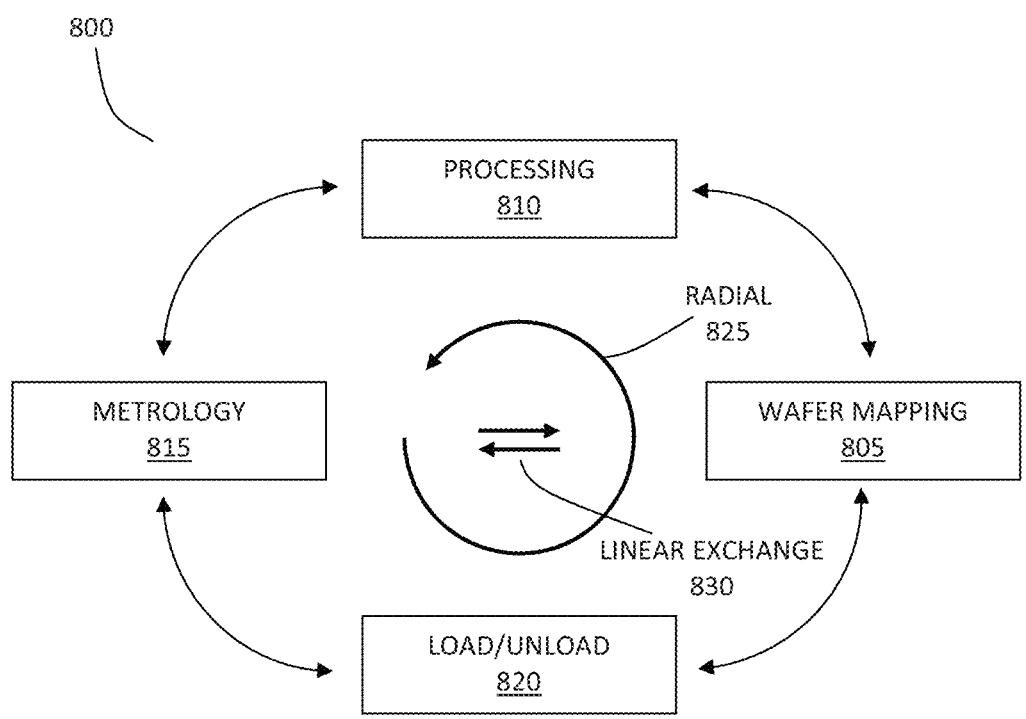
FIG. 11(a) illustrates a schematic of an example rotary processing tool for processing wafers according to the methods disclosed herein.
Figure 11B:
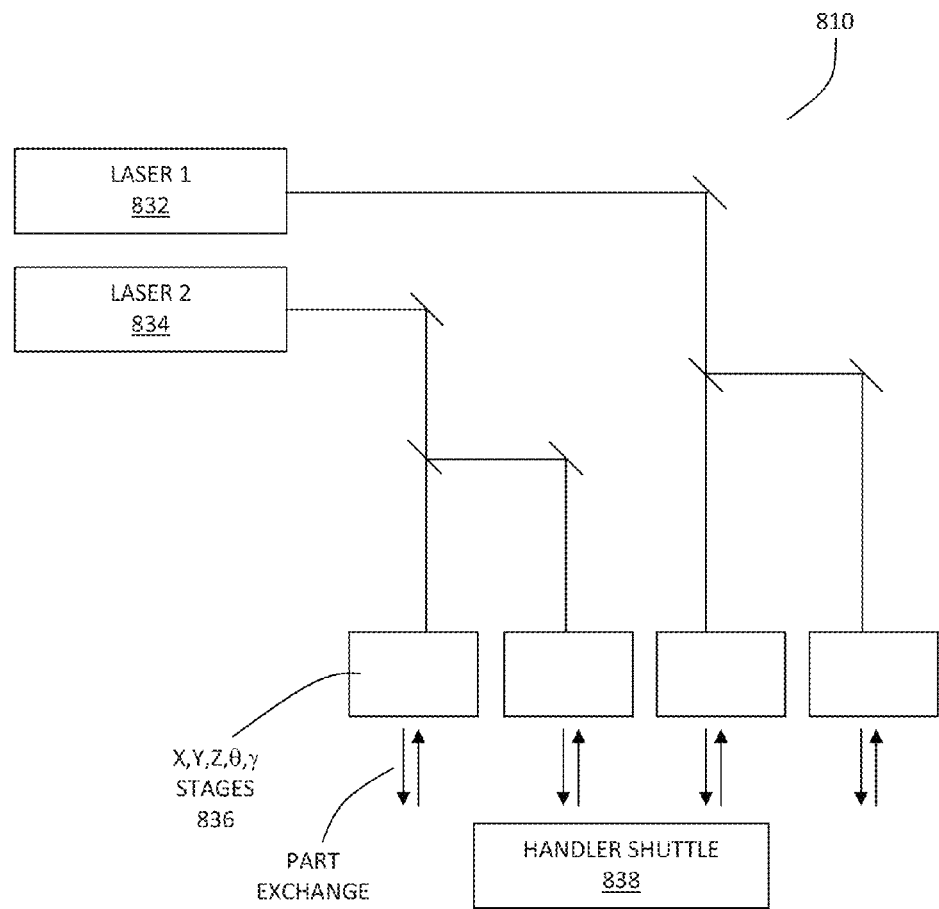
FIG. 11(b) illustrates an example implementation of the processing stage shown in FIG. 11(a), providing multi-substrate, multi-beam, and multi-laser head capability.
Figure 11C:
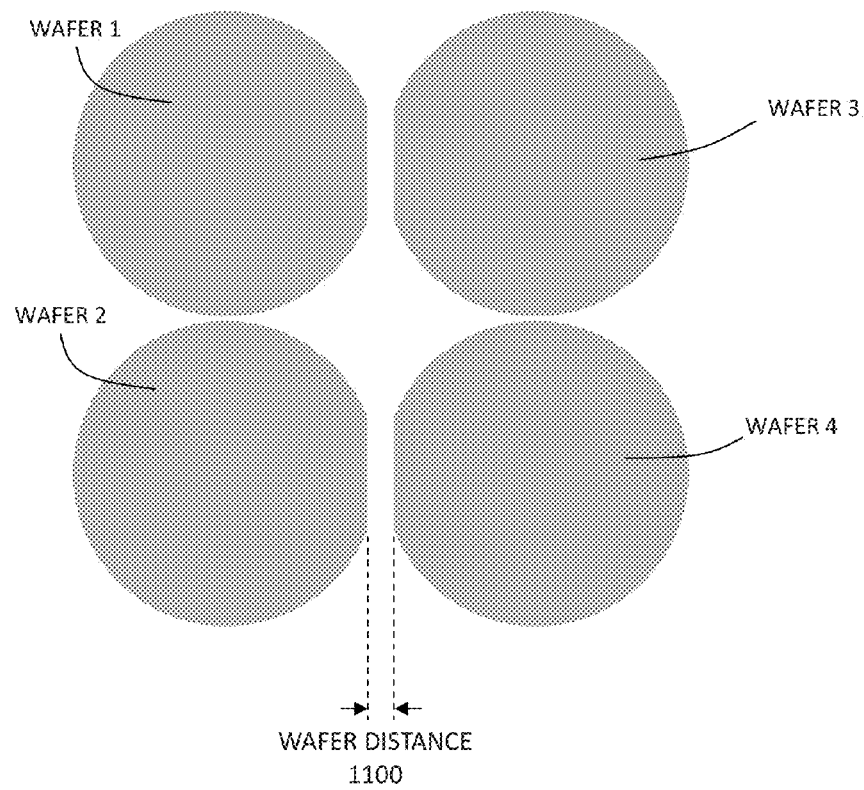
FIGS. 11(c)-11(f) illustrate an example implementation of a system for performing laser filament processing on four wafers using a single laser system.
Figure 11D:
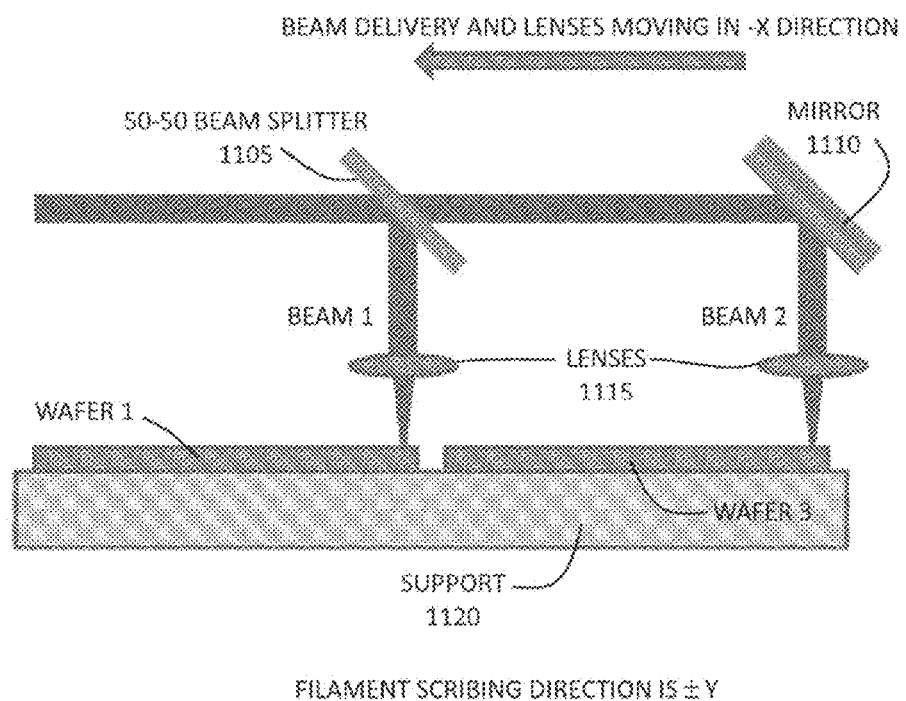
Figure 11E:
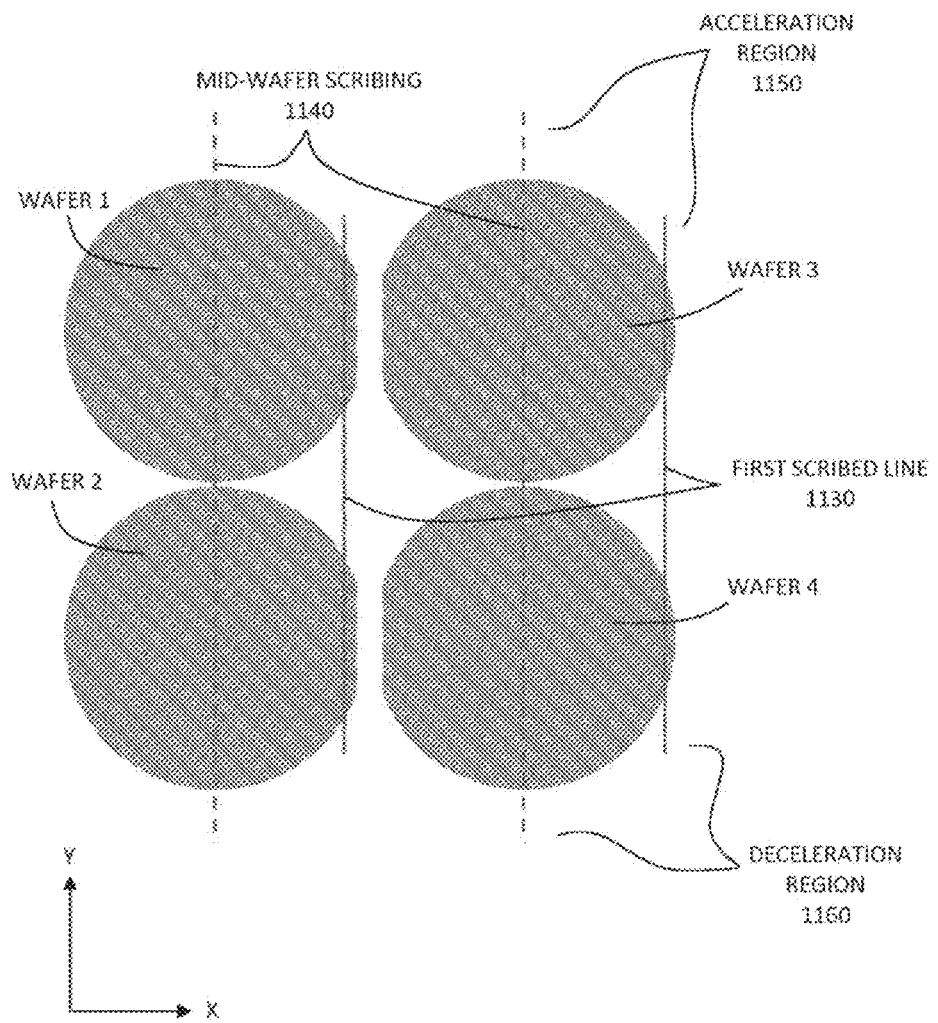

FIG. 11(e) illustrates two example scribe lines in the Y-direction, namely first scribed lines 1130 and mid-wafer scribed lines 1140. Also indicated in the Figure are acceleration region 1150, where the relative speed between the beam delivery system and the wafers increases prior to scribing, and deceleration region 1160, where the relative speed between the beam delivery system and the wafers decreases after scribing.

The laser pulses may be blocked or attenuated when the laser beam is not positioned over a scribe line on a wafer. Two example laser power time dependent profiles are shown in FIG. 11(f), where temporal profile (i) corresponds to first scribe line 1130 in FIG. 11(d), while where temporal profile (ii) corresponds to mid-wafer scribe line 1140 in FIG. 11(d).

Figure 11F:
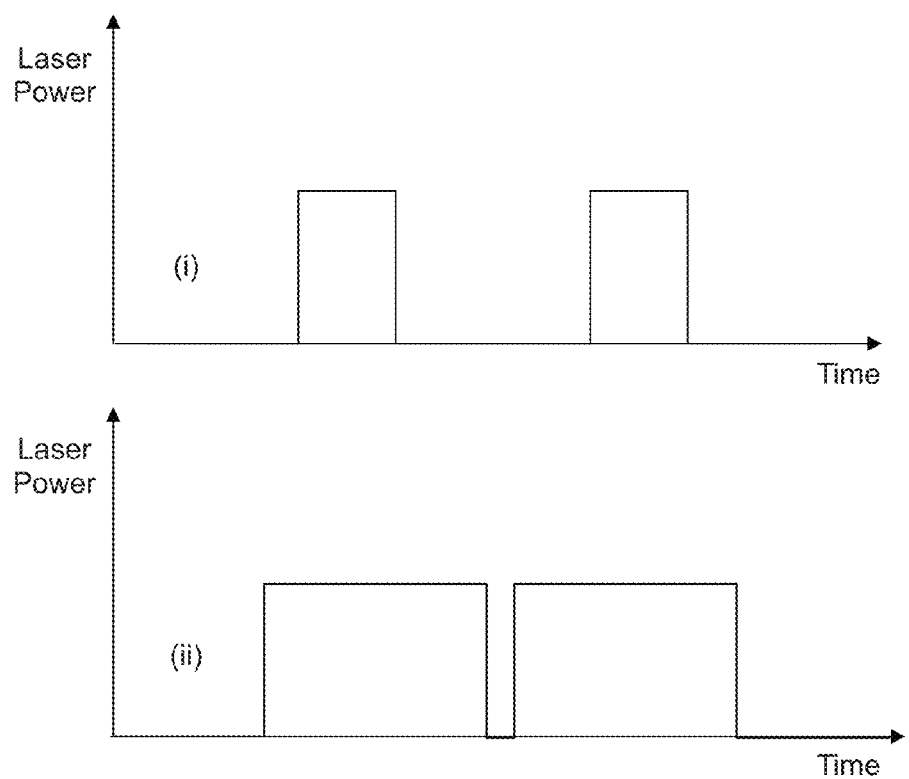

After all scribe lines in the Y-direction have been formed, the wafers are then rotated by 90 degrees relative to the beam delivery system, and the process is repeated to scribe all required lines in the X-direction, as shown in FIG. 11(f).

In some embodiments, the polarization of the incident laser pulses may be horizontal, vertical, or circular, as described in further detail below. For example, it has been found for some materials that employing horizontal polarization during scribing result in improved scribing efficiency.

Figure 12:
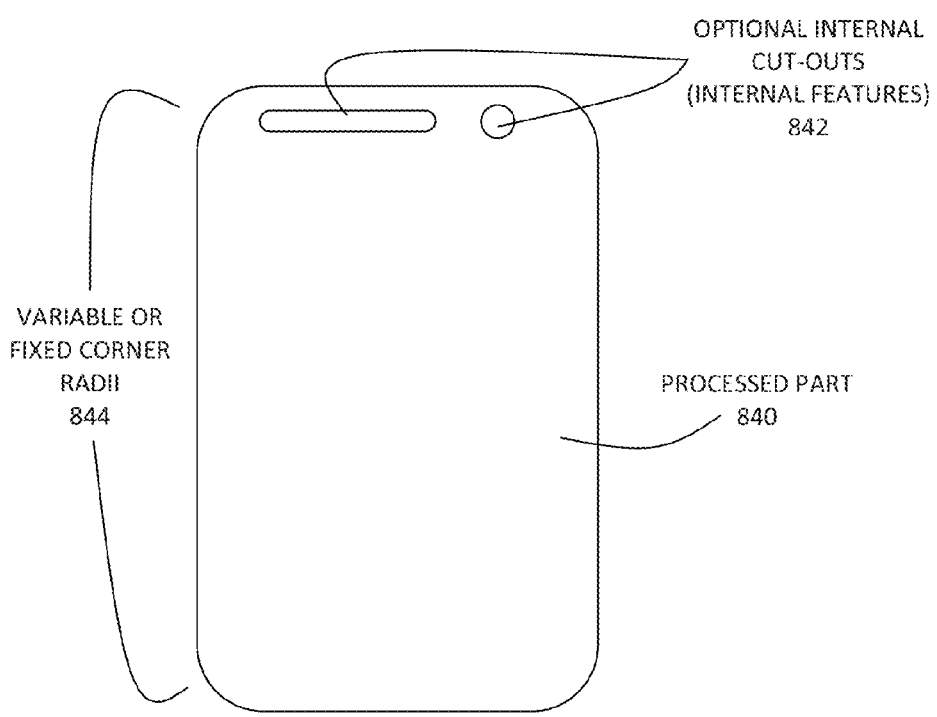
FIG. 12 illustrates an example implementation of a processed material with complex edges and shapes within cut-outs from mother sheets with rounded corners having an optionally variable radius.

FIG. 12 illustrates the processing of a transparent substrate to produce a part 840 with complex edge, internal cutout features 842 and rounded corners. As shown in the Figure, the corners 844 may be fixed or may vary in radius. The Figure also demonstrates the ability to form arbitrary curvilinear arrays of filaments as well for the applications of closed form shapes and internal features.

In another embodiment, the final lens can be of large clear aperture, for example, approximately 50 mm, which may be employed to generate an approximately 25 mm×25 mm field up to 100 mm×100 mm, and field uncorrected, such that angular distortions create angles of incidence other than normal, and such that the singulated product has angled or chamfered surfaces immediately after processing.

In some embodiments, there may exist a certain degree of programmability in the burst pulses as they are created, relative to the rising or falling energy level of each sub-pulse comprising the burst. In other words, a degree of control is given the user by choosing the rising or falling waveform profile of the burst envelope of pulses. This pulse energy profile modulation, allows the user to determine the rate of heat formation and therefore the rate at which the material undergoes acoustic compression. Such a method therefore allows for acoustic compression control using a burst pulse profile modulated by pulse to pulse control.

As noted below, the present singulation methods may be employed for achieving a higher yield process than conventional approaches, since, in some embodiments, singulation may be achieved in a single process step and at higher bend strength with conventionally singulated parts.

The energy characteristics of the burst pulses, focused in a spatially distributed manner, enable the apparatus to deliver a material-compressing wave of substantially uniform density over an extended length in the material, for single layer or multi-layer materials, provided that sufficient energy exists in the beam after each layer or surface has been traversed. As further described below, in example embodiments involving a multi-material layered stack formed by air, gases, vacuum, or other materials with substantially different indices of refraction (e.g. complex and/or real) between some or all of the intervening layers, multi-layer filamentation can occur, again, provided that sufficient energy and focusing conditions are employed. As noted above, the spacing of the filament arrays can be varied by changing the relative rate of translation between the beam and the work.

As noted above, the filamentation modification methods disclosed above enable rapid and low-damage singulation, dicing, scribing, cleaving, cutting, and facet treatment of transparent materials. In some embodiments, filament-based singulation may be performed on flat or curved materials, and thus may be employed in numerous manufacturing applications. The method generally applies to any transparent medium in which a filament may form via a burst of ultrafast laser pulses. The apparatus provided according to the embodiments disclosed below may provide a means for coordinated beam motion in multiple axes, for example, extending over and around curved surfaces, and with optional auto-focusing elements for programmable control (e.g. according to a pre-selected recipe) of the end product's characteristics, such as bend strength, edge roughness, electrical or optical efficiency, cost of production, and as-processed characteristics, such as edge shape and texture.

In some example implementations, for glass materials (including, for example, aluminosilicates, sodium silicates, doped dielectric oxides, and similar compounds or stoichiometries), singulation methods disclosed herein may be employed for dicing or cleaving of liquid crystal display (LCD), flat panel display (FPD), organic display (OLED), glass plates, multilayer thin glass plates, autoglass, tubing, display cover glasses, protective windows, safety glass, laminated structures, architectural glass, electro chromic and otherwise, biochips, optical sensors, planar lightwave circuits, optical fibers, laboratory, industrial and household glassware, and art work.

For semiconductor materials (such as silicon, III-V, and other semiconductor materials, particularly, those in thin wafer form), singulation methods disclosed herein may be employed for the processing of microelectronic chips, memory chips, sensor chips, light emitting diodes (LED), laser diodes (LD), vertical cavity surface emitting laser (VCSEL) and other optoelectronic devices.

In other example implementations, the filament methods disclosed herein may be employed for the dicing, cutting, drilling or scribing of transparent ceramics, polymers, transparent conductors (i.e. ITO), wide bandgap glasses and crystals (such as crystal quartz, diamond, sapphire).

The methods disclosed herein may also be extended to composite materials and assemblies in which at least one material component is transparent to the laser wavelength to facilitate such filamentation processing. Non-limiting examples include silica on silicon, silicon on glass, metal-coated glass panel display, printed circuit boards, microelectronic chips, electro chromic displays, mirrors, glasses, windows or transparent plates, optical circuits, multi-layer FPD or LCD, biochips, microfluidic devices, sensors, actuators, MEMs, micro Total Analysis Systems (μTAS), and multi-layered polymer packaging.

The filament's radial symmetry relative to the beam axis renders the material particular easy to cleave by follow-on methods such as, but not limited to, other laser processes, heating, cooling, gas jets, and other means of singulating the parts in a touch-free method, in order to provide a high break strength.

In one embodiment, another laser exposure, may be employed to trace the filament array line created by the first exposure. This can be accomplished with the laser employed for filament formation, or another more economical laser. In this way full singulation is affected on glass parts for which natural self-cleaving is either not desired or unrealized by the techniques wrought herein, due to thickness or material properties. The additional laser exposure may be pulsed or CW. The power level of the additional laser exposure may be approximately 10 W or more. The wavelength of the additional laser exposure may be longer than 532 nm. The relative translation speed of the additional laser exposure may be approximately 500 mm/s. The additional laser exposure may be delivered using static or dynamic (scanning) optics.

Products and materials formed according to the methods disclosed herein may exhibit unique electrical and light producing properties by virtue of process conditions and how the filaments have been made within them. For example, stronger parts (glass or sapphire) may be formed that exhibit resistance to failure (mechanical or electrical) and very low, but programmable edge roughness. The resistance to failure also extends to devices fabricated upon or within these parts thus singulated.

Figure 13A:
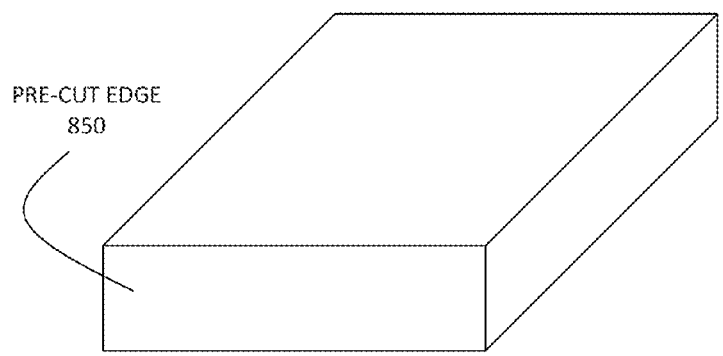
FIGS. 13(a) and (b) illustrates an example embodiment showing variable cut edge roughness by selection and control of the filament spacing.
Figure 13B:
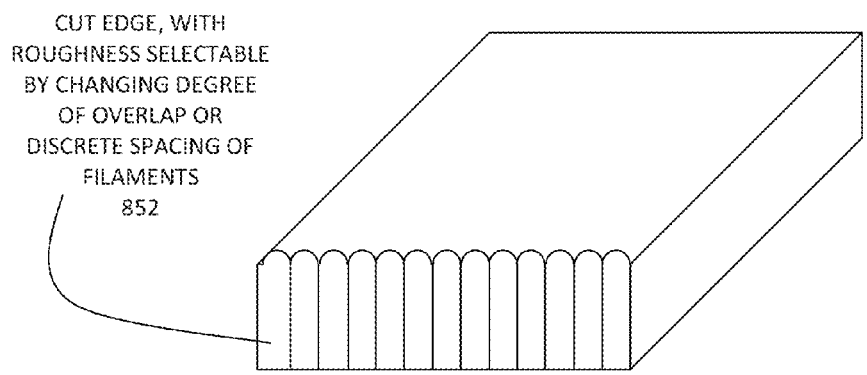

As shown in FIGS. 13(a) and (b), the degree of overlap of the filaments (or the discrete spacing of filaments) is user and recipe selectable, such that the edge roughness (850, 852) of the parts can be controlled on the micron scale. Such control over the edge roughness may be useful where the device performance is to be affected or controlled by singulation conditions. Accordingly, the presently disclosed methods and systems may be capable of producing new materials geometries and/or parts, thereby opening new avenues for manufacturing alternatives in segments such as the consumer product, aerospace, automotive and architectural segments.

Filamentation for Singulated Parts with High Break Strength

The preceding embodiments may be employed to produce substrates, with strong, damage free edges with break strengths exceeding those achievable via other laser processing methods. Such substrates may be used in a variety of applications such as, tablet PCs, handheld devices, mirrors, glass plates, semiconductors, film stacks, display lens arrays, electro-focusing arrays, electro chromic assemblies, displays, LCD and FPDs exhibiting chamfered, beveled, or bull nose edges.

Figure 14A:
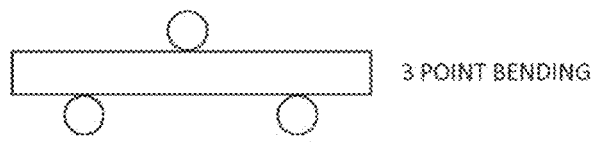
FIGS. 14(a)-(c) show the break strength testing protocol as described in ASTMC158 for determining the as processed break strength of the materials thus singulated.
Figure 14B:
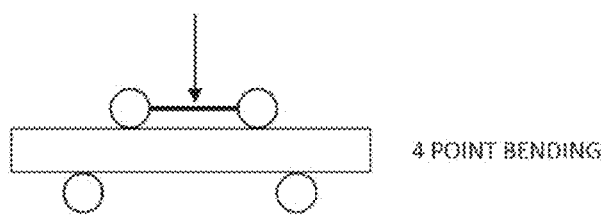
Figure 14C:
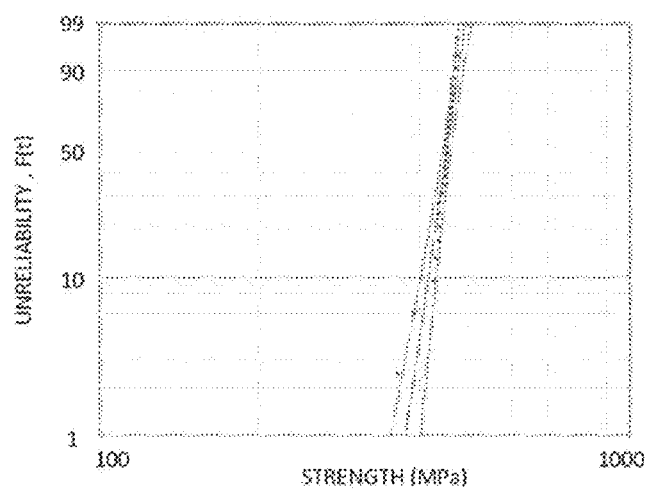

For example, it has been found that substrates processed according to the methods disclosed above, and subsequently singulated, may exhibit a break strength greater than 50 MPa. FIGS. 14(a)-(c) illustrate the break strength testing protocol as described in ASTMC158 for determining the as processed break strength of the materials thus singulated. FIGS. 14(a) and (b) show two example break strength measurement configurations, while FIG. 13(c) shows an example Weibull plot for determining the characteristic strength. The example method of reporting shown is the Weibull plot, which is designed to convey the statistical outcome of the material under test and to predict when and under what conditions it could fail.

In some embodiments, the methods disclosed herein may be employed to provide edge quality that is sufficiently high to support break strengths in excess of 100 MPa. For instance, as-singulated break test data for materials singulated according to the methods disclosed herein has demonstrated break strengths as high as 300 MPa in non-chemically strengthened glass. The break strength of the material and any product thus created can be positively influenced by judicious choice of process conditions. It is noted that while break strengths in excess of 100 MPa is desirable, such high break strengths have been unachievable using other methods without further processing.

Apparatus for Complex Spline Processing

In some embodiments, a system for forming a filament within a substrate according to the methods disclosed above may include a rotary stage and an automated gimbal mounted final objective (gamma axis, γ), coupled with coordinated Z position control, for rendering complex spline parts. Such an embodiment supports the creation of high bend strength parts at high yield and without need for further refinement or post processing.

Figure 15A:
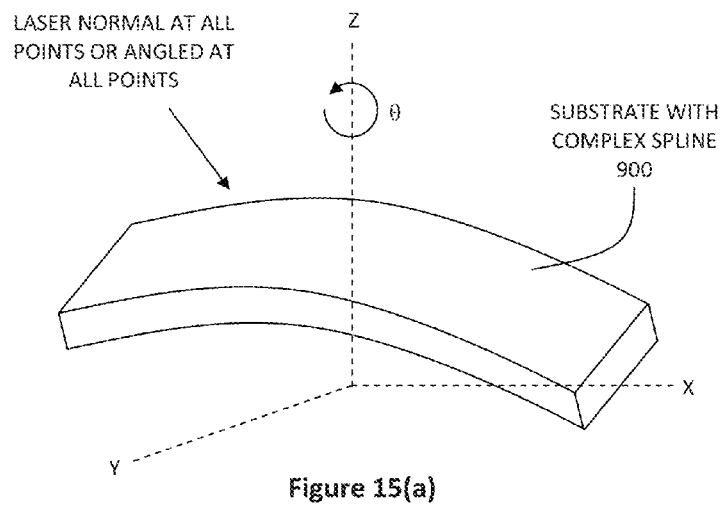
FIGS. 15(a)-(d) illustrate an example embodiment showing the formation of complex spline parts from curved targets by servoing the z and "steering the beam" via adaptive optics, which would also be servo'd. The beam (FIG. 15(a)) and/or part (FIG. 15(b, c)) can be rotated, tilted or otherwise manipulated to create a very wide process window and capability for producing parts with complex surface curvature.
Figure 15B:
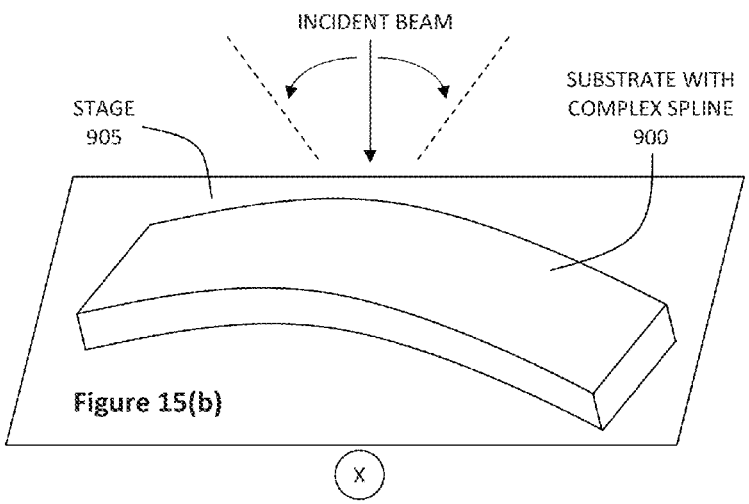
Figure 15C:
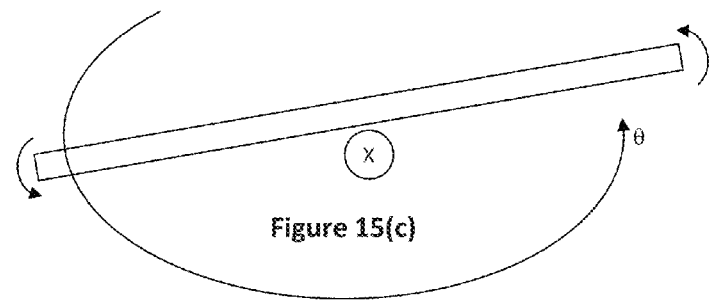
Figure 15D:
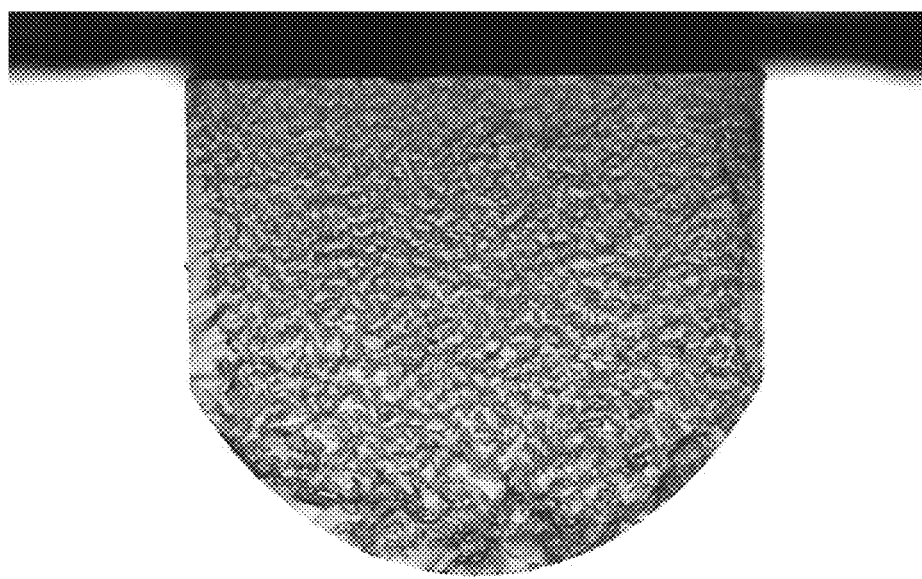

FIGS. 15(a) and (b) illustrate the processing of samples with a complex spline surface 900, from which parts may be cut of arbitrary shape with normal or non-normal beam incidence across the entire perimeter of the part shape as dictated by the desired characteristics of the part thus singulated (e.g. strength, conductivity, electrical efficiency of devices therein/thereon, etch resistance or efficacy, etc.). Coordinated motion in the theta and gamma axes with appropriate translation in the XY plane coupled with auto focus for constant objective lens spacing, can be employed to generate parts with user-selectable (over a reasonable range) properties depending upon the application of the part and its required/desired performance envelope. The optics (FIG. 15(a)) and/or the part being processed may be translated and/or rotated to achieve this capability. FIGS. 15(b) and (c) illustrate the translation and/or rotation of the part being processed via a stage 905. FIG. 15(d) provides an example implementation of such an embodiment, showing a glass part processed via filament formation to exhibit a rounded edge.

Processing of Multiple Layers

In other embodiments, multi-level filaments can be produced across several layers of glasses separated by transparent gas or other transparent materials, or in multiple layers of different transparent materials. The substrate may include two or more layers, wherein a location of a beam focus of the focused laser beam is selected to generate filament arrays within at least one of the two or more layers.

For example, the multilayer substrate may comprise multi-layer flat panel display glass, such as a liquid crystal display (LCD), flat panel display (FPD), and organic light emitting display (OLED). The substrate may also be selected from the group consisting of autoglass, tubing, windows, biochips, optical sensors, planar lightwave circuits, optical fibers, drinking glass ware, art glass, silicon, III-V semiconductors, microelectronic chips, memory chips, sensor chips, electro-optical lenses, flat displays, handheld computing devices requiring strong cover materials, light emitting diodes (LED), laser diodes (LD), and vertical cavity surface emitting laser (VCSEL).

Alternatively, the location of a beam focus of the focused laser beam may be first selected to generate filament arrays within a first layer of the two or more layers, and the method may further comprise the steps of: positioning a second beam focus to create an index change within a second layer of the two or more layers; irradiating the second layer and translating the substrate to produce a second array defining a second internally (internal to the stack, not the individual layers) scribed path for cleaving the substrate. The substrate may be irradiated from an opposite side relative to when irradiating the first layer. The substrate may be further illuminated from top and bottom or from multiple angles of incidence, either in concerted or subsequent process steps. Furthermore, prior to irradiating the second layer, a position of the second beam focus may be laterally translated relative a position of the beam focus when irradiating the first layer. A second focused laser beam may be used to irradiate the second layer. This beam can be supplied by the system from a single source or a second source. Multiple beams operating in concert can therefore process multiple substrates in parallel.

Figure 16A:
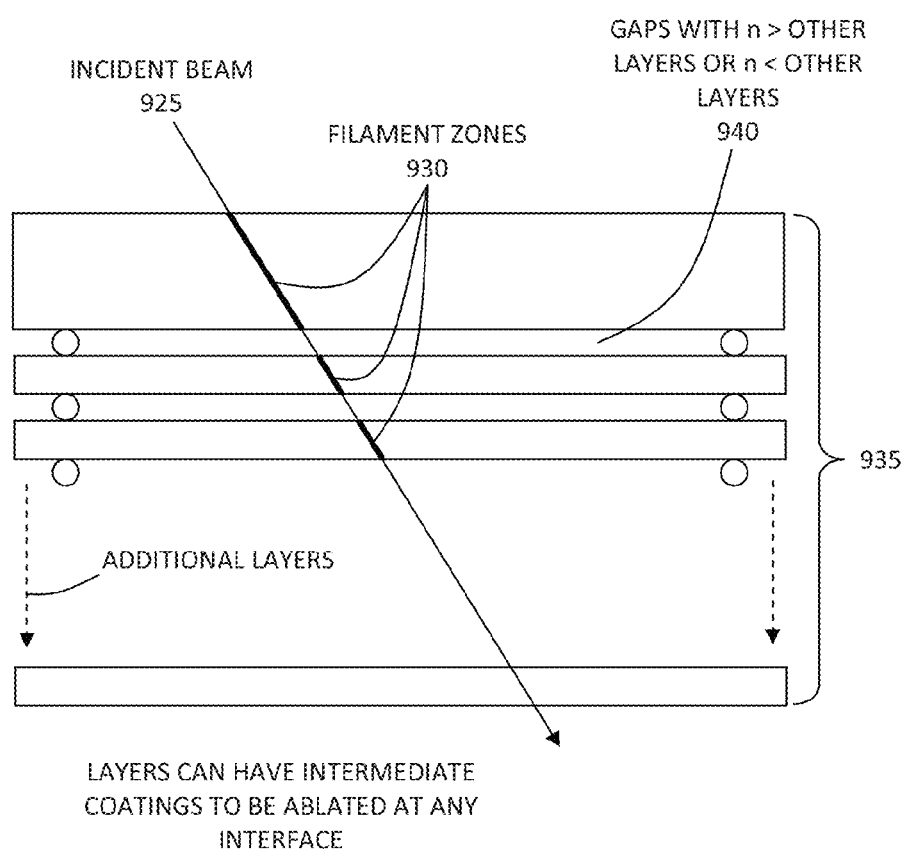
FIG. 16(a) illustrates an example embodiment in which a multilayer substrate can be cut or processed in a single pass, cutting at normal and/or non-normal angles.
Figure 16B:
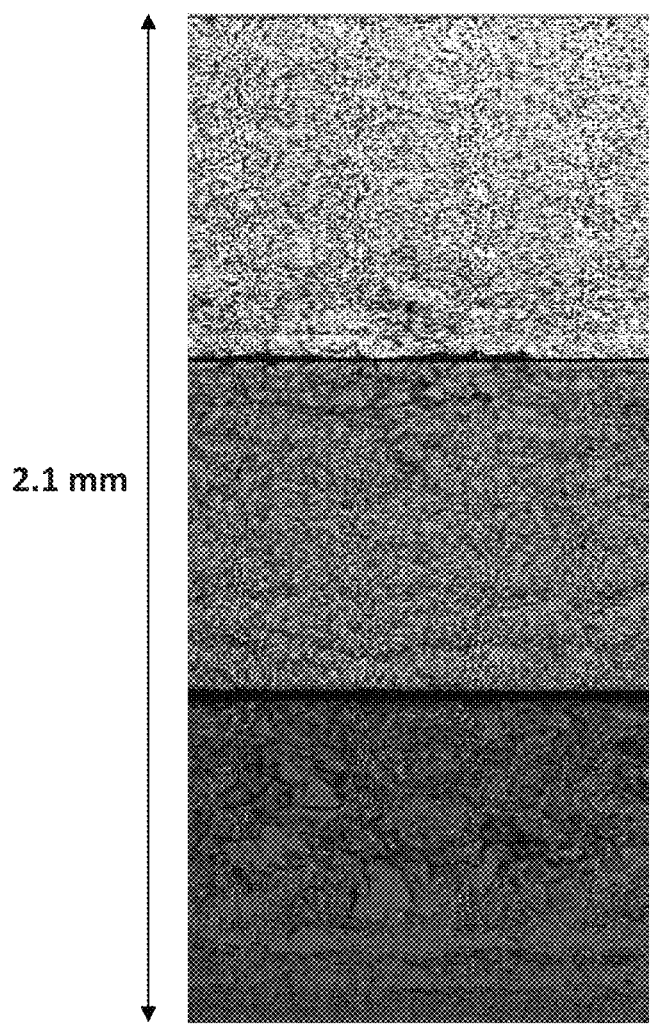
FIG. 16(b) illustrates the processing of a triple layer laminated glass substrate having a thickness of 2.1 mm.
Figure 16C:
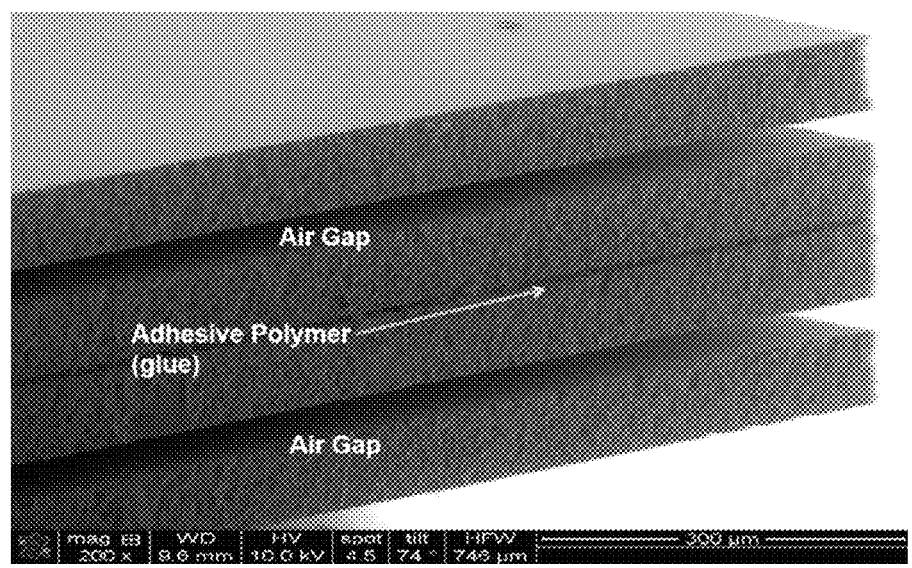
FIG. 16(c) shows an electron microscope image, post-cleavage, of a filament-processed multi-layer device including two air gaps an intermediate adhesive layer.
Figure 16D:
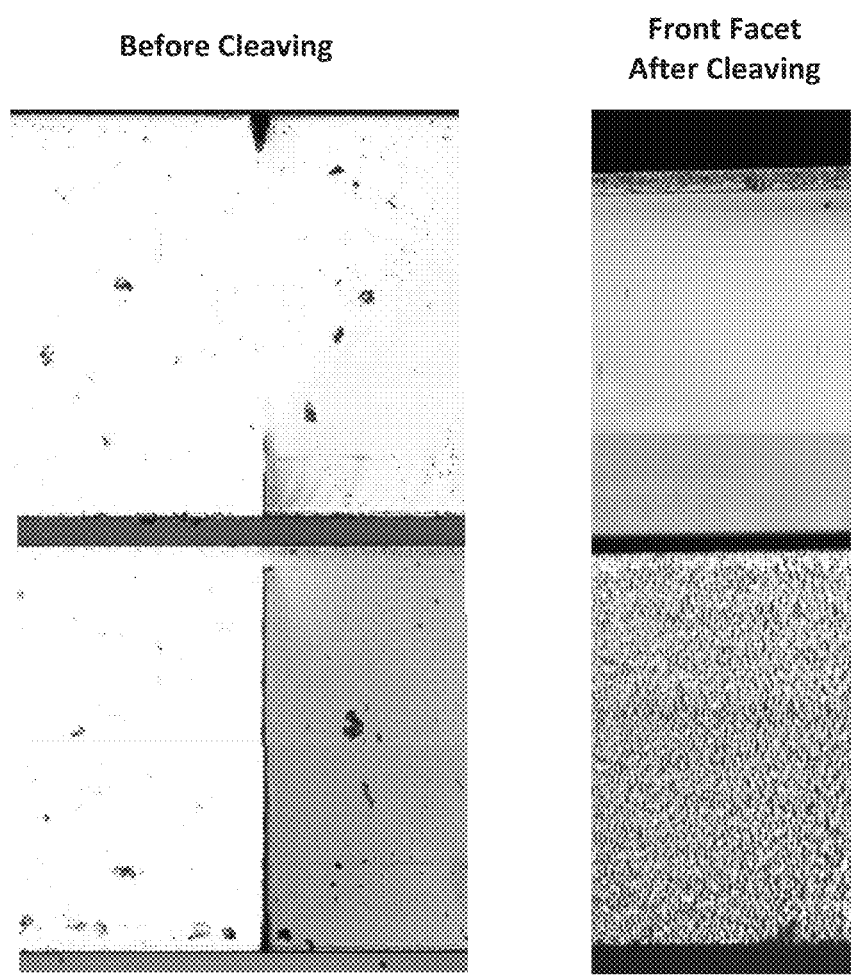
FIG. 16(d) shows microscope images of a laminated liquid crystal display substrate, in which the top surface is processed via a V-groove, and the bottom surface is processed via filament formation.
Figure 17A:
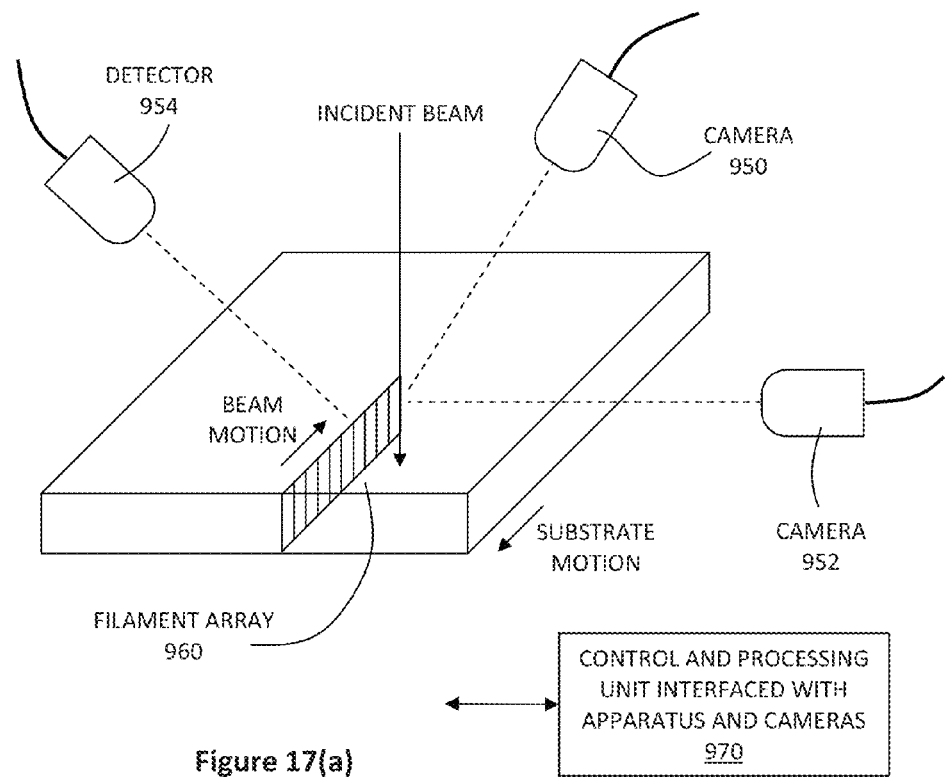
FIGS. 17(a)-(d) illustrates several example embodiments showing the use of an imaging device for process control, where output from the imaging device is processed to provide feedback. Output from the imaging device(s) is provided to a process control computing device.
Figure 17B:
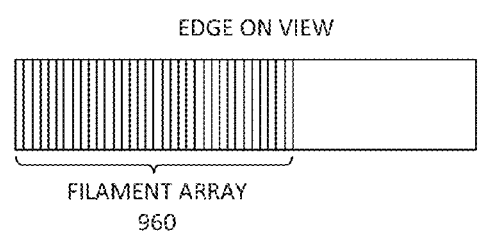
Figure 17C:
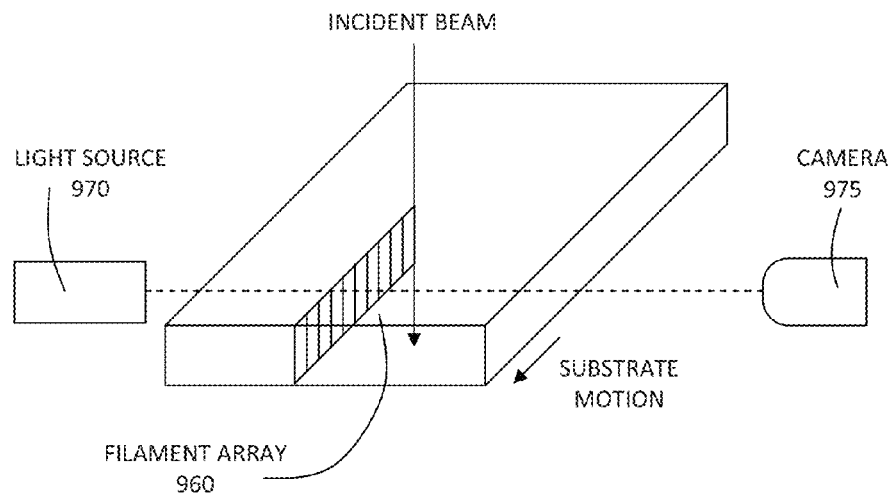
Figure 17D:
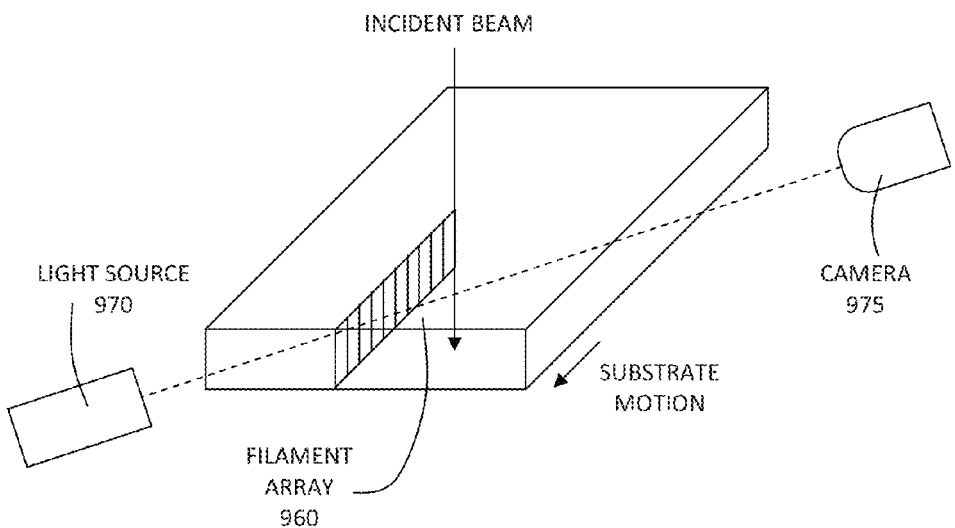

FIG. 16(a) illustrates how substrates having multiple stacks of materials 935 (optionally with gaps 940 having larger or smaller refractive index n) can be singulated by the formation of filament zones 930 within, at an arbitrary angle of incidence by a tipped part or tipped beam 925—tipped meaning non-normal incidence—or both, to render singulation of complex stacks. In addition, conditions may be chosen to affect ablation at intermediate and terminal interfaces of the part and its components. This is primarily adjusted by controlling the onset of filament formation, typically a set distance from the final objective lens, to coincide with the z position of the target layer wherein filament formation is desired. By adjusting the z height of the part or optic, a high degree of control can be afforded the user in determining where the filament first forms.

FIG. 16(*b*) shows an example implementation of such an embodiment, in which a triple layer laminated glass substrate having a thickness of 2.1 mm was processed via filament formation in a single pass at a speed of 0.5 m/s. FIG. 16(*c*) shows an electron microscope image, post-cleavage, of a filament-processed multi-layer device including two air gaps and, an intermediate adhesive layer.

In some embodiments, by controlling the laser exposure to only form filaments in the solid transparent layers, one can avoid ablation and debris generation on each of the surfaces in the single or multi-layer plates. This offers significant advantages in manufacturing, for example, where thick glasses or delicate multilayer transparent plates must be cleaved with smooth and crack free facets.

For example, FIG. 16(*d*) shows microscope images illustrating an example implementation of the cleavage of a laminated liquid crystal display substrate using a hybrid processing method, in which the top surface is processed via a V-groove, and the bottom surface is processed via filament formation.

Monitoring

In one embodiment, an example apparatus for performing the aforementioned methods includes vision and alignment capability, utilizing variable wavelengths, which may be user selectable for contrast, for edge location, wafer mapping and metrology both pre- and post-laser processing. In one example implementation, standard machine vision components for image acquisition and analysis are sufficient to accomplish this task and coupling this with an alignment algorithm provides the needed level of control. A voice coil or similar implement may be provided and used to drive the optic or part in the z direction, and linear motors may be used for XY positioning. The motors may be equipped with 0.1-10 μm precision and accuracy in the encoder signals.

In the case of LED wafers, for example, the wafers are not flat. At the loading station, the wafers can be picked up and then pre-mapped to calculate sample curvature or other distortions induced by dicing tape, DAF (die attach film) or mounting. The pre-mapping is typically completed by optical scanning of a beam or a light source across the work piece, where the reflected light is interrogated to measure the distance between the work and the camera. For example, such an embodiment could be implemented as a confocal system. A confocal or similar fast auto focus mechanism may be sufficient to provide accurate street location and die corner edge location relative to LED wafer notch or flat. The z position would be selected to coincide with the desired focus position, plus or minus the wafer curvature offset, as a function of XY and theta positions. This pre-mapped data could then be loaded into the system control computer, and used to drive the real-time auto-focus system in Z with a servo coordinated signal. Such a system could enable autofocus control of approximately +/−50 nm in the position of the geometric focus relative to the surface of the part or stage, while translating the sample relative to the optical beam at high linear speeds (such as up to 1.5 m/s).

In one example implementation, this functionality could be accomplished with a force frame-metrology frame configuration, where the reactive forces are damped into non-coupled machine components rendering the optical frame unperturbed from the induced vibrations.

In some embodiments, the vision system is able to measure the characteristics and/or dimensions of the filaments to track part file fidelity, producing an alert, report, or other notification when a measurement is not within a prescribed range. As noted above, the system may be equipped with a vision system that tracks the filament formation in cross-section.

In some embodiments, electronics capable of fast feedback (e.g. sampling rates >1 KHz) may be employed to measure one or more process parameters associated with filament formation in real-time. One example implementation is shown in FIG. 17(*a*). Any or all of the monitoring components may be configured (translated or otherwise varied in position of angle) to track the location of filament formation. For example, with example implementation shown in FIG. 17(*a*), the two cameras (imaging devices) and one detector are arranged to measure and monitor the size, depth and spacing of the filaments. Camera or detector 950 is positioned to detect optical radiation emitted during the filament formation process, where signals associated with the detected optical radiation can be processed for metrology. Camera 952 is positioned to monitor the depth and/or size of the filaments 960 as they are formed, through an edge of the transparent material being processed. Detector 954 (which may be an imaging device or a camera) is positioned to measure the width of the filament array (FIG. 17(*b*) illustrates an example image of filament array 960 obtained by this camera).

Any of the measured properties or parameters may be provided to a control and processing system 970 in order to verify process quality and/or to provide feedback measures for actively controlling the process. For example, the measured properties or parameters may be compared with predetermined values stored in the control system. The control and processing system 970 may be a computer or computing device equipped with a processor that is programmed to control the filament formation process (see FIG. 7(*b*)).

Figure 19:
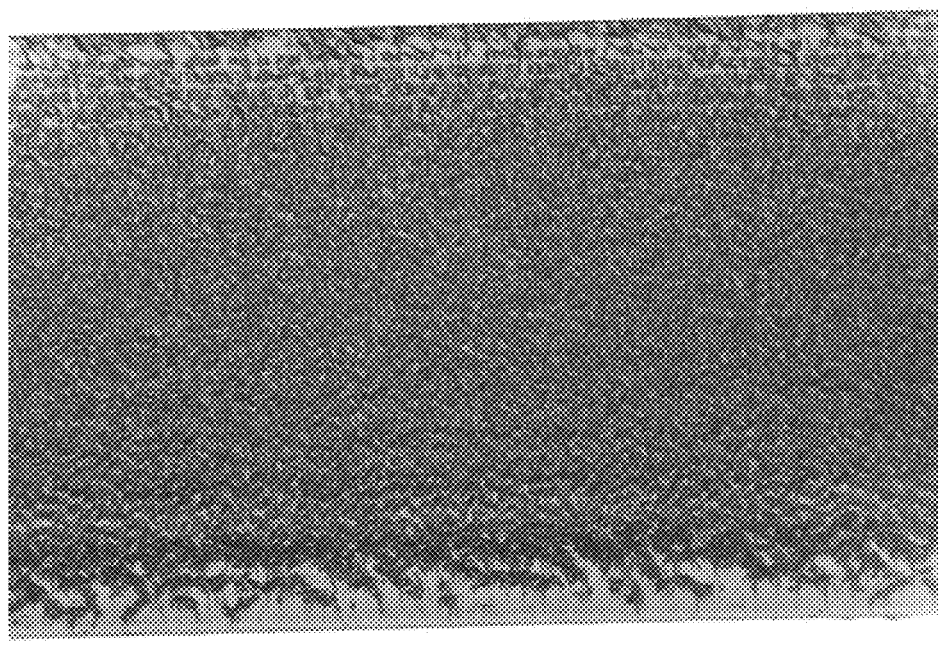
FIG. 19 shows a micrograph of a facet edge of a glass substrate after filament processing and singulation.

In one example implementation, the output from one or more imaging devices is processed to identify the filament end point and position in order to provide feedback to a z-servo for monitoring of the depth of the filament. Such an embodiment may be beneficial when it is desirable to ensure that the filament stops inside a material (e.g. LED dicing). As shown in FIG. 19, additional imaging devices may be included for providing metrology data associated with the shape and/or position fidelity.

As shown in FIGS. 17(*c*) and 17(*d*), a light source 970, such as an infrared light source, may be employed to generate an optical sampling beam that passes through one or more filaments and is subsequently detected by a detector/camera 975. FIG. 19(*c*) illustrates an example of in-plane monitoring embodiment, while FIG. 19(*d*) illustrates an example of an angled out-of-plane monitoring embodiment.

The preceding embodiments may be particularly useful for example applications involving the singulation of LED wafers with DBR (distributed Bragg reflector) and GaN structures. There is substantial advantage in being able to create a cleavage plane within a substrate and control the depth to which this feature persists. In the case of LEDs with GaN layers, the GaN is disturbed by the presence of ablative processes at the interface between substrate and GaN adhesion layers. The present method enables not only a way to control this depth to within approximately <10 µm of the z position, but also the ability to rapidly diverge the laser beam after the filament formation event. This means the material immediately below the filament zone is less affected (optically, mechanically, thermally and vibrationally) than a conventional laser process. The filament produces more gentle internal effects by being a very short duration process with high divergence at the filament terminus.

As noted above, in order to further enhance the metrology and monitoring capability of the laser system, white light emitted with forming the filaments (generated by non-linear processes) can be monitored for intensity and/or spectral changes indicating changes in the substrate. In general, any one or more of the size, position, pattern fidelity and depth of the filament, as well as chemical and physical properties of the target material, can be monitored and optionally employed for active feedback loops for controlling the system.

In some embodiments, any one of the vision, alignment and metrology systems can be located above and/or below the target substrate and can be utilized to direct the focusing optics via servo controlled actuators to a predetermined position relative to the target layer in the target stack. This target layer can be one or more layers thick and can be transparent or opaque to the incident laser wavelength, provided that at least one layer is sufficiently transparent to support the creation of filaments.

Ablation and Aligning Semiconductor Devices Via Filament Formation

In other example implementations, the methods and apparatus disclosed above may be employed to produce ablative markings in the first incident layers (the layer that first encounters the laser radiation) deposited upon a substantially transparent substrate, in order to aid in the subsequent relative location and alignment of the substrate during further processing, such as for assisting in the relative positioning of devices created on or within the substrate during the processing of a semiconductor device.

For example, it is well known that the opaque layers of an LED wafer can be difficult to align during processing. Past efforts have employed infrared cameras to locate the alignment marks or fiducials and then register these to the laser coordinate system. New wafer morphologies make this much more difficult to achieve, as the metal layers are becoming sufficiently thick to block the infrared signal and thus prevent alignment.

Accordingly, in selected embodiments, in applications in which conventional vision configurations are not practical due to the presence of thick metal layers (with a thickness such that IR viewing is ineffective), the preceding embodiments may be employed to provide a means of locating the structures of interest, such as streets between neighboring dice on a semiconductor wafer that are to be singulated.

Accordingly, in order to produce alignment markings through metal layers residing within or on a transparent substrate (such as a laser die), the following example embodiments may be employed. In particular, the processes described herein may be adapted to produce ablation through a metal layer (instead of the formation of a filament, or in addition to the formation of a filament), by changing the laser power and increasing the number of pulses in a burst. In some embodiments, a metal may be ablated according to the aforementioned filament processing methods and conditions with metal layers less than approximately 50 µm thick on transparent substrates. It has been found that the first few pulses in the burst ablate the metal, and then the pulses in the burst proceed to form a filament.

In some embodiments and applications, it may be beneficial and/or desirable to process material having a metal layer such that the metal is locally ablated without forming a filament adjacent to the metal layer. This may be preferable, for example, in applications in which the presence of the filament would damage a semiconductor layer (e.g. a GaN layer of an LED wafer) in the immediate vicinity of the metal layer. This may be achieved by avoiding the required energy density for filament formation, while maintaining sufficient energy to cleanly ablate the metal. For example, it has been found that a laser power of approximately 5 W, and with 20 pulses in a burst at 1064 nm, is suitable for ablating thin metal layers without forming a filament.

It will be understood that the preceding embodiments may be adapted to perform ablation of any metal layer at any surface on or within the transparent material. For example, the metal layer may reside on an external surface of the transparent material, or at an internal surface within the transparent material. Furthermore, in some embodiments, two or more metal layers may be ablated, in parallel or in series, according to the preceding embodiments.

Figure 18A:
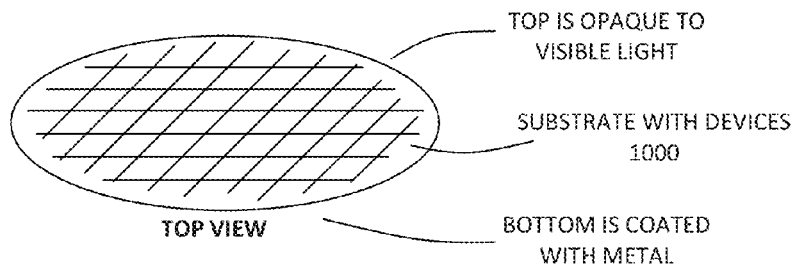
FIGS. 18(a)-(c) illustrate a method of processing a semiconductor substrate having an array of devices formed therein by processing the back portion of the substrate to produce ablating markings, and subsequently using the ablative markings as fiducial reference points when performing filament processing from above the substrate.
Figure 18B:
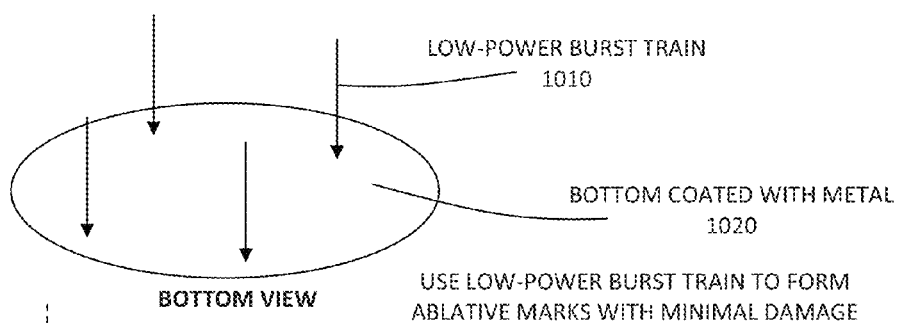
Figure 18C:
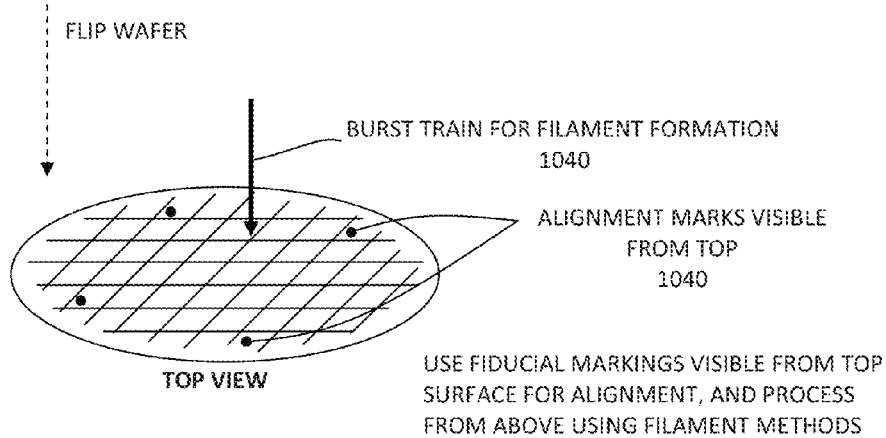

In one example embodiment, illustrated in FIGS. 18(a)-(c), a semiconductor wafer is having an array of devices formed thereon, and having a metallization layer beneath active device layers (e.g. on a bottom surface of the wafer), is processed according to such a method. Substrate/wafer 1000 is shown from a top view in FIG. 18(a), illustrating the array of devices. As shown in FIG. 18(b), the bottom surface of the device includes at least one metal layer 1020. Alignment marks are made ablatively through the metal layer(s), based on irradiation from the back surface of the substrate using a lower power burst train 1010, as described above. These alignments marks are spatially registered relative to a reference frame. The alignment/fiducial marks 1030 may subsequently utilized when processing the sample from above with a burst train 1040 suitable for filament formation (for example, the sample may be flipped over and processing may be conducted utilizing the ablative marks as fiducial marks). Accordingly, the present methods may be advantageous in avoiding limitations imposed by advanced LED substrates containing thicker metal layers that serve as heat sinks and/or reflectors.

Figure 18D:
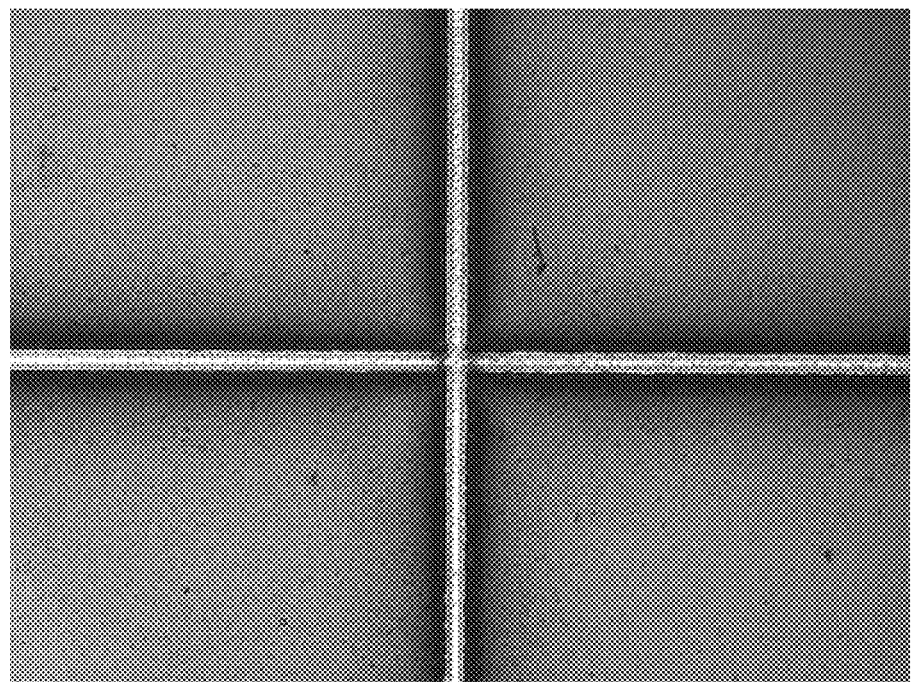
FIG. 18(d) is an overhead image of a LED wafer processed according to this method, in which burst laser pulses were employed to process all layers, including the metal layer (low power marking), the DBR layer, the PSS layer, and the sapphire and GaN layers.

FIG. 18(d) is an overhead image of a LED wafer processed according to this method, in which burst laser pulses were employed to process all layers, including the metal layer (low power marking), the DBR layer, the PSS layer, and the sapphire and GaN layers.

The flexibility of this approach is apparent in the ability of the user to employ filament formation in transparent materials through metalizations on both the semiconductor (e.g. GaN) side and the reflector side of the LED device wafer. The scribing can be applied without damage to the surrounding devices or delamination of the semiconductor layer (GaN) from the sapphire substrate. The process can be applied to both sides to effect singulation from either side, depending upon the limitations inherent in the device design or its presentation.

Figure 18E:
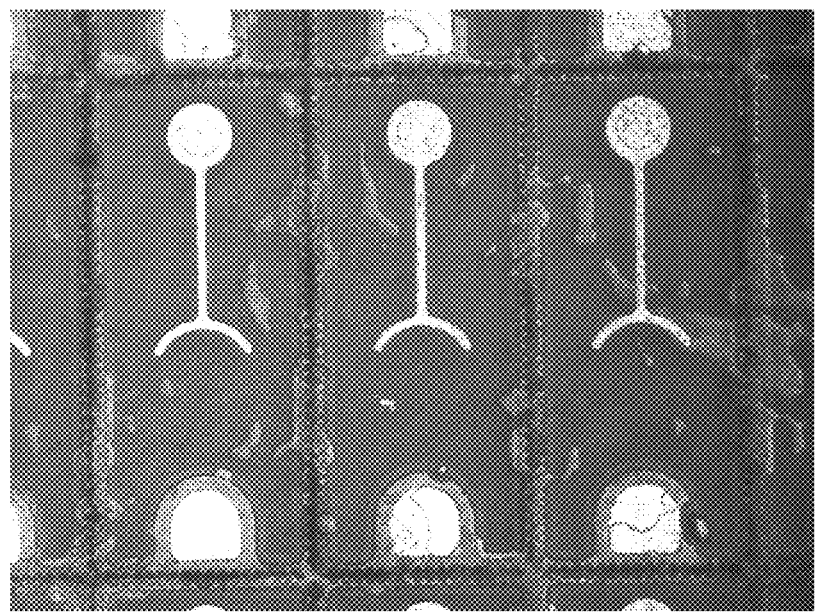
FIG. 18(e) and (f) show the post-processed substrates with intact dicing tape, and FIGS. 18(g) and (h) show the processed substrates after the removal of the dicing tape.
Figure 18F:
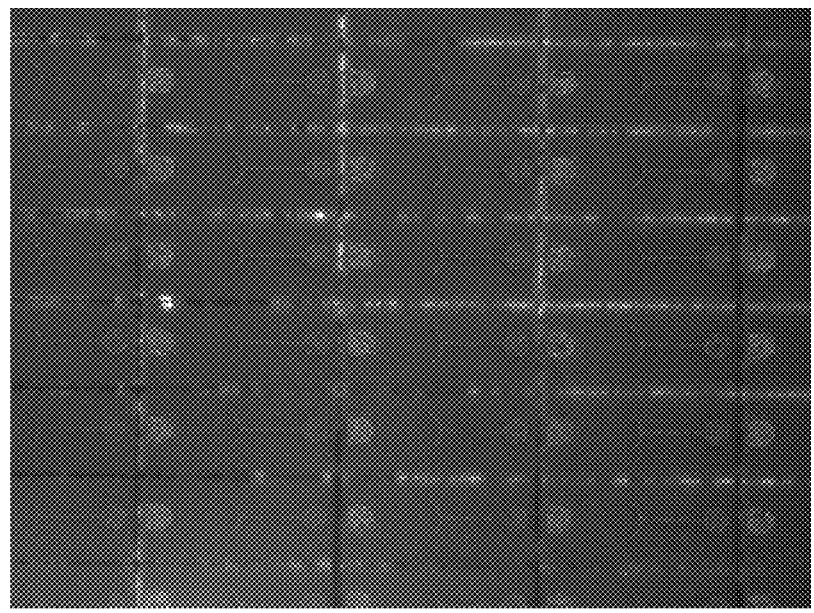
Figure 18G:
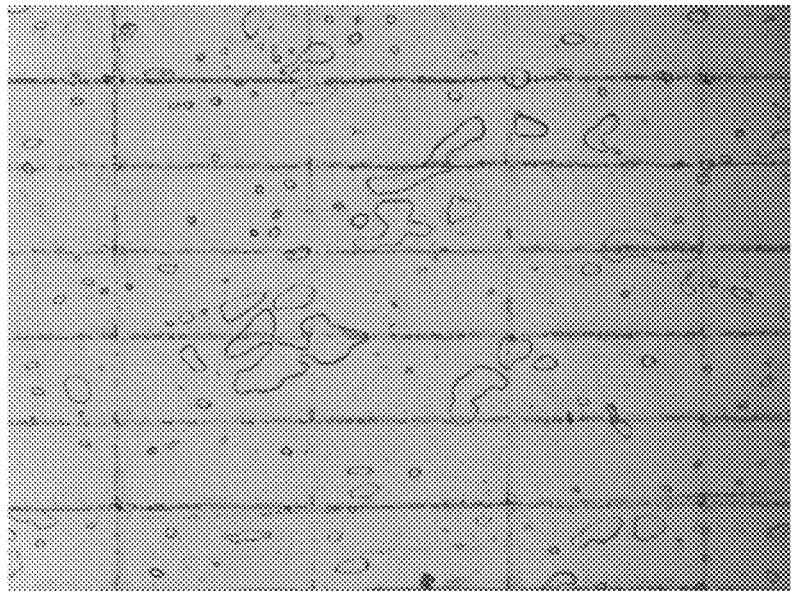
Figure 18H:
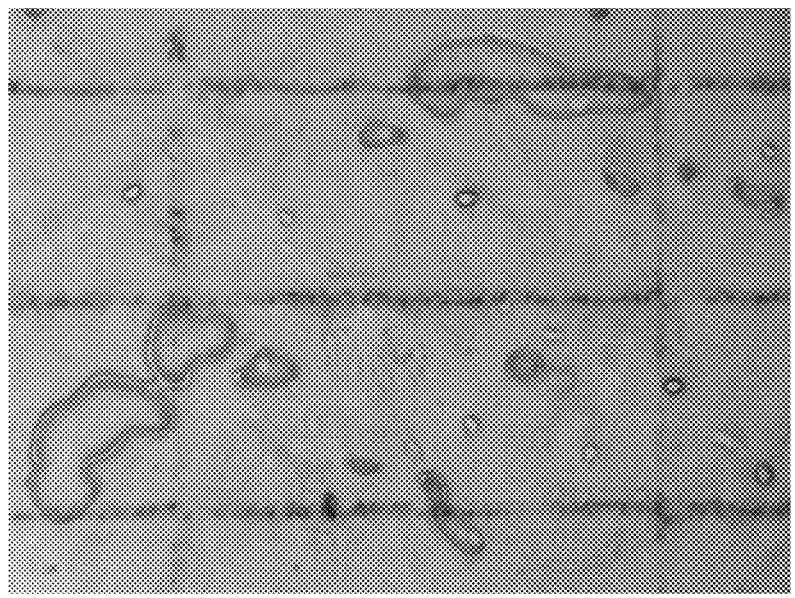

The processing according to the present embodiment may be performed without causing damage to the dicing tape, regardless of which direction is employed during singulation. In particular, the dicing tape may be spared damage because of the very large divergence angle of the beam and its lower power after passing through the substrate. This is shown, for example, in FIGS. 18(e) and (f), which show the post-processed substrates with intact dicing tape. FIGS. 18(g) and (h) show the processed substrates after the removal of the dicing tape. It is noted that the minor residual tape marking can be removed, for example, with a cotton swab or other suitable cleaning instrument.

The presently contemplated embodiments would, in some example implementations, employ conventional optical cameras for alignment, dispensing with the need for expensive vision systems.

Unlike other processing methods, the rapid dissipation of the filament, whereby the laser beam experiences high divergence after the filament formation is quenched, that leads to application of this laser process to an LED processing station equipped with an auto focus mechanism with a high degree of z precision, for example ~0.01 µm to singulate the dice without inducing damage to GaN or DBR (distributed Bragg reflector) layers. It is to be understood that the processing of specific layers can be selected by modulating the beam power and choosing the appropriate optical focusing conditions to produce external pre and/or post material foci (beam waists), without the formation of an external plasma channel, for "dumping" unwanted power.

The flexibility in this approach also allows for the creation of alignment marks in any incident surface within the target material or stack that is accessible from either side of the device, thus enabling fully-aligned singulation of even the most advanced LED stacks now appearing in development laboratories, where the layers and their composition render traditional alignment and singulation techniques completely incompatible and ineffective.

The alignment marks may be created using filament and/or ablative techniques—ablative techniques for marks "on" a surface and filaments techniques for marks desired "within" a material, depending upon the materials present near the surface being marked or the material in which the mark is being made. Metal on dielectric, for instance will render both types of marks available for inspection and location by the vision system.

EXAMPLES

The following examples are presented to enable those skilled in the art to understand and to practice the present disclosure. They should not be considered as a limitation on the scope of the embodiments provided herein, but merely as being illustrative and representative thereof.

Example 1

Singulation of Glass Samples Via Laser Filamentation

To demonstrate some of the embodiments disclosed above, glass samples were processed on a laser system equipped with a 50 W ps laser operating at high rep rate (>400 kHz) to facilitate very rapid scans of the laser beam across the target, with stages moving at a rate of approximately 500 mm/s-1000 mm/s, where 0.7 mm thick Gorilla glass had been mounted. The laser, operating at the fundamental, 1064 nm with a pulse width less than 25 ps, was set to operate in burst mode with 20 sub-pulses in a burst.

Figure 20:
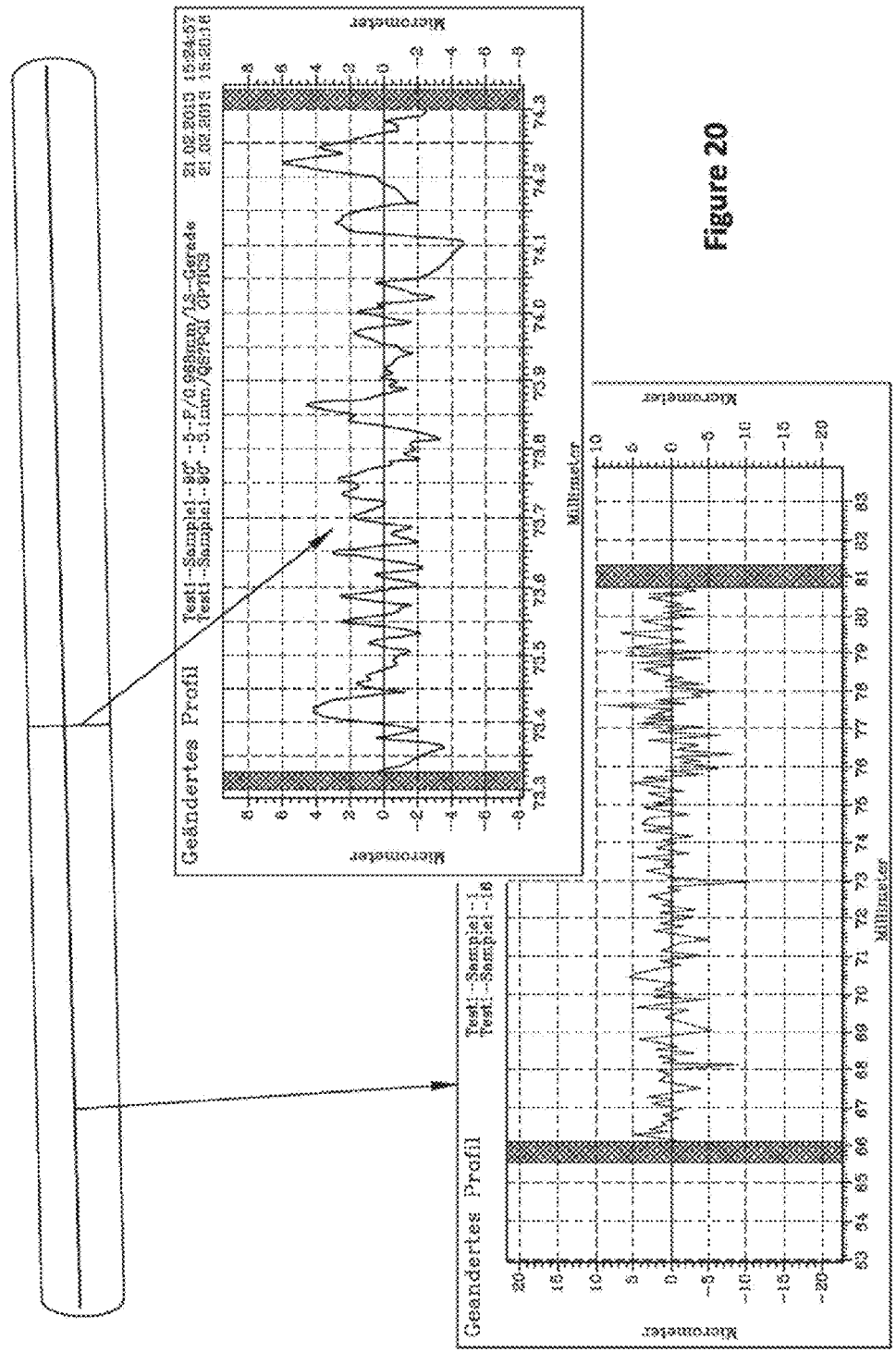
FIG. 20 shows post-singulation surface roughness measurements of an example substrate in orthogonal directions.

Both rectilinear cuts and curvilinear shapes have been achieved at high speed with very good edge quality and high bend strength. For example, samples of Gorilla thus processed have shown >110 MPa as-cut bend strength. FIG. 19 shows a micrograph of the facet edge after formation of the modified zone (the so-called scribe step) and the cleave step (singulation). The roughness shown is less than 10 µm RMS over a substantial portion of the surface. FIG. 20 shows post-singulation surface roughness measurements of an example substrate in orthogonal directions.

Figure 21:
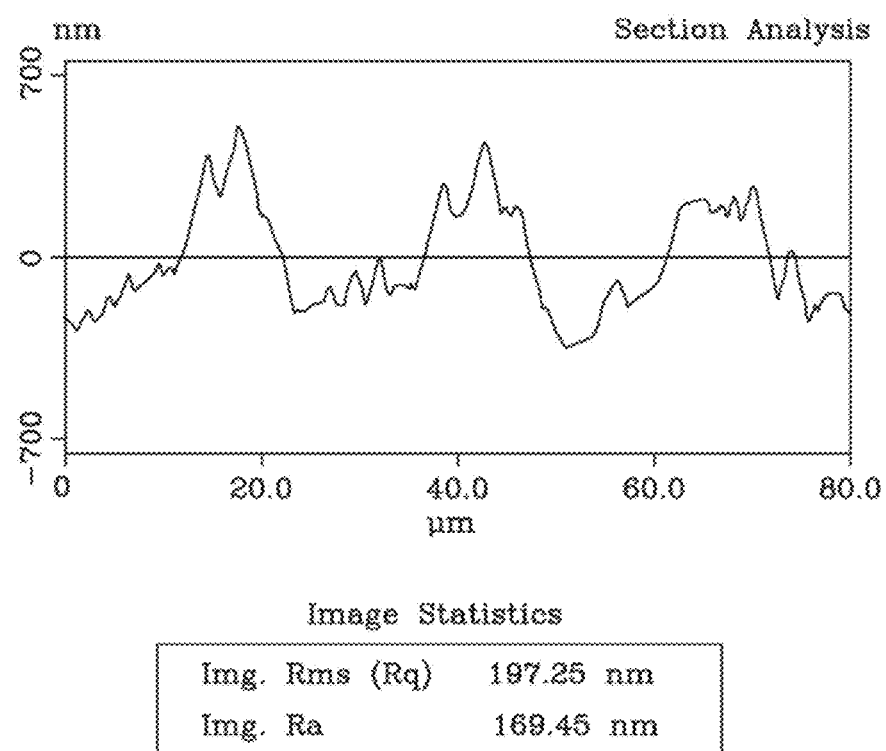
FIG. 21 shows measurements of surface roughness obtained of a post-singulated sapphire sample, with measured values as low as approximately 200 nm RMS.

In another example, radius corner and faceted edge parts have been created in sapphire having a thickness of 0.4 mm, with roughness even better roughness with measured values as low as approximately 200 nm RMS, as shown in FIG. 21.

The stage motion of the system was coordinated with the laser pulse and trigger signals such that the relative motion laser and the part is synchronized so that the part is never waiting for the laser or stages to catch up. The velocity of the beam relative to the material was thus maintained at a constant value, even when producing filament arrays on curved portions, such as around the corners. This was achieved by controlling the relative motion of the beam and the material based on data from a spline file (the spline file was read into the computer from the Adobe illustrator file). The constant velocity maintains a constant relative spacing between filaments, thereby producing consistent filament formation and interface quality after singulation at all locations. It is to be understood that this embodiment may be applied to any method of laser processing, and is not limited to the aforementioned embodiments involving processing via laser filamentation.

The burst characteristics were empirical selected based on the materials to be tested. It was empirically found that improved singulation results were obtained when the filament length extended more than approximately 10% of the substrate thickness. This was found to be especially true for thick, soft glass and for substrates containing sensitive electrical devices, such as LED wafers. Softer glasses, like borosilicate and soda lime, may benefit from much longer filaments, maybe up to 75% of the sample thickness in order to produce cleavage with consistent and high material quality, including edge roughness with minimal chipping.

These results illustrate that the nature of the filament can be readily manipulated by varying the pulsed nature of the laser exposure. In other words, in addition to the parameters of energy, wavelength, and beam focusing conditions (i.e. numerical aperture, focal position in sample), pulse parameters can be tailored to obtain a desired filament profile. In particular, number of pulses in a pulse burst and the delay time between successive pulses can be varied to control the form of the filaments produced. As noted above, in one embodiment, filaments are produced by providing a burst of pulses for generating each filament, where each burst comprises a series of pulses provided with a relative delay that is less than the timescale for the relaxation of all the material modification dynamics.

In the industrial application of single sheet glass scribing, flat panel glass scribing, silicon and/or sapphire wafer scribing, there is a demand for higher scribing speeds using laser systems with proven reliability. To demonstrate such an embodiment, experiments were performed using a high repetition rate commercial ultrafast laser system having a pulse duration in the picosecond range.

In some experimental investigations, mobile phone glass displays and tablet cover glasses have been singulated according to the methods disclosed herein. Eagle 2000 or variable thickness and Gorilla glass pre and post ion exchange have been singulated from large mother sheets and smaller phone-sized units, with great flexibility and speed. The inclusion of faceted edges and complex spline shapes represents a substantial extension of the state of the art in brittle material singulation. Use of the regenerative amplifier-based platform has produced the best results to date, in both femtosecond and picosecond pulse regimes.

In some experiments, the polarization of the incident beam was modified, in addition to its temporal and spatial characteristics. Manipulation of these parameters has generated a parameter space which drives machine design in subsequent production-ready systems. For example, polarization delivers the process flexibility as a servo'd and coordinated polarizer can be rotated to improve or optimize angle cutting through substantially thick substrates. For example, such control over the polarization state of the beam may be useful for creating beveled glass parts, with interior and exterior lines. Parts that require rounded corners and or rotation of the laser beam delivery system (translation at least if not rotation) may be processed according to such a method, as the processing of such parts involves a beam incidence angle that changes as the part and laser move relative to one another, which in turn affects the filament formation efficacy. Accordingly, the polarization state of the incident beam relative to the surface of the material may be controlled as the angle of incidence of the beam is varied during processing. This may be achieved, for example, using an automated beam delivery system (as described herein) in which the polarization state is controlled during processing in addition to, and in association with, the beam position and orientation.

Example parts have been generated across a wide range of glass thickness ranging from 0.3 to 3.2 mm or even broader ranges of thicknesses, from 0.1 to 8 mm. Glass parts were generated with translation speeds of 500 mm/s and greater. Sapphire materials were generated with translation velocities of 500 mm/s. The speed of formation of modified zones takes advantage of the machine's characteristic high speed stages and the ability of the parts to change direction quickly, but in a smooth and consistent manner, thereby producing edges that are faithful reproductions of the part files. Electrochromic windows are a suitable example application for the present system. An example of such an embodiment is the processing of aerospace glass. Singulated parts exhibit curves and precise edges, and are effectively ready for assembly, immediately post singulation.

The flexibility of the present approach is highlighted by the wide array of parts that can be fabricated, each with a different part presentation scheme. Part of this flexibility stems from the use of an adjustable optical train capable of quickly moving the focus and the spatial distribution of the beam in response to process needs. The production of substantially or effectively lossless singulation with low roughness edges, coupled with the flexibility demonstrated herein, offers commercial opportunities for this technology in display and general brittle materials singulation markets where high yield, high strength parts are required with less than 30 µm RMS edge roughness parts are required at high speed, and lower cost of ownership than any competitive technology.

Example 2

Formation of 6 mm Long Filaments in Glass Substrates

In one example implementation, the laser beam may include a burst of pulses having a pulse duration less than approximately 500 ps, which is collimated and focused to a spot outside of the target (for example, with a waist greater than approximately 1 µm and less than approximately 100 µm. Without intending to be limited by theory, and as noted above, it is believed that the non-linear interactions that result in filament formation cause a series of acoustic compressions within the material. These acoustic compressions are understood to be substantially symmetric about the beam axis. The longitudinal length of this zone is determined by a number of pulse and beam parameters, including the position of the focus, the laser power and the pulse energy, as described above.

For example, using a 50 W laser with a burst train of pulses each having a pulsewidth of approximately 10 ps, with a 2 MHz rep rate, for example, filaments with a length in excess of 10 mm can be created within glass materials. Such filaments can be formed such that they are not divergent, are continuous, and exhibit a substantially constant diameter from the top surface of the material to the bottom surface of the material.

In particular, such structures have been observed to possess a small and narrow diameter (e.g. approximately 3 µm) tube beginning on the top surface and continuing in a smooth and uniform way (with an interior RMS surface roughness less than approximately 10 µm), out the bottom of the target layer or stack, such that the exit diameter is also on the order of approximately 3 µm (in the present example). Such filaments have controllable properties, both in terms of their properties and the effects on the material in which they are formed. One example of a parameter for controlling the filaments is the speed of translation of the beam across the work (or the translation of the work relative to the beam).

One important differentiator between the present methods and all previously known methods is the rate at which these filaments and therefore scribe/cleave/dicing arrays can be created. In the present example, 6 mm filaments can be created at approximately 600 mm/s. This morphology, rate and post scribe material integrity is unprecedented in the history of laser processing.

Example 3

Filament Formation Using 1064 nm Pulsed Laser

In one example implementation of the methods, apparatus and systems disclosed herein, a laser configured to output bursts of picosecond pulses as described is admitted to an optical train with a collimator and steering optics, optionally a scanner with a field corrected region capable of delivering at user selectable angles, a beam with optics designed to induce aberrated wavefronts which can be focused via negative or positive lenses such that the interaction zone exceeds the depth of the target layer to be scribed. In one example implementation, bursts of picosecond pulses emitted at 5 MHz from a 50 W 1064 nm laser is focused by a series of lenses to create a 5 µm spot at focus outside the material using a doublet or triplet of lenses where the ratio, W, of focal lengths lies between −20 and +20 ($L1_{fl}/L2_{fl}=W$), depending upon the target substrate and the intended final result (full cut, scribe and break, etc.) as the length of the interaction zone will determine the characteristics of the parts as processed. As noted above, in some embodiments, a ratio of lens focal lengths-of up to approximately −300 to 300 may be employed.

The specific embodiments described above have been shown by way of example, and it should be understood that these embodiments might be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A method of laser processing a transparent material, said transparent material being transparent to the wavelength of said laser, comprising the steps of:
   providing a laser beam, said laser beam includes a burst of laser pulses, said burst is defined as a single laser pulse or multiple laser pulses;
   externally focusing said laser beam relative to said transparent material to form a beam waist at a location that is external to said transparent material while avoiding the formation of an external plasma channel; and,
   said laser pulses are focused such that a sufficient energy density is maintained within said transparent material to form a continuous laser filament therein without causing optical breakdown of said transparent material.

2. The method according to claim 1 the method further comprising the step of:
   said laser beam is focused though one or more aberrated optical elements.

3. The method according to claim 2 wherein said one or more aberrated optical elements comprises a normal field-corrected scan lens and a corrective window configured to produce an aberrated laser beam.

4. The method according to claim 3 wherein said corrective window is an aspheric plate or diffractive optical element.

5. The method according to claim 2 wherein said one or more aberrated optical elements are configured to exhibit a spherical aberration.

6. The method according to claim 2 wherein said one or more aberrated optical elements comprise a scan lens having an aberrated profile.

7. The method according to claim 1, further comprising the steps of:
   said laser beam has an incident spot diameter on said transparent material and a continuous laser filament diameter within said transparent material;
   a critical ratio defined as the ratio of said incident spot diameter of said laser beam on said transparent material to said continuous laser filament diameter within said transparent material;
   said laser being focused such that said critical ratio is between approximately 1 and 1000.

8. The method according to claim 1, further comprising the steps of:
   said laser beam is focused such that a zone of compression is formed within said transparent material, thereby producing a phase change in a narrow curtain of material extending uniformly and radially from said center of the propagation axis of said laser beam within said transparent material.

9. The method according to claim 1, further comprising the step of:
   said laser beam is focused forming said continuous laser filament greater than 1 mm in length.

10. The method according to claim 1, further comprising the step of:
    said laser beam is focused forming said continuous laser filament greater than 10 mm in length.

11. The method according to claim 1, further comprising the step of:
    said laser beam is focused such that a portion of the incident power of said laser beam is focused in a distributed manner over a longitudinal volume within said transparent material, without producing a focus within said transparent material.

12. The method according to claim 1, further comprising the step of:
    said beam waist is located at an offset of at least approximately 10 µm from an external surface of said transparent material to avoid any possible debris on the surface.

13. The method according to claim 1, further comprising the step of:
    forming said continuous laser filament having a substantially homogenous cross section over a substantial portion of said length of said continuous laser filament.

14. The method according to claim 1, further comprising the step of:
    said transparent material includes a top surface and, forming said beam waist on said top surface of said transparent material.

15. The method according to claim 1, wherein said burst of laser pulses has energy in the range of 10 µJ and 2 mJ.

16. The method according to claim 1, further comprising:
    controlling the properties of said continuous laser filament by varying one or more of the positioning of one or more focusing elements, the numerical aperture of one or more said focusing elements, the laser pulse energy, wavelength, pulse duration, repetition rate, burst repetition rate, the number of laser pulses in said burst, the shape of said bursts, said shape of said bursts defines the energy distribution within said bursts, to form each continuous laser filament.

17. The method according to claim 1, further comprising:
    each pulse within said burst of laser pulses is less than 100 ps.

18. The method according to claim 1, further comprising:
    each pulse within said burst of laser pulses has a wavelength of NIR, about 1 µm, or second harmonic generated pulse at green wavelength.

19. The method according to claim 1, further comprising:
    focussing said laser beam at an oblique angle of incidence such that said continuous laser filament is formed at an angle relative to an external surface of said transparent material.

20. The method according to claim 1, further comprising:
    controlling the properties of said continuous laser filament according to one or more of the envelope profiles of said burst of laser pulses, the number of pulses in said burst of laser pulses, and the net energy of said burst of laser pulses.

21. The method according to claim 1, further comprising:
    said laser beam comprises a plurality of bursts of laser pulses at a pre-selected repetition rate; and,
    varying the relative position between said laser beam and said transparent material to form an array of continuous laser filaments.

22. The method according to claim 21 further comprising the steps of:
    said transparent material has a surface with a complex spline profile, said spline profile having two dimensions, two and a half dimensions or three dimensions;
    controlling said relative position between said laser beam and said transparent material and controlling the orientation of said laser beam such that said array of continuous laser filaments is formed within said transparent material.

23. The method according to claim 21, further comprising the step of:
    singulating or cleaving of the transparent material along said array of continuous laser filaments, a break strength of said transparent material is in the range of more than 100 MPa.

24. The method according to claim 23 further comprising the step of:
controlling the surface roughness, Ra, of the cleaved surface of said transparent material according to the degree of overlap of said continuous laser filaments or a discrete spacing of said continuous laser filaments.

25. The method according to claim 24 wherein said surface roughness, Ra, of said cleaved surface is less than approximately 3 μm.

26. The method according to claim 21, further comprising the steps of:
optically monitoring said array of continuous laser filaments to determine one or more parameters associated with said formation of said array of continuous laser filaments;
selecting one or more of said parameters as one or more process feedback measures; and
actively controlling the formation of subsequent continuous laser filaments according to said one or more process feedback measures.

27. The method according to claim 26, wherein:
said step of monitoring said array of continuous laser filaments includes: obtaining an image of at least a portion of said array of continuous laser filaments while forming said array of continuous laser filaments; and processing said image to determine one or more parameters associated with said array of continuous laser filaments.

28. The method according to claim 27 wherein said image is obtained by an imaging device located above, below or adjacent said transparent material.

29. The method according to claim 26 wherein said one or more of said process parameters are selected from the group consisting of filament depth, filament size, filament position, and pattern fidelity.

30. The method according to claim 27 wherein optically monitoring said array of continuous laser filaments includes:
detecting optical radiation emitted during said filament formation process; and,
processing signals associated with said detected optical radiation to determine one or more parameters associated with said array of continuous laser filaments.

31. The method according to claim 21 wherein said array of continuous laser filaments is a first array of continuous laser filaments, the method further comprising the steps of:
repeating said step of varying said relative position between said laser beam and said transparent material to form a second array of continuous laser filaments, wherein said second array of continuous laser filaments is formed at an angle relative to said first array of continuous laser filaments; and
singulating or cleaving said transparent material such that an edge is formed with a chamfered edge.

32. The method according to claim 21 wherein said array of continuous laser filaments is a first array of continuous laser filaments, the method further comprising the steps of:
repeating said step of varying said relative position between said laser beam and said transparent material to form multiple arrays of continuous laser filaments, wherein said additional arrays of continuous laser filaments are formed above said first array of continuous laser filaments; and
singulating or cleaving said transparent material such that a thicker substrate can be processed.

33. The method according to claim 21 wherein said relative position between said laser beam and said transparent material is varied such that said array of continuous laser filaments includes constant filament spacing.

34. The method according to claim 1, to form continuous filaments and to sustain self-focusing, the pulse energy of each pulse of each of said bursts is selected to lie within the nonlinear regime to generate said continuous filaments in said transparent material.

35. The method according to claim 1, wherein said transparent material is selected from the group consisting of glasses, semiconductors, transparent ceramics, said transparent ceramics include SiC, LiTaO3. LiNbO3, polymers, transparent conductors, wide bandgap glasses, crystals, crystalline quartz, diamond, glass-ceramics, said glass ceramics include Ceran, sapphire, rare earth formulations, metal oxides, and amorphous oxides.

36. The method according to claim 1, wherein said transparent material is a layer of a structure selected from the group consisting of a liquid crystal display (LCD), flat panel display (FPD), organic display (OLED), multilayer thin glass plate, liquid-encapsulated device, multi-layer substrate, and assembly of composite materials.

37. The method according to claim 1, wherein said transparent material is selected from the group consisting of autoglass, tubes, display cover glasses, protective windows, safety glass, laminated structures, architectural glass, electro chromic and otherwise, biochips, optical sensors, planar lightwave circuits, optical fibers, laboratory, industrial and household glassware, diffractive optical elements, said diffractive optical elements include micro lens arrays, watches window, and art work.

38. The method according to claim 1, wherein said transparent material is a semiconductor material selected from the group consisting of microelectronic chips, memory chips, sensor chips, light emitting diodes (LED), laser diodes (LD), and vertical cavity surface emitting lasers (VCSEL).

39. The method according to claim 1, wherein said transparent material has a strongly absorbing or reflecting layer such as a metal or DBR layer on LED formed on a surface thereof, and wherein said laser beam is a filament-forming laser beam, further comprising the steps of:
prior to forming the continuous laser filament within said transparent material: providing a laser beam comprising a burst of laser pulses irradiating said absorbing or reflecting layer with the first few pulses in the burst such that said layer is locally ablated by said laser beam thereby producing ablative markings on the transparent material, said subsequent pulses of the said burst are then forming filament below the ablated area.

40. The method according to claim 1, wherein if said transparent material is attached on an adhesive tape, wafers on said tape or glass on said tape, wherein said filaments formed inside the substrate adjusted as such not to damage or ablate the plastic tape.

41. A transparent material having a continuous laser filament made by the method of claim 1.

42. A method of processing a transparent sandwich material, said transparent material has an absorbing or reflecting layer formed within the sandwich of substrates thereof, comprising the steps of:
burst of laser pulses irradiating said sandwich material forming a filament only in the top substrate of the sandwich material providing a low power or well focussed adjusted filament forming to avoid any ablation or damage on the absorbing or reflecting layer.

43. A method of processing a transparent sandwich material, said transparent material has an absorbing or reflecting layer formed within the sandwich of substrates thereof, comprising the steps of:
burst of laser pulses irradiating said sandwich material forming a filament in both the top and bottom substrate of the sandwich material providing sufficient power with well focussed adjusted filament forming to avoid any ablation or damage on the absorbing or reflecting layer to completely scribe both substrates of said sandwich in a single scan.

* * * * *

UNITED STATES PATENT AND TRADEMARK OFFICE
CERTIFICATE OF CORRECTION

| | | |
|---|---|---|
| PATENT NO. | : 9,102,007 B2 | Page 1 of 1 |
| APPLICATION NO. | : 14/336819 | |
| DATED | : August 11, 2015 | |
| INVENTOR(S) | : Hosseini | |

It is certified that error appears in the above-identified patent and that said Letters Patent is hereby corrected as shown below:

In the specification

Col. 18, line 57, after "stable" delete "filament" and insert --filament.-- therefor.

Col. 38, line 52, after "-20 and +20" delete "(L1f1 / L2f1 =W)," and insert --(L1$_{f1}$ / L2$_{f1}$ =W),-- therefor.

Signed and Sealed this
Twenty-second Day of March, 2016

Michelle K. Lee
*Director of the United States Patent and Trademark Office*